United States Patent
Lee et al.

(10) Patent No.: US 12,009,815 B2
(45) Date of Patent: Jun. 11, 2024

(54) ELECTRONIC DEVICE

(71) Applicant: SK hynix Inc., Icheon (KR)

(72) Inventors: Seung Ho Lee, Icheon (KR); Gyu Nam Kim, Icheon (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 17/732,337

(22) Filed: Apr. 28, 2022

(65) Prior Publication Data

US 2022/0352712 A1 Nov. 3, 2022

Related U.S. Application Data

(60) Provisional application No. 63/181,013, filed on Apr. 28, 2021.

(51) Int. Cl.
*H03K 19/0185* (2006.01)
*H02H 9/04* (2006.01)

(52) U.S. Cl.
CPC ..... *H03K 19/018521* (2013.01); *H02H 9/046* (2013.01)

(58) Field of Classification Search
CPC .......... H03K 19/018521; H02H 9/046
USPC ............................................. 361/56
See application file for complete search history.

(56) References Cited

U.S. PATENT DOCUMENTS

| | | | |
|---|---|---|---|
| 5,729,155 A | 3/1998 | Kobatake | |
| 5,736,869 A | 4/1998 | Wei | |
| 5,818,257 A | 10/1998 | Nuccio | |
| 5,821,800 A | 10/1998 | Le et al. | |
| 5,995,010 A | 11/1999 | Blake et al. | |
| 6,054,875 A | 4/2000 | Wayner | |
| 6,157,223 A | 12/2000 | Blake | |
| 6,208,167 B1 | 3/2001 | Ranjan et al. | |
| 6,373,282 B1 | 4/2002 | Drapkin et al. | |
| 6,424,510 B1 | 7/2002 | Ajit et al. | |
| 6,690,555 B1 | 2/2004 | Pasqualini | |
| 6,731,151 B1 | 5/2004 | Doutreloigne | |

(Continued)

FOREIGN PATENT DOCUMENTS

| | | |
|---|---|---|
| JP | 2009-152944 A | 7/2009 |
| JP | 2010-004424 A | 1/2010 |
| KR | 1020180128600 A | 12/2018 |

OTHER PUBLICATIONS

Office Action dated Jun. 14, 2021 issued for related U.S. Appl. No. 17/073,964.

(Continued)

*Primary Examiner* — Dharti H Patel

(57) ABSTRACT

An electronic device uses, as power, a first voltage and a second voltage lower than the first voltage. The electronic device includes: an internal circuit configured to be driven by the second voltage, and output an output signal having a level corresponding to the second voltage; and an interface circuit configured to receive the output signal, the first voltage, and the second voltage, shift the output signal to a level corresponding to the first voltage, and provide the shifted output signal to a pad. The interface circuit includes an ESD (electrostatic discharge) block connected to the pad. The interface circuit further includes a plurality of transistors, and all of the transistors of the interface circuit are driven at the second voltage and broken at the first voltage.

11 Claims, 52 Drawing Sheets

(56) References Cited

U.S. PATENT DOCUMENTS

| | | |
|---|---|---|
| 6,801,064 B1 | 10/2004 | Hunt et al. |
| 6,836,148 B2 | 12/2004 | Pullen et al. |
| 6,980,035 B1 | 12/2005 | Zhou et al. |
| 7,005,913 B2 | 2/2006 | Diffenderfer |
| 7,027,332 B2 | 4/2006 | Kuo et al. |
| 7,034,573 B1 | 4/2006 | Chang |
| 7,053,657 B1 | 5/2006 | Peng |
| 7,205,819 B2 | 4/2007 | Davis |
| 7,215,146 B2 | 5/2007 | Khan |
| 7,233,178 B2 | 6/2007 | Yu et al. |
| 7,295,038 B2 | 11/2007 | Seo |
| 7,504,862 B2 | 3/2009 | De Sandre et al. |
| 7,521,966 B2 | 4/2009 | Chong et al. |
| 7,724,045 B2 | 5/2010 | Ueno |
| 7,755,393 B1 | 7/2010 | Song |
| 8,212,590 B2 | 7/2012 | Wang et al. |
| 8,466,722 B2 | 6/2013 | Kossel et al. |
| 8,536,925 B2 | 9/2013 | Bhattacharya et al. |
| 8,994,412 B2 * | 3/2015 | Kim ............... H03K 3/356165 |
| | | 327/109 |
| 9,893,517 B2 | 2/2018 | Dey et al. |
| 10,027,325 B1 | 7/2018 | Graves |
| 10,177,764 B2 | 1/2019 | Chern et al. |
| 10,305,474 B2 | 5/2019 | Lee |
| 10,348,301 B2 | 7/2019 | Lee |
| 10,511,304 B2 | 12/2019 | Pan et al. |
| 10,659,047 B2 | 5/2020 | Lee |
| 10,848,154 B2 * | 11/2020 | Lee ....................... G11C 5/147 |
| 10,892,750 B2 | 1/2021 | Lee |
| 11,101,799 B2 * | 8/2021 | Lee ................ H03K 19/00315 |
| 11,296,694 B2 | 4/2022 | Lee |
| 11,424,615 B2 * | 8/2022 | Meng ..................... H02H 9/046 |
| 11,646,737 B1 | 5/2023 | Chan et al. |
| 11,799,482 B2 | 10/2023 | Lee |
| 2003/0222682 A1 | 12/2003 | Yu et al. |
| 2004/0061525 A1 | 4/2004 | Tamaki |
| 2005/0219778 A1 * | 10/2005 | Shigenari ....... H03K 19/018521 |
| | | 361/56 |
| 2005/0286187 A1 * | 12/2005 | Liu ..................... H01L 27/0251 |
| | | 361/56 |
| 2006/0072267 A1 | 4/2006 | Chatty et al. |
| 2006/0091907 A1 | 5/2006 | Khan |
| 2007/0014061 A1 * | 1/2007 | Chang ..................... H02H 9/046 |
| | | 361/56 |
| 2009/0085639 A1 | 4/2009 | Ueno |
| 2010/0176848 A1 | 7/2010 | Du et al. |
| 2010/0271118 A1 | 10/2010 | Bhattacharya et al. |
| 2011/0025380 A1 | 2/2011 | Kim et al. |
| 2011/0187431 A1 | 8/2011 | Bhattacharya et al. |
| 2011/0298519 A1 | 12/2011 | Liu |
| 2012/0300349 A1 * | 11/2012 | Abou-Khalil ....... H01L 27/0285 |
| | | 716/102 |
| 2013/0135014 A1 | 5/2013 | Lin et al. |
| 2014/0002146 A1 | 1/2014 | Kim |
| 2016/0079844 A1 | 3/2016 | Kinzer et al. |
| 2017/0221879 A1 | 8/2017 | Wang et al. |
| 2018/0109255 A1 | 4/2018 | Lee |
| 2018/0316185 A1 | 11/2018 | Lai et al. |
| 2018/0343008 A1 | 11/2018 | Lee |
| 2021/0281067 A1 * | 9/2021 | Chen ..................... H02H 9/046 |
| 2021/0409019 A1 | 12/2021 | Lee |
| 2022/0231686 A1 | 7/2022 | Lee |
| 2022/0352712 A1 | 11/2022 | Lee et al. |
| 2023/0223394 A1 * | 7/2023 | Stockinger .......... H01L 27/0255 |
| | | 361/56 |

OTHER PUBLICATIONS

Kumar et al., "Power Sequence free 400Mbps 90µW 6000µm2 1.8V-3.3V Stress Tolerant I/O Buffer in 28nm CMOS", 2013, pp. 37-40, IEEE.

Rajagopal et al., "Dynamically Biased Low Power High Performance 3.3V Output Buffer in a Single Well Bulk CMOS 1.8V Oxide 45nm Process", 13th Int'l Symposium on Quality Electronic Design, 2012, 6 pages, IEEE.

Rajagopal et al., "An Enhanced Topology for Reliability of a High Performance 3.3V I/O Buffer in a Single-well Bulk CMOS 1.8v-oxide Low voltage Process", 10th Int'l Symposium on Quality Electronic Design, 2009, 4 pages, IEEE.

Marcs NG, "3.3V Transmitter Using 1.8V Transistors in a Cascode Configuration", Theses and dissertations, Paper 2056, Jan. 1, 2013, pp. 1-41.

Office Action dated Aug. 9, 2021 for U.S. Appl. No. 17/076,474.

The Office Action dated Apr. 18, 2024, for U.S. Appl. No. 18/471,094.

\* cited by examiner

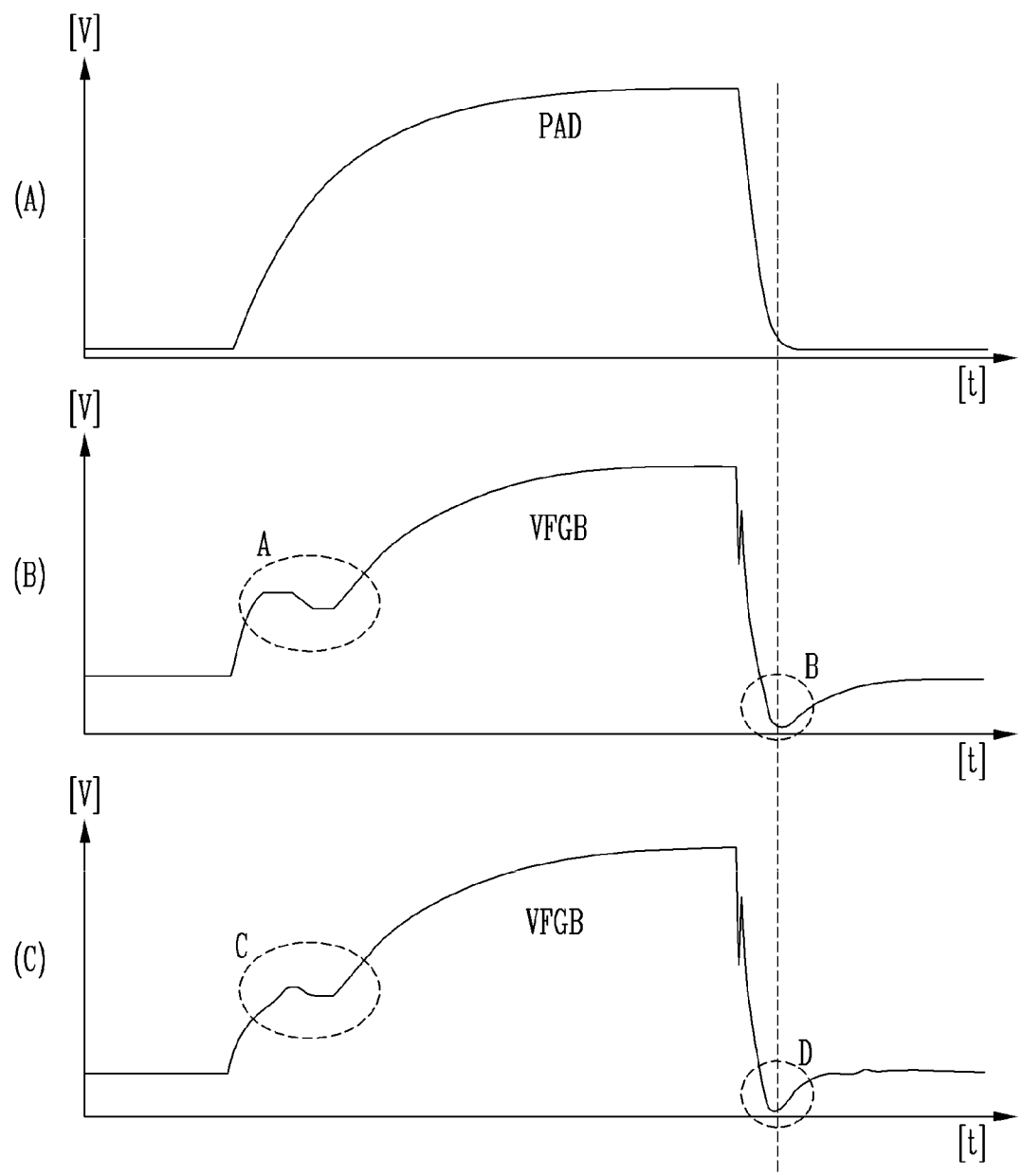

FIG. 17
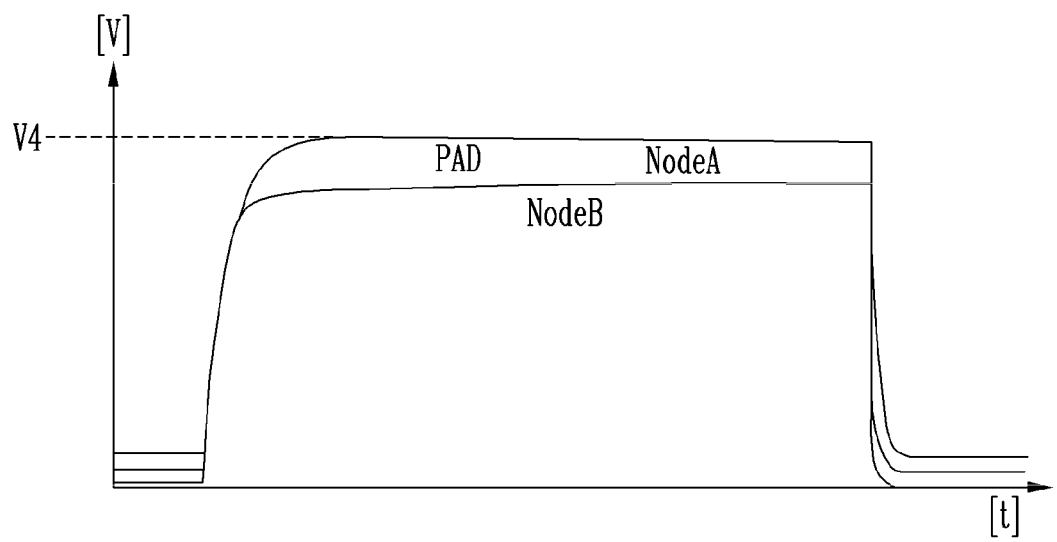
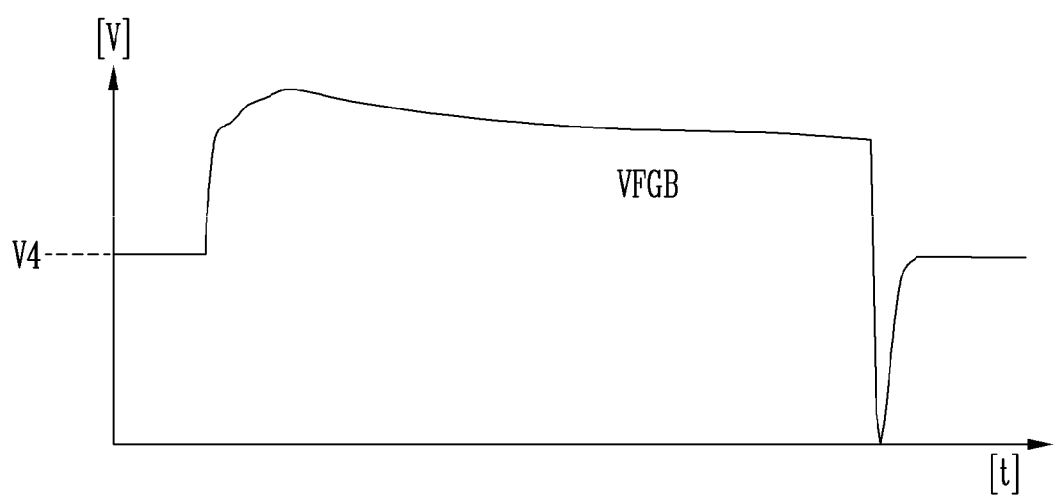

1650a

ELECTRONIC DEVICE

CROSS-REFERENCE TO RELATED APPLICATION

This application is a non-provisional application of U.S. Provisional patent application No. 63/181,013 filed on Apr. 28, 2021.

BACKGROUND

Field of Invention

The present disclosure relates to an electronic device, and more particularly, to the electronic device including an interfacing circuit with an ESD (electrostatic discharge circuit) control system.

Description of Related Art

A high-speed interface, which requires a low power voltage and high speed operation, is commonly used in a recent chip. Accordingly, as an element configuring an operation circuit in a chip, for example, CMOSFETs having a medium gate oxide (e.g., a gate oxide for 1.8V operation) or CMOSFETs having a thin film gate oxide (e.g., a gate oxide for 0.9V operation) is more widely used than CMOS-FETs having a thick gate oxide (e.g., a gate oxide for 3.3V operation).

However, an input/output (IO) circuit still needs to support an application circuit that requires a relatively high interface voltage (e.g., 3.3V interface voltage). Therefore, an input/output circuit manufactured of CMOSFETs having the medium gate oxide for 1.8V operation or the thin film gate oxide for 0.9V operation are difficult to operate due to problems such as device destruction when a voltage of 3.3V is applied.

Recently, with the development of technology, internal circuits mounted on the integrated circuit have been gradually reduced in size and highly integrated. In such a situation, a high voltage of electrostatic electricity included in power accompanies potentially destructive effects on the internal circuits. In particular, the high voltage of electrostatic electricity may destruct a gate dielectric layer of a MOS transistor included in an internal circuit. Therefore, the integrated circuit includes an ESD (Electro-Static Discharge) circuit for protecting the internal circuit from a high voltage of electrostatic electricity.

SUMMARY

An embodiment of the present disclosure provides an electronic device including an output driving circuit having improved reliability.

An embodiment of the present disclosure provides an electronic device including an output driving circuit capable of increasing reliability during a high-speed operation.

An embodiment of the present disclosure provides an electronic device including an ESD control system including an ESD circuit.

The output driving circuit according to embodiments may include a pull-down driver and a voltage stabilizer. The pull-down driver includes first, second, and third transistors connected in series between a pad and a ground node. The voltage stabilizer generates a stabilization voltage based on a voltage of the pad and a power voltage, and outputs the stabilization voltage to a control terminal of the second transistor.

The output driving circuit according to embodiments may include a pull-up-pull-down driver connected to a pad, a level shifter operating based on a first power voltage and a second power voltage that is greater than the first power voltage, level shifting a data signal to generate a first control signal, and applying the first control signal to the pull-up-pull-down driver, and a driver control logic operating based on the first power voltage, generating a second control signal based on the data signal, and applying the second control signal to the pull-up-pull-down driver.

In an embodiment, the voltage stabilizer may include a voltage divider and a stabilization voltage generator. The voltage divider may be connected between the pad and a ground. The voltage divider may be configured to divide the voltage of the pad and to output the divided voltage to a first internal node. The stabilization voltage generator may be connected between the power voltage and the first internal node. The stabilization voltage generator may be configured to output the stabilization voltage based on the power voltage.

In an embodiment, the stabilization voltage generator may include a fourth transistor and a fifth transistor connected in series between the power voltage and the first internal node. The fourth transistor and the fifth transistor may be connected at a second internal node. The stabilization voltage generator may output a voltage of the second internal node as the stabilization voltage.

The electrostatic discharge circuit according to embodiments may include: a control voltage generation circuit configured to generate a first control voltage, a second control voltage and a third control voltage through a division operation on a supply voltage; an electrostatic detection circuit configured to set a first setup voltage based on the first control voltage, and generate an electrostatic detection signal by detecting electrostatic electricity transferred through the first setup voltage; a driving control circuit configured to set a second setup voltage based on the second control voltage, and generate a driving control signal based on the electrostatic detection signal; and a discharge driving circuit configured to set a third setup voltage based on the third control voltage, and perform a discharge operation on electrostatic electricity transferred through the third setup voltage based on the driving control signal.

The electronic device according to embodiments may use, as power, a first voltage and a second voltage lower than the first voltage. The electronic device may include an internal circuit configured to be driven by the second voltage and output an output signal having a level corresponding to the second voltage, and an interface circuit configured to receive the output signal, the first voltage, and the second voltage, to shift the output signal to a level corresponding to the first voltage and to provide the shifted output signal to a pad. The interface circuit includes an ESD (electrostatic discharge) block connected to the pad. The interface circuit includes a plurality of transistors, and all transistors of the interface circuit are driven at the second voltage and broken at the first voltage.

The interface circuit may include a pull-up driver and a pull-down driver. The pull-up driver may include a first PMOS transistor, a second PMOS transistor, and a first impedance controller. The first PMOS transistor is connected between a first connection node and a power terminal to which the first voltage is provided, and controlled by a first control bias. The second PMOS transistor is connected between the first connection node and the pad, and normally turned-on. The first impedance controller is connected to the first connection node to control an impedance of the first connection node based on the first control bias. The pull-down driver may include a first NMOS transistor and a second NMOS transistor. The first NMOS transistor is connected between the pad and a second connection node, and controlled by the second voltage. The second NMOS transistor is connected between the second connection node and a ground voltage terminal. The first PMOS transistor and the second PMOS transistor are driven by the second voltage, and a difference between the first control bias and the first voltage is substantially equal to or less than a maximum operating voltage of the first and second PMOS transistors.

The ESD block includes at least one of a first ESD block and a second ESD block. The first ESD block is electrically coupled between the pad and the second PMOS transistor to protect electrostatic electricity and control an impedance of the pull-up driver, and the second ESD block is electrically coupled between the pad and the first NMOS transistor to protect the electrostatic electricity and control an impedance of the pull-down driver.

At least one of the first ESD block and the second ESD block may include a control voltage generation circuit configured to generate a first control voltage, a second control voltage, and a third control voltage by dividing a supply voltage, an electrostatic detection circuit configured to set a first setup voltage based on the first control voltage, and generate an electrostatic detection signal by detecting electrostatic electricity contained in the first setup voltage, a driving control circuit configured to set a second setup voltage based on the second control voltage, and generate a driving control signal based on the electrostatic detection signal, and a discharge driving circuit configured to set a third setup voltage based on the third control voltage, and perform a discharge operation on electrostatic electricity contained in the third setup voltage based on the driving control signal.

According to embodiments of the present disclosure, an output driving circuit having improved reliability may be provided.

BRIEF DESCRIPTION OF THE DRAWINGS

FIG. 13 is a waveform diagram for describing an effect of adding a fourth PMOS transistor of FIG. 11.

FIG. 17 is a waveform diagram illustrating an operation of the output driving circuit of FIG. 14 when an external high voltage VDDH is 1.8V.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Figure 1:
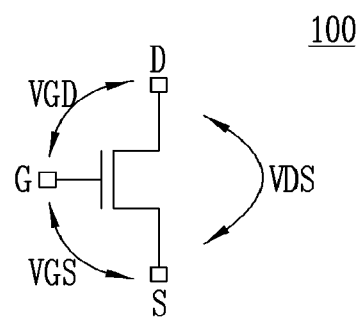
FIG. 1 is a diagram for describing an operating condition of a medium gate oxide device according to an embodiment.

FIG. 1 is a diagram for describing an operating condition of a switching device (e.g., a medium gate oxide device) 100 according to an embodiment.

For a stable operation of the medium gate oxide device 100, a gate-source voltage $V_{GS}$, a gate-drain voltage $V_{GD}$, and a drain-source voltage $V_{DS}$ of the medium gate oxide device 100 are required to satisfy a reliability condition. For example, when the medium gate oxide device 100 is a device for 1.8V operation, reliability of a device is secured when the gate-source voltage $V_{GS}$, the gate-drain voltage $V_{GD}$, and the drain-source voltage $V_{DS}$ is equal to or less than 110% of 1.8V. Accordingly, the reliability condition as shown in [Table 1] may be derived.

TABLE 1

| Voltage Difference | Reliability condition |
| --- | --- |
| VGD | VGD ≤ 1.98 V |
| VGS | VGS ≤ 1.98 V |
| VDS | VDS ≤ 1.98 V |

In other embodiments, as an operation speed of a semiconductor device increases, a driving voltage of the semiconductor device also decreases. For example, an interface voltage used as input/output power of the semiconductor device is changing from 1.8V to 1.2V. When the interface voltage is decreased, power consumption, noise, and a pad capacitance of the semiconductor memory device may be reduced.

For example, between the semiconductor memory device and a memory controller controlling the semiconductor memory device, when 1.2V is used as the interface voltage, a difference between the interface voltage and an interval voltage is decreased compared to a case where 1.8V is used as the interface voltage. When a 0.8V device (e.g., a thin gate oxide device) is used instead of a 1.8V device (e.g., a medium gate oxide device), significant benefits may be obtained in terms of power consumption, the area, and a pad capacitance.

In order to configure an input/output interface of the semiconductor memory device with the thin gate oxide device operating at 0.8V, reliability of the 0.8V device needs to be secured even while operating at a voltage of 1.2V. Accordingly, a structure of an input/output driving circuit capable of a high-speed operation and securing reliability of a thin gate oxide film device is desirable.

In order for the thin gate oxide device 100 to stably operate, a gate-source voltage VGS, a gate-drain voltage VGD, and a drain-source voltage VDS of the thin gate oxide device are required to satisfy reliability condition. For example, when the thin gate oxide device 100 is a device for 0.8V operation, reliability of an element is secured the gate-source voltage VGS, the gate-drain voltage VGD, and the drain-source voltage VDS operate at 1.06V or less. Accordingly, the reliability condition as shown in [Table 2] may be derived.

TABLE 2

| Voltage Difference | Reliability condition |
| --- | --- |
| $V_{GD}$ | $V_{GD}$ ≤ 1.06 V |
| $V_{GS}$ | $V_{GS}$ ≤ 1.06 V |
| $V_{DS}$ | $V_{DS}$ ≤ 1.06 V |

In order to satisfy such a condition, a conventional output driving circuit is configured of a circuit shown in FIG. 2 or 3, which will be described later.

Figure 2:
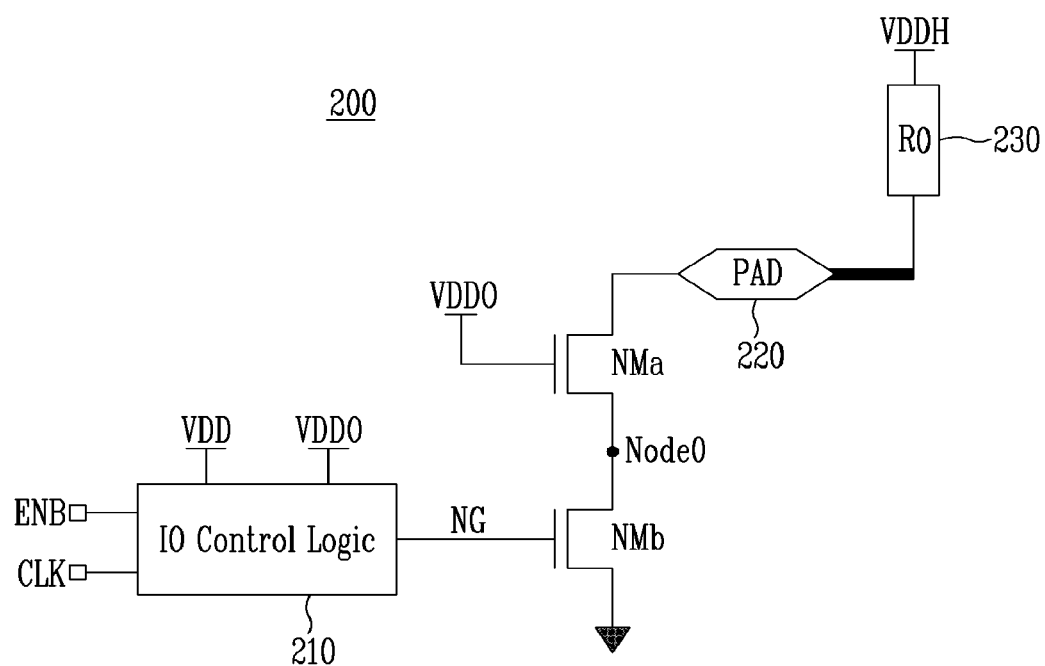
FIG. 2 is a circuit diagram illustrating an example of a conventional output driving circuit.

FIG. 2 is a circuit diagram illustrating an example of the conventional output driving circuit 200.

Referring to FIG. 2, the output driving circuit 200 is configured of an input/output control logic (IO Control Logic) 210, and a first transistor NMa and a second transistor NMb connected in series. The first transistor NMa is connected between a pad 220 and a node Node 0, and the second transistor NMb is connected between the node Node 0 and ground. A first power voltage VDDO is applied to a gate terminal of the first transistor NMa, and a gate control signal NG output from the input/output control logic 210 is applied to a gate terminal of the second transistor NMb. Meanwhile, the input/output control logic 210 operates based on the first power voltage VDDO and a second power voltage VDD, receives an enable signal ENB and a clock signal CLK, and outputs the gate control signal NG. Meanwhile, the pad 220 is connected to an external high voltage VDDH through an external resistor $R_0$ 230.

Figure 4A:
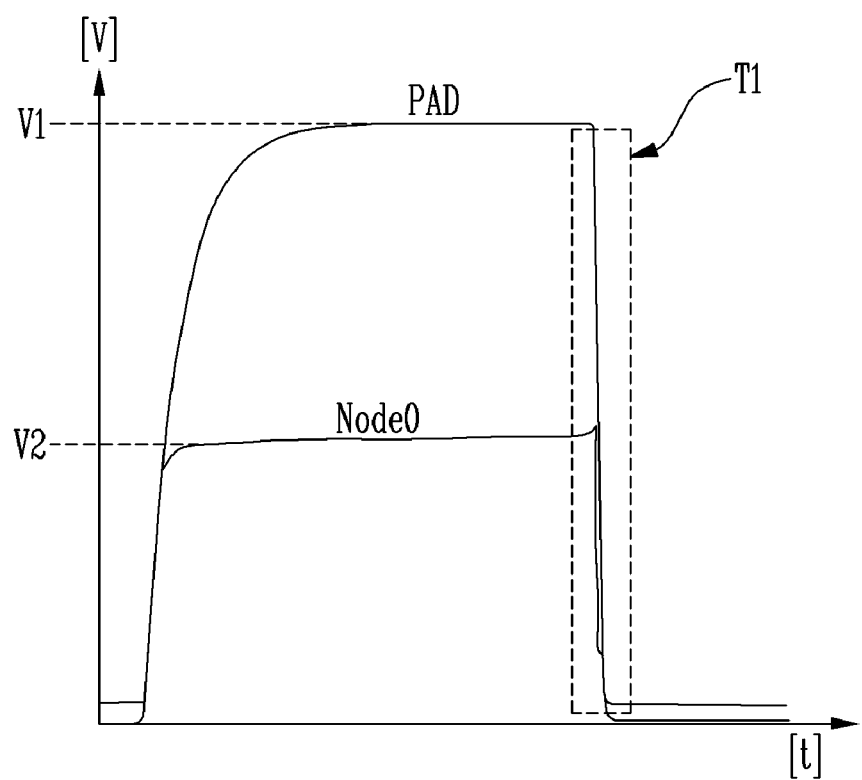
FIG. 4A is an operational waveform diagram of the output driving circuit of FIG. 2.
Figure 4B:
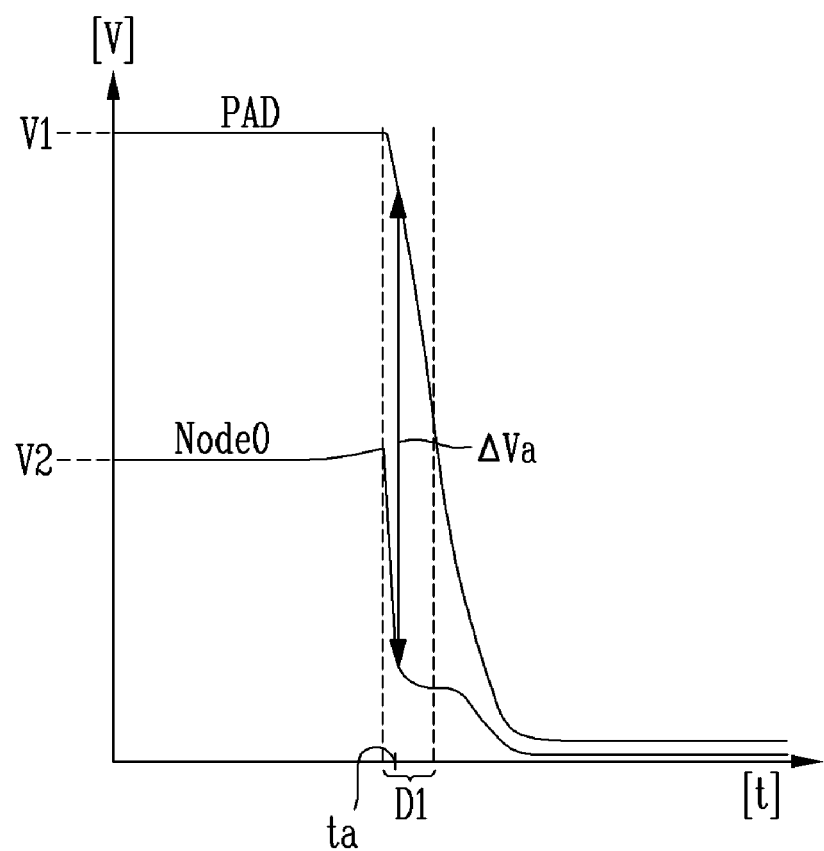
FIG. 4B is a waveform diagram showing an enlarged T1 period of FIG. 4A.

An operation waveform diagram of the output driving circuit 200 of FIG. 2 is shown in FIGS. 4A and 4B. An operation of the output driving circuit 200 shown in FIG. 2 will be described later with reference to FIGS. 4A and 4B.

Figure 3:
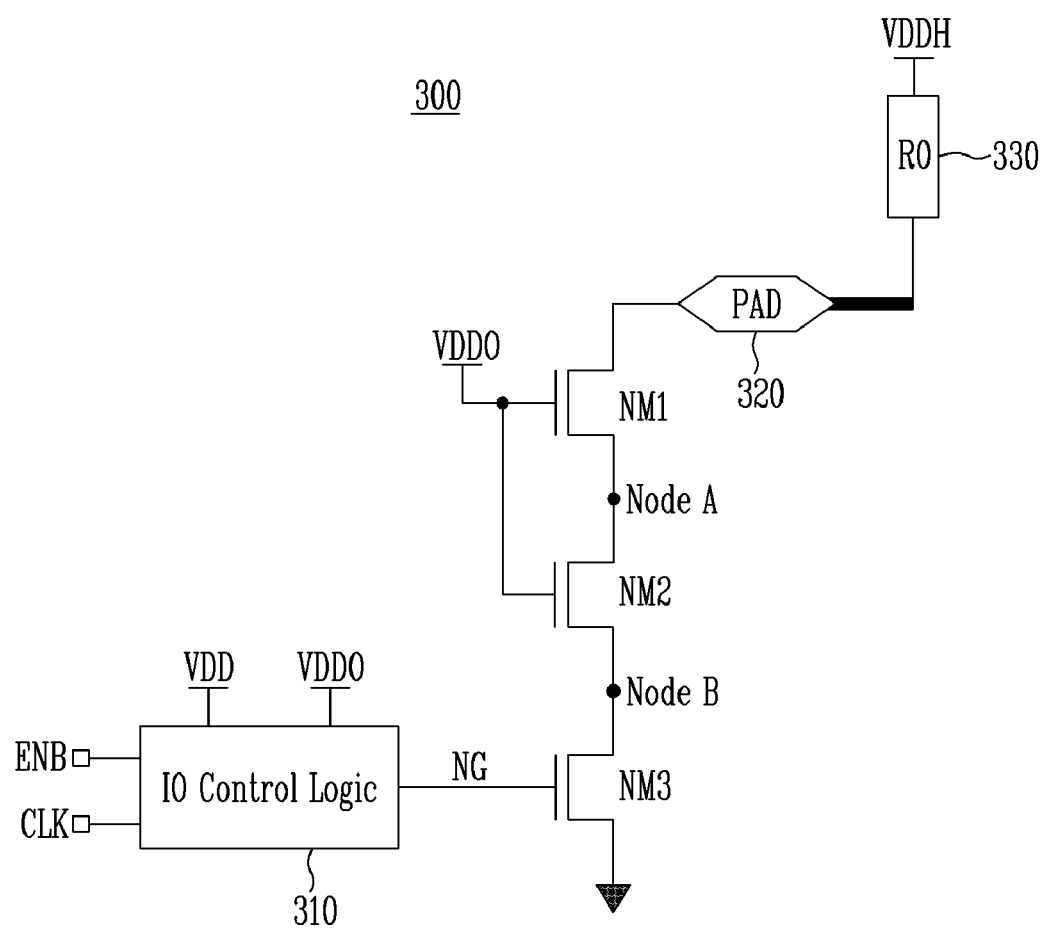
FIG. 3 is a circuit diagram illustrating another example of the conventional output driving circuit.

FIG. 3 is a circuit diagram illustrating another example of the conventional output driving circuit 300.

Referring to FIG. 3, the output driving circuit 300 is configured of an input/output control logic 310, and a first transistor NM1, a second transistor NM2, and a third transistor NM3 connected in series. The first transistor NM1 is connected between a pad 320 and a node A Node A, the second transistor NM2 is connected between the node A Node A and a node B Node B, and the third transistor NM3 is connected between the node B Node B and the ground. The first power voltage VDDO is applied to gate terminals of the first transistor NM1 and the second transistor NM2, and a gate control signal NG output from the input/output control logic 310 is applied to a gate terminal of the third transistor NM3. Meanwhile, the input/output control logic 310 operates based on a first power voltage VDDO and a second power voltage VDD, receives an enable signal ENB and a clock signal CLK, and outputs the gate control signal NG. Meanwhile, the pad 320 is connected to an external high voltage VDDH through an external resistor $R_0$.

Figure 5A:
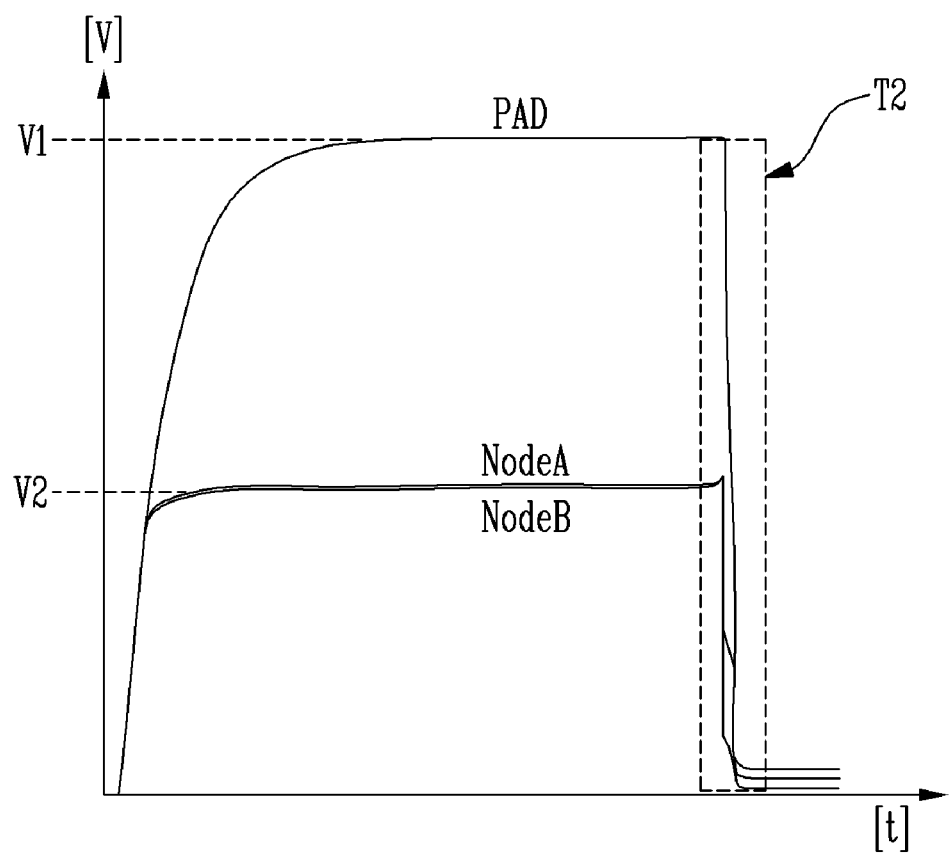
FIG. 5A is an operation waveform diagram of the output driving circuit of FIG. 3.
Figure 5B:
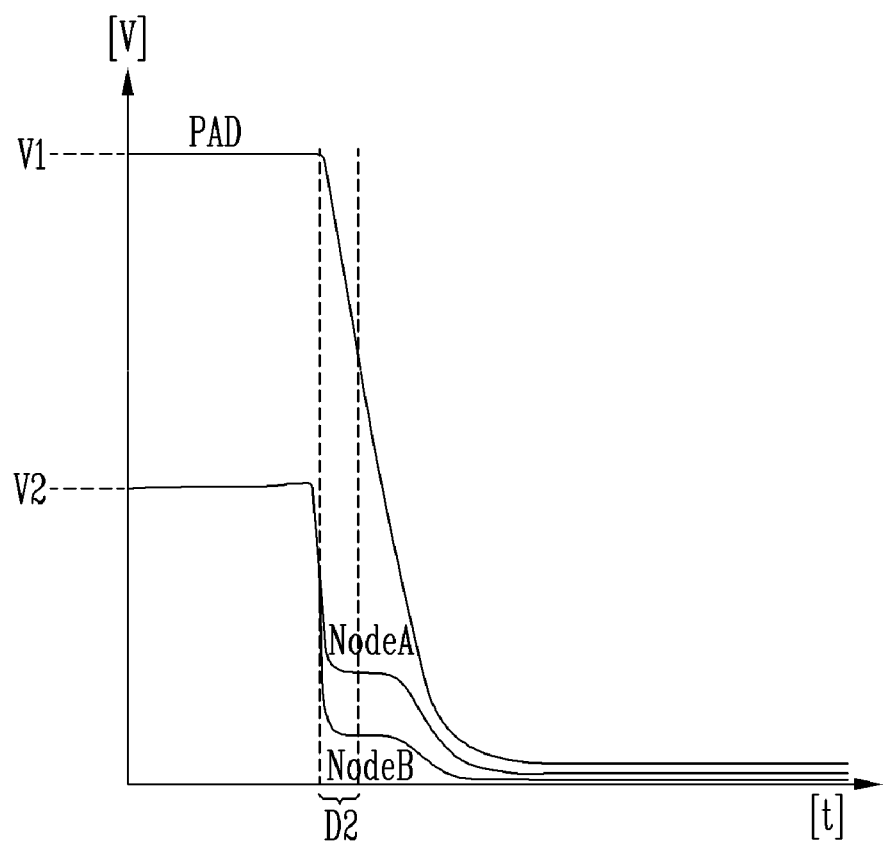
FIG. 5B is a waveform diagram showing an enlarged T2 period of FIG. 5A.

An operation waveform diagram of the output driving circuit 300 of FIG. 3 is shown in FIGS. 5A and 5B. An operation of the output driving circuit 300 shown in FIG. 3 will be described later with reference to FIGS. 5A and 5B.

The conventional output driving circuits 200 and 300 shown in FIGS. 2 and 3 use a thick gate oxide element (2.5V or 3.3V element). Therefore, in interfacing a 3.3V or 5V signal, an oxide thickness is thick. Thus, reliability of an element is secured even though the gate-drain voltage $V_{GD}$ and the drain-source voltage $V_{DS}$ are in a section that is somewhat out of reliability. However, when driving the interfacing of 3.3V using a medium gate oxide element (1.8V element) in a current process of 32 nanometers or less, the oxide thickness of the element becomes thinner, meeting the reliability condition becomes difficult.

FIG. 4A is the operational waveform diagram of the output driving circuit 200 of FIG. 2. In addition, FIG. 4B is a waveform diagram showing an enlarged T1 period of FIG. 4A.

Referring to FIG. 4A, a voltage of the pad 220 and a voltage of the node Node 0 are shown. The voltage of the pad 220 may increase to a first level V1, and the voltage of the node Node 0 may increase to a second level V2. The first level V1 may be about 3.5V, and the second level V2 may be about 1.6V. Accordingly, a difference between the voltage of the pad 220 and the voltage of the node Node 0 is maintained as about 2V or less. Therefore, a condition of the drain-source voltage $V_{DS}$ of the first transistor NMa is satisfied. However, as the voltage of the pad 220 rapidly decreases, the voltage of the node Node 0 also decreases (T1 period of FIG. 4A). In this case, a situation in which the reliability condition of the drain-source voltage $V_{DS}$ is not satisfied occurs as will be described below with reference to FIG. 4B.

Referring to FIG. 4B, the waveform diagram of the T1 period shown by a dotted line in FIG. 4A is enlarged. As shown in FIG. 4B, in a D1 period in which the voltage of the pad 210 and the voltage of the node Node 0 decreases during the T1 period, the difference between the voltage of the pad 210 and the voltage of the node Node 0 may be temporarily a value ΔVa greater than a difference (for example, about 2V) between the first level V1 and the second level V2. For example, the value ΔVa at a time to may be 2.9V. In this case, the difference between the voltage of the pad 210 and the voltage of the node Node 0 is temporarily 2.9V, which is a situation in which the reliability condition of the drain-source voltage $V_{DS}$ of the 1.8V element is not satisfied.

FIG. 5A is the operation waveform diagram of the output driving circuit 300 of FIG. 3. Meanwhile, FIG. 5B is a waveform diagram showing an enlarged T2 period of FIG. 5A.

Referring to FIG. 5A, a voltage of the pad 320, a voltage of the node A Node A, and a voltage of the node B Node B are shown. The voltage of the pad 320 may increase to a first level V1, and the voltage of the node A Node A and the voltage of the node B Node B may increase to a second level V2. The first level V1 may be about 3.5V, and the second level V2 may be about 1.6V. Accordingly, on the whole, a difference between the voltage of the pad 320 and the voltage of the node A Node A or a difference between the voltage of the pad 320 and the voltage of the node B Node B is maintained as about 2V or less. Therefore, a condition of the drain-source voltage $V_{DS}$ of the second transistor NM2 is satisfied. However, as the voltage of the pad 320 rapidly decreases (T2 period of FIG. 5A), a situation in which a reliability condition of the drain-source voltage $V_{DS}$ of the first transistor NM1 and the second transistor NM2 is not satisfied occurs as will be described below with reference to FIG. 5B.

Referring to FIG. 5B, the waveform diagram of the T2 period shown by a dotted line in FIG. 5A is enlarged. As shown in FIG. 5B, in a D2 period in which the voltage of the pad 320 and the voltage of the node A Node A decreases during the T2 period, the difference between the voltage of the pad 320 and the voltage of the node A Node A may be temporarily a value greater than a difference (for example, about 2V) between the first level V1 and the second level V2. For example, the difference between the voltage of the pad 320 and the voltage of the node A Node A is temporarily 2.8V, which is a situation in which the reliability condition of the drain-source voltage $V_{DS}$ of the 1.8V element is not satisfied.

Therefore, a structure of a new output driving circuit having improved reliability may be desirable.

Figure 6:
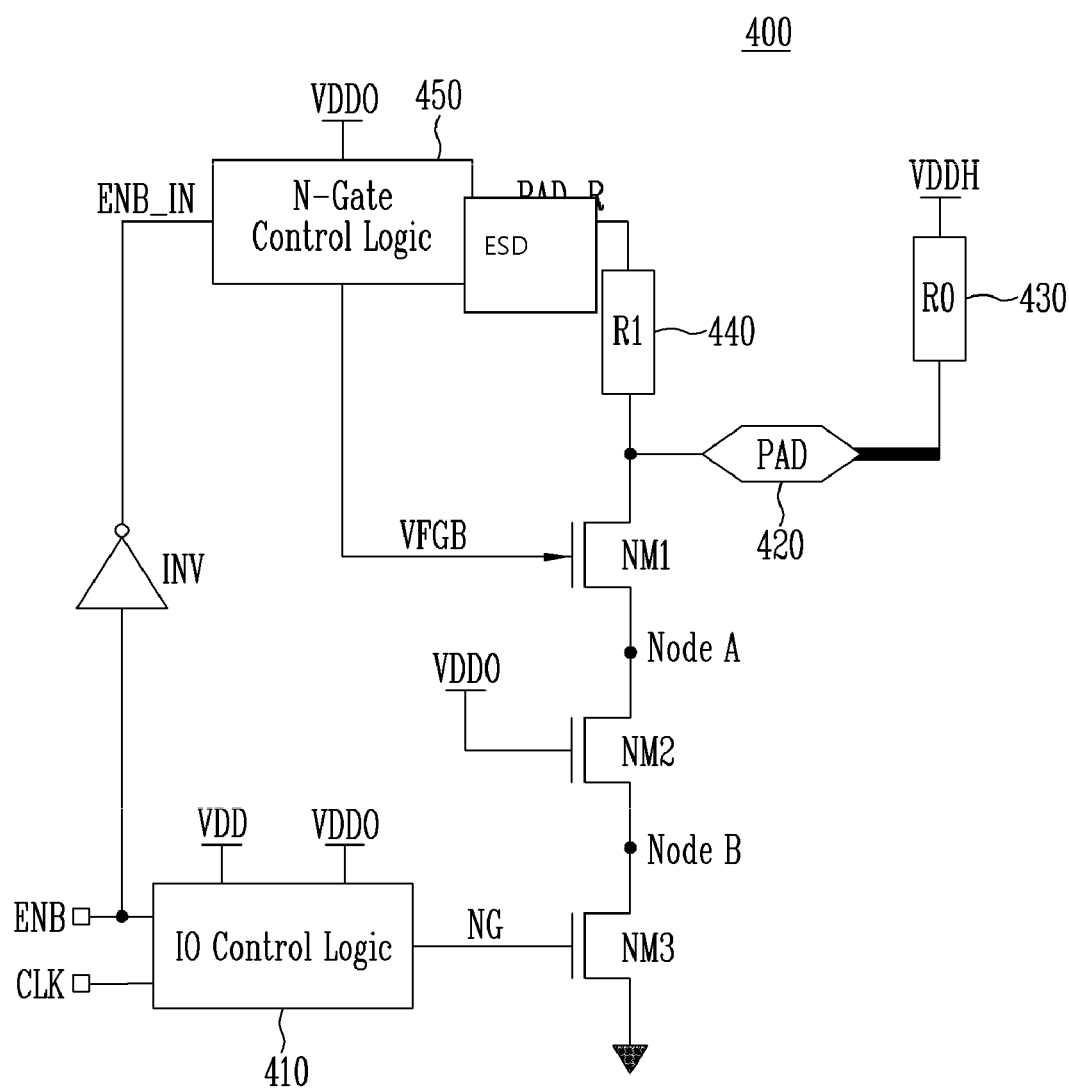
FIG. 6 is a circuit diagram illustrating an output driving circuit according to an embodiment of the present disclosure.

FIG. 6 is a circuit diagram illustrating an output driving circuit 400 according to an embodiment of the present disclosure.

Referring to FIG. 6, the output driving circuit 400 according to an embodiment of the present disclosure includes first, second, and third transistors NM1, NM2, and NM3 which are sequentially connected in series between a pad 420 and a ground node, an input/output control logic 410, a gate control logic 450, and an inverter INV. The input/output control logic 410 receives a clock signal CLK and an enable signal ENB, and transfers a first control signal NG to the third transistor NM3. The gate control logic 450 receives a voltage PAD_R (hereinafter, pad voltage) of the pad 420. In addition, the gate control logic 450 outputs a feedback voltage VFGB to a gate terminal of the first transistor NM1. The inverter INV inverts the enable signal ENB and outputs an inverted enable signal ENB_IN to the gate control logic

450. Meanwhile, the pad 420 is connected to an external high voltage VDDH through an external resistor $R_0$. In addition, the output driving circuit 400 may further include an ESD block 440 connected between the pad 420 and the gate control logic 450. In an embodiment, the ESD block 440 may include an ESD circuit with an internal resistor for discharging electrostatic electricity applied from the pad or an ESD control system including the ESD circuit. Configurations and operating methods of the ESD circuit and the ESD control system including the same will be described later with reference to FIG. 36 to FIG. 44.

The first, second, and third transistors NM1, NM2, and NM3 of the output driving circuit 400 may be a medium gate oxide element of a 1.8V operation element. For reliability improvement, a three-stage series connection structure is configured as shown in the drawing. Meanwhile, the first, second, and third transistors NM1, NM2, and NM3 of the output driving circuit 400 have open-drain output structures. The gate terminal of the first transistor NM1 receives a feedback voltage VFGB, and a voltage level of the feedback voltage VFGB is changed according to a level of the open-drain output. Meanwhile, the first power voltage VDDO may be 1.8V, and the external high voltage VDDH may be 3.3V. When the output is activated, the enable signal ENB becomes a high state, and when the clock signal CLK is a high state, the pad 420 becomes a high state by the external high voltage VDDH connected by the external resistor $R_0$ 430. When the clock signal CLK is a low state, an NMOS driver of the open-drain output structure is turned on, and thus the pad 420 operates to be a low state. Here, a detailed configuration of the gate control logic 450 will be described later with reference to FIGS. 7 and 8.

Figure 7:
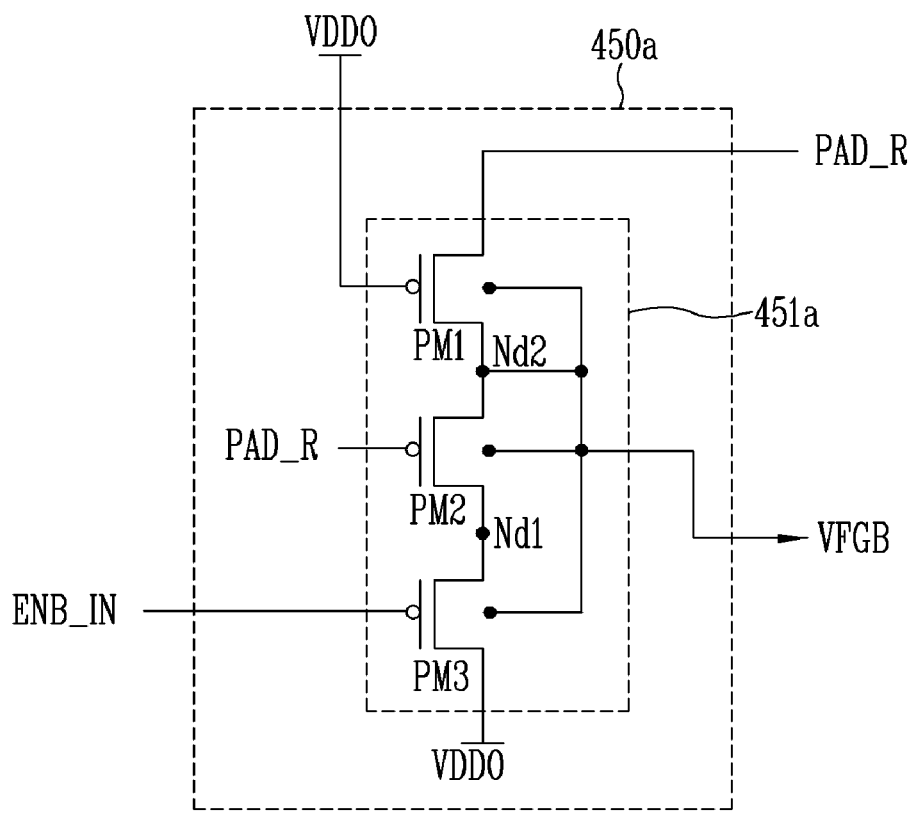
FIG. 7 is a circuit diagram illustrating a gate control logic suitable for use as a gate control logic of FIG. 6 according to an embodiment.

FIG. 7 is a circuit diagram illustrating a gate control logic 450a suitable for use as the gate control logic 450 of FIG. 6, according to an embodiment.

Referring to FIG. 7, the gate control logic 450a includes first, second, and third PMOS transistors PM1, PM2, and PM3 sequentially connected in series between the pad voltage PAD_R and the first power voltage VDDO. A series connection structure of the first, second, and third PMOS transistors PM1, PM2, and PM3 may configure a feedback transistor component 451a. A drain electrode of the first PMOS transistor PM1 and a source electrode of the second PMOS transistor PM2 are connected to a node Nd2. In addition, a drain electrode of the second PMOS transistor PM2 and a source electrode of the third PMOS transistor PM3 are connected to a node Nd1. Meanwhile, the first power voltage VDDO is applied to a gate terminal of the first PMOS transistor PM1, a pad voltage PAD_R is applied to a gate terminal of the second PMOS transistor PM2, and the inverted enable signal ENB_IN is applied to a gate terminal of the third PMOS transistor PM3. In addition, bulk regions of the first, second, and third PMOS transistors PM1, PM2, and PM3 are connected to the feedback voltage VFGB.

When the clock signal CLK is a low state, the pad voltage PAD_R becomes a low state. Accordingly, the second PMOS transistor PM2 is turned on and thus the first power voltage VDDO (that is, 1.8V) is output as a feedback signal VFGB. Accordingly, the first transistor NM1 of FIG. 6 maintains a turn-on state. At this time, a gate voltage of the first PMOS transistor PM1 is the first power voltage VDDO. As the pad 420 is a low state, the first PMOS transistor PM1 is turned off. As a result, a current path from the first power voltage VDDO connected to the third PMOS transistor PM3 to the pad voltage PAD_R is cut off.

Thereafter, when the voltage of the pad 420 is changed from 0V to the external high voltage VDDH (that is, 3.3V) at a time point when the clock signal CLK is changed to a high state, the first PMOS transistor PM1 is turned on at a time point when the pad voltage PAD_R is greater than the sum of the first power voltage VDDO and a threshold voltage Vth_PM1 of the first PMOS transistor, and thus the feedback voltage VFGB follows a voltage level of the pad 420. At this time, the feedback voltage VFGB is in a state in which the feedback voltage VFGB increases from the first power voltage VDDO to the external high voltage VDDH. In addition, the second PMOS transistor PM2 is turned off as the pad voltage PAD_R, which is a gate voltage of the second PMOS transistor PM2, becomes equal to the feedback voltage VFGB. Therefore, a current path from an output terminal of the feedback voltage VFGB to the first power voltage VDDO connected to the third PMOS transistor PM3 is cut off. Thus, power consumption is reduced and a decrease of the feedback voltage VFGB is substantially prevented. In addition, in a case of the second PMOS transistor PM2, even though the feedback voltage VFGB increases to 3.3V as a voltage of a node C Node C is 1.8 V, a voltage difference between a gate-source voltage VGS, a gate-drain voltage VGD, and a drain-source voltage VDS is maintained within 1.98V, and thus a reliability condition of the second PMOS transistor PM2 is also satisfied.

That is, the output driving circuit 400 according to an embodiment of the present disclosure maintains the voltage difference between the pad 420 and the node A Node A to be 1.98V or less even when the clock signal CLK transitions from a low state to a high state, that is, when the voltage of the pad 420 transitions from the external high voltage VDDH to 0V, among characteristics of the open-drain output structure, and thus reliability of the device is improved. An operation waveform diagram of the output driving circuit 400 according to the embodiment of FIGS. 6 and 7 is shown in FIGS. 9A and 9B, and the operation characteristic will be described later with reference to FIGS. 9A and 9B.

Figure 8:
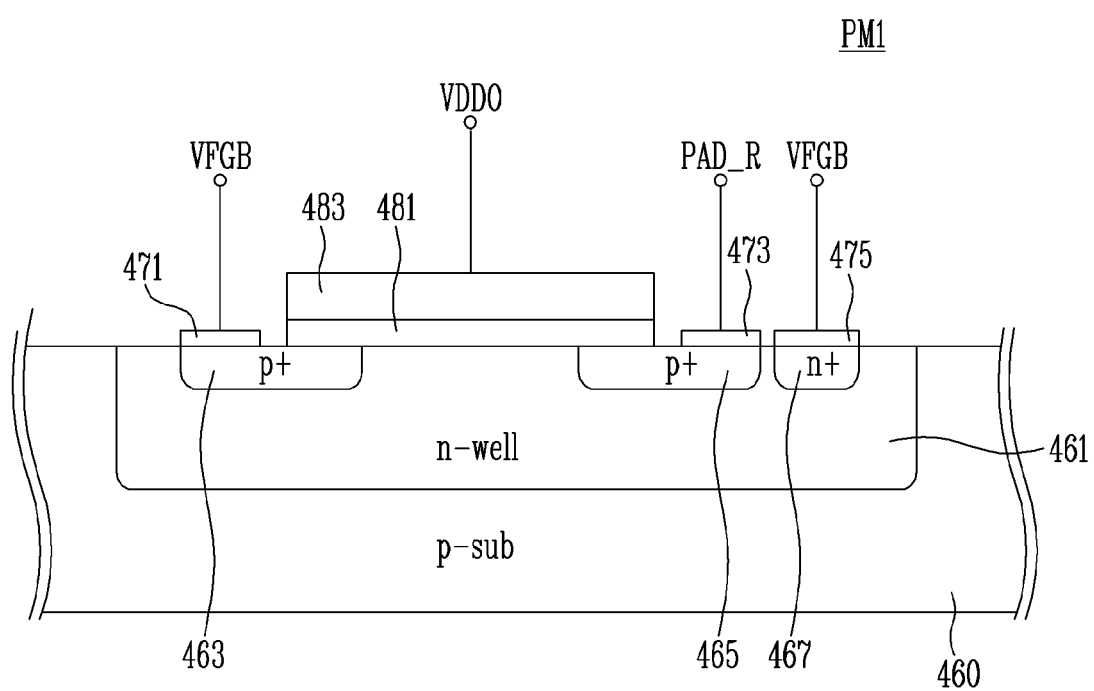
FIG. 8 is a diagram illustrating a specific configuration of a first PMOS transistor of FIG. 7 according to an embodiment.

FIG. 8 is a diagram illustrating a specific configuration of the first PMOS transistor PM1 of FIG. 7 according to an embodiment.

In FIG. 7, a bulk region voltage of the first PMOS transistor PM1 is connected to the feedback voltage VFGB. In FIG. 8, such a structure of the first PMOS transistor PM1 is specifically shown.

Referring to FIG. 8, an n-well 461 is formed on a p-type substrate 460. The n-well 461 may function as a bulk region of the first PMOS transistor PM1. Meanwhile, a source region 465 and a drain region 463 are formed on the n-well 461. The source region 465 and the drain region 463 may be formed as high concentration p+ regions. A source electrode 473 and a drain electrode 471 are formed on the source region 465 and the drain region 463, respectively. In addition, an insulating layer 481 and a gate electrode 483 are formed on the n-well 461. Therefore, a PMOS transistor PM1 is configured. In addition, a high concentration n+ region 467 is further formed on the n-well 461 to provide electrical connection with the n-well 461 which is the bulk region. A bulk electrode 475 is formed on the n+ region 467.

Meanwhile, referring to an electrode connection of the first PMOS transistor PM1, the source electrode 473 is connected to the pad voltage PAD_R, the drain electrode 471 is connected to the feedback voltage VFGB, and the gate electrode 483 is connected to the first power voltage VDDO. In addition, the bulk electrode 475 may be connected to the feedback voltage VFGB to configure an electrical connection relationship of the first PMOS transistor PM1 shown in FIG. 7.

Figure 9:
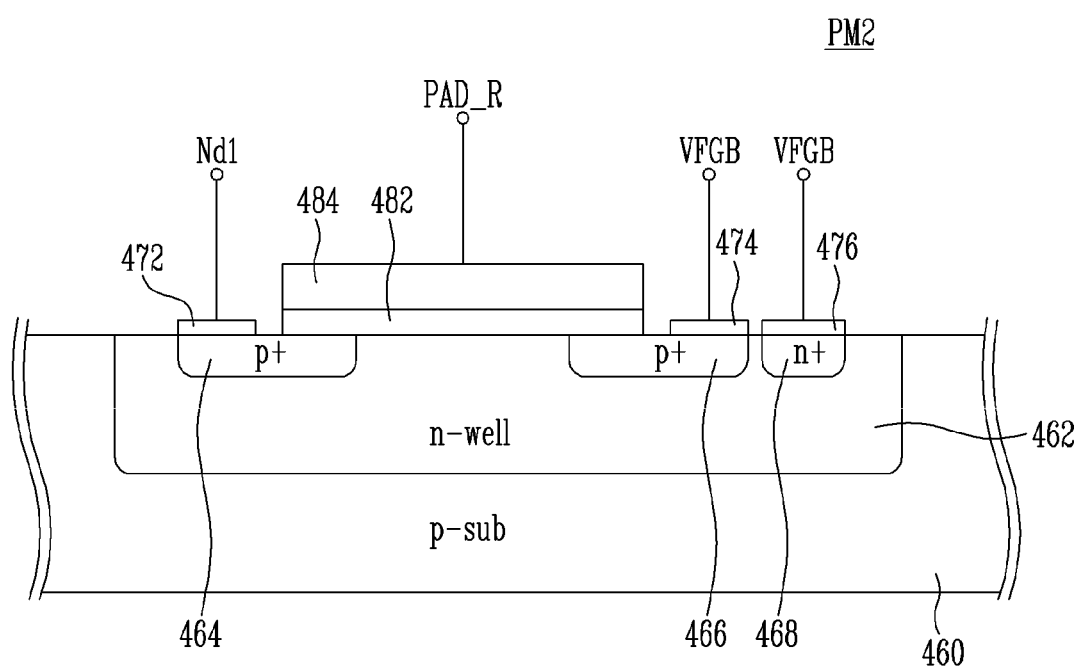
FIG. 9 is a diagram illustrating a specific configuration of a second PMOS transistor of FIG. 7 according to an embodiment.

FIG. 9 is a diagram illustrating a specific configuration of the second PMOS transistor PM2 of FIG. 7 according to an embodiment.

In FIG. 7, a bulk region voltage of the second PMOS transistor PM2 is connected to the feedback voltage VFGB. In FIG. 9, a structure of the second PMOS transistor PM2 is specifically shown.

Referring to FIG. 9, an n-well 462 is formed on a p-type substrate 460. The n-well 462 may function as a bulk region of the second PMOS transistor PM2. Meanwhile, a source region 466 and a drain region 464 are formed on the n-well 462. The source region 466 and the drain region 464 may be formed as high concentration p+ regions. A source electrode 474 and a drain electrode 472 are formed on the source region 466 and the drain region 464, respectively. In addition, an insulating layer 482 and a gate electrode 484 are formed on the n-well 462. Therefore, a PMOS transistor is configured. In addition, a high concentration n+ region 468 is further formed on the n-well 462 to provide an electrical connection with the n-well 462 which is the bulk region. A bulk electrode 476 is formed on the n+ region 468.

Meanwhile, referring to an electrode connection of the second PMOS transistor PM2, the source electrode 474 is connected to the feedback voltage VFGB, the drain electrode 472 is connected to the node Nd1, and the gate electrode 484 is connected to the pad voltage PAD_R. In addition, the bulk electrode 476 may be connected to the feedback voltage VFGB to configure an electrical connection relationship of the second PMOS transistor PM2 shown in FIG. 7.

Figure 10:
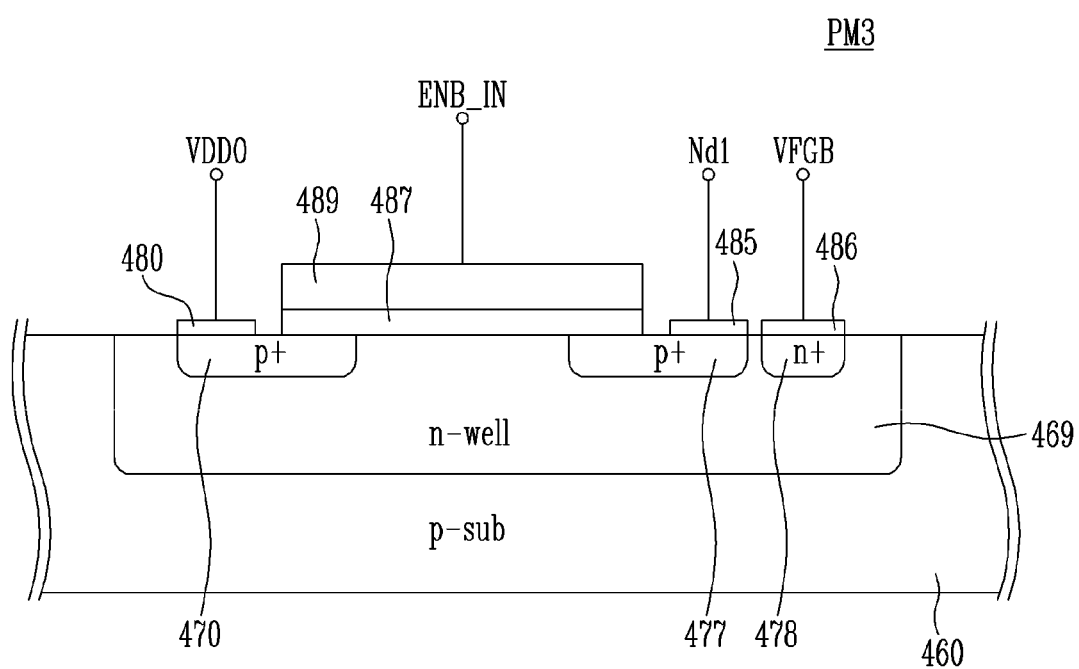
FIG. 10 is a diagram illustrating a specific configuration of a third PMOS transistor of FIG. 7 according to an embodiment.

FIG. 10 is a diagram illustrating a specific configuration of the third PMOS transistor PM3 of FIG. 7 according to an embodiment.

In FIG. 7, a bulk region voltage of the third PMOS transistor PM3 is connected to the feedback voltage VFGB. In FIG. 10, a structure of the third PMOS transistor PM3 is specifically shown.

Referring to FIG. 10, an n-well 469 is formed on a p-type substrate 460. The n-well 469 may function as a bulk region of the third PMOS transistor PM3. Meanwhile, a source region 477 and a drain region 470 are formed on the n-well 469. The source region 477 and the drain region 470 may be formed as high concentration p+ regions. A source electrode 485 and a drain electrode 480 are formed on the source region 477 and the drain region 470, respectively. In addition, an insulating layer 487 and a gate electrode 489 are formed on the n-well 469. Therefore, a PMOS transistor is configured. In addition, a high concentration n+ region 478 is further formed on the n-well 469 to provide an electrical connection with the n-well 469 which is the bulk region. A bulk electrode 486 is formed on the n+ region 478.

Meanwhile, referring to an electrode connection of the third PMOS transistor PM3, the source electrode 485 is connected to the node Nd1, the drain electrode 480 is connected to the first power voltage VDDO, and the gate electrode 489 is connected to the inverted enable signal ENB_IN. In addition, the bulk electrode 486 is connected to the feedback voltage VFGB to form an electrical connection relationship of the third PMOS transistor PM3 shown in FIG. 7.

Figure 11:
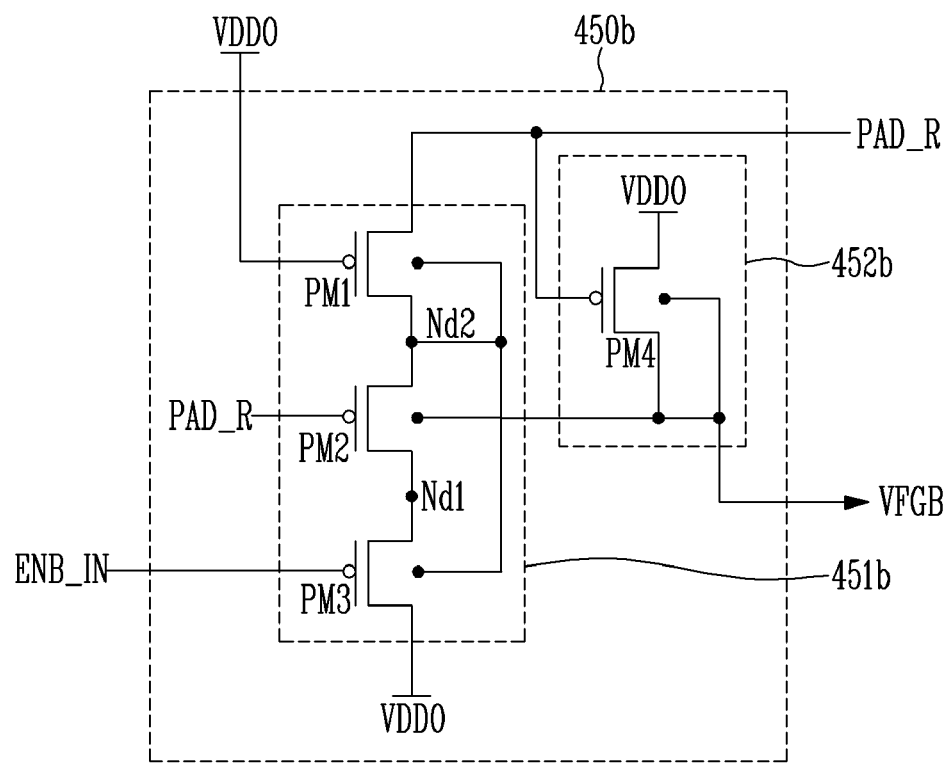
FIG. 11 is a circuit diagram illustrating a gate control logic suitable for use as the gate control logic of FIG. 6 according to another embodiment.

FIG. 11 is a circuit diagram illustrating a gate control logic 450b suitable for used as the gate control logic 450 of FIG. 6 according to another embodiment.

The gate control logic 450b according to FIG. 11 may be similar the gate control logic 450a of FIG. 7. However, the gate control logic 450b of the present embodiment may further include a fourth PMOS transistor PM4. The fourth PMOS transistor PM4 may be driven as a voltage stabilizer 452b. That is, the gate control logic 450b includes a feedback transistor component 451b and the voltage stabilizer 452b. An effect obtained by further including the fourth PMOS transistor PM4 will be described later with reference to FIG. 13.

Figure 12A:
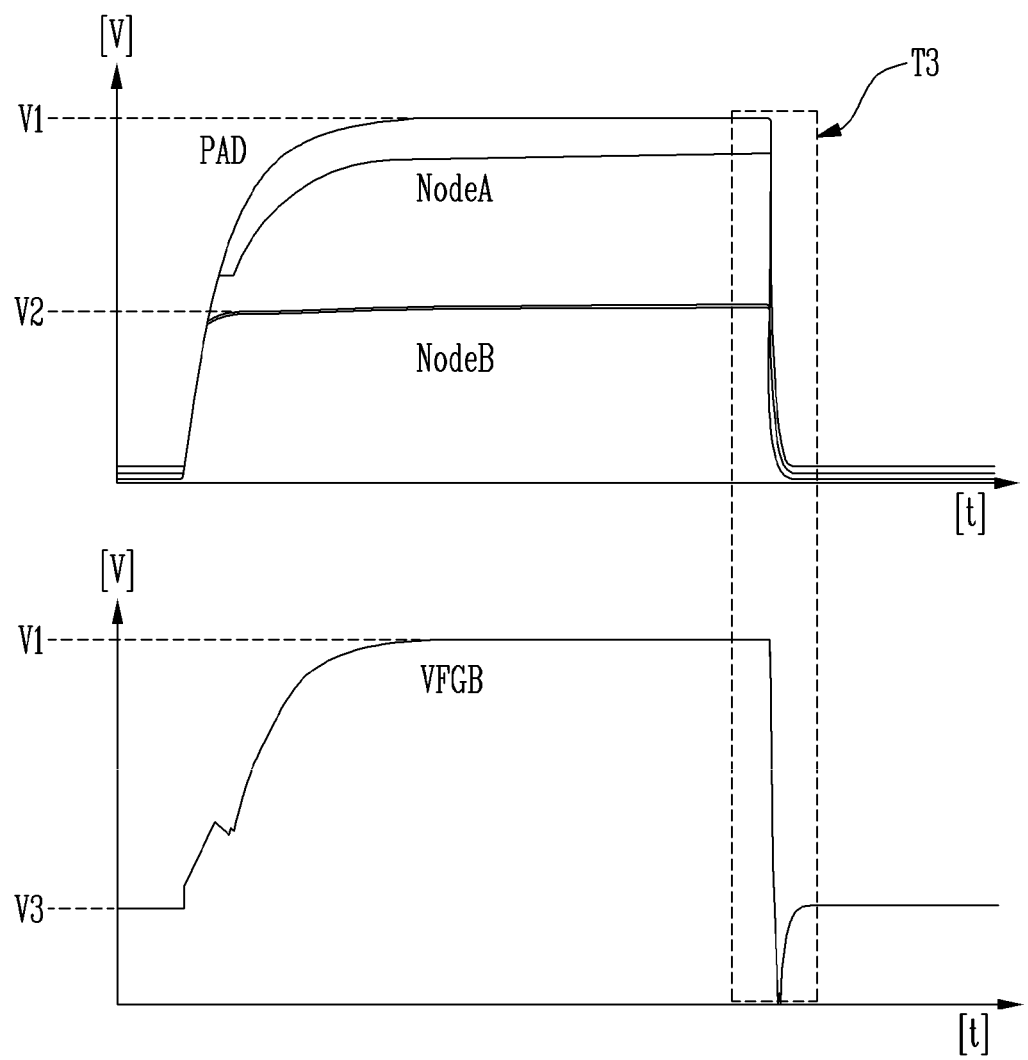
FIG. 12A is an operation waveform diagram of the output driving circuit of FIG. 6 according to an embodiment.

FIG. 12A is an operation waveform diagram of the output driving circuit 400 of FIG. 6 according to an embodiment. Meanwhile, FIG. 12B is a waveform diagram showing an enlarged T3 period of FIG. 12A.

Referring to FIG. 12A, when the clock signal CLK transitions from a low state to a high state, the voltage of the pad 420 changes from the external high voltage VDDH to 0V. A voltage level of the external high voltage VDDH may be a first level V1. The first level V1 may be 3.5V. The voltage of the node A Node A may change from a level slightly less than the voltage of the pad 420 to 0V. Meanwhile, the voltage of the node B Node B may change from a second level V2 to 0V. The second level V2 may be about 1.6V.

As the voltage of the pad 420 changes to 0V, a voltage level of the feedback voltage VFGB may change from the first level V1 to a third level V3. The third level V3 may be about 1.8V. Therefore, the voltage level of the feedback voltage VFGB changes from 3.5V to 1.8V.

Figure 12B:
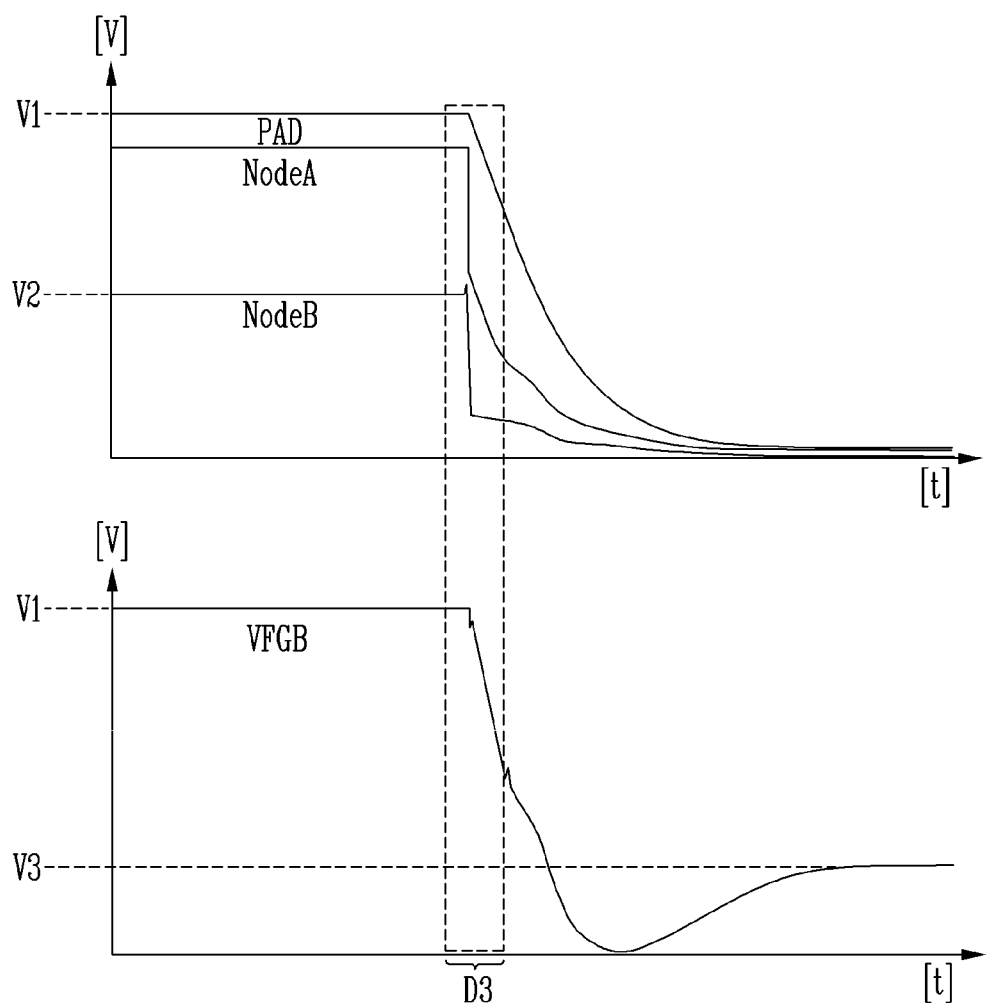
FIG. 12B is a waveform diagram showing an enlarged T3 period of FIG. 12A.

Referring to FIG. 12B, the waveform diagram of the T3 period shown by a dotted line in FIG. 12A is enlarged. As shown in FIG. 12B, in a D3 period in which the voltage of the pad 420, the voltage of the node A Node A, and voltage of the node B Node B decrease during the T3 period, a difference between the voltage of the pad 420 and the voltage of the node A Node A may maintain a value less than a difference (for example, about 2V) between the first level V1 and the second level V2. In addition, in the D3 period, a difference between the voltage of the node A Node A and the voltage of the node B Node B may maintain a value less than the difference (for example, about 2V) between the first level V1 and the second level V2.

That is, after applying a bias of the pad 420 to the gate of the first transistor NM1, a gate bias is switched to 1.8V. Accordingly, a voltage level is gradually lowered in a state in which the voltage of the node A Node A is increased by VDDH–Vth_NM1 to minimize the difference between the voltage of the pad 420 and the voltage of the node A Node A and the difference between the voltage of the node A Node A and the voltage of the node B Node B. Accordingly, reliability conditions of the first and second transistors NM1 and NM2 are satisfied.

FIG. 13 is a waveform diagram for describing the effect of adding the fourth PMOS transistor PM4 shown in FIG. 11, that is, the voltage stabilizer 452b. (A) of FIG. 13 shows a diagram of the pad voltage PAD, (B) of FIG. 13 shows a diagram of the feedback voltage VFGB when the fourth PMOS transistor PM4 is not provided in the gate control logic 450a as shown in FIG. 7, and (C) of FIG. 13 is a diagram of the feedback voltage VFGB when the fourth PMOS transistor PM4 is provided in the gate control logic 450b as shown in FIG. 11.

As shown in FIG. 13(B), when the fourth PMOS transistor PM4 is not provided, the feedback voltage VFGB is unstable in a region A and a region B. However, when the fourth PMOS transistor PM4 is provided to the gate control logic 450b, the feedback voltage VFGB may be stable in a region C and a region D.

Figure 14:
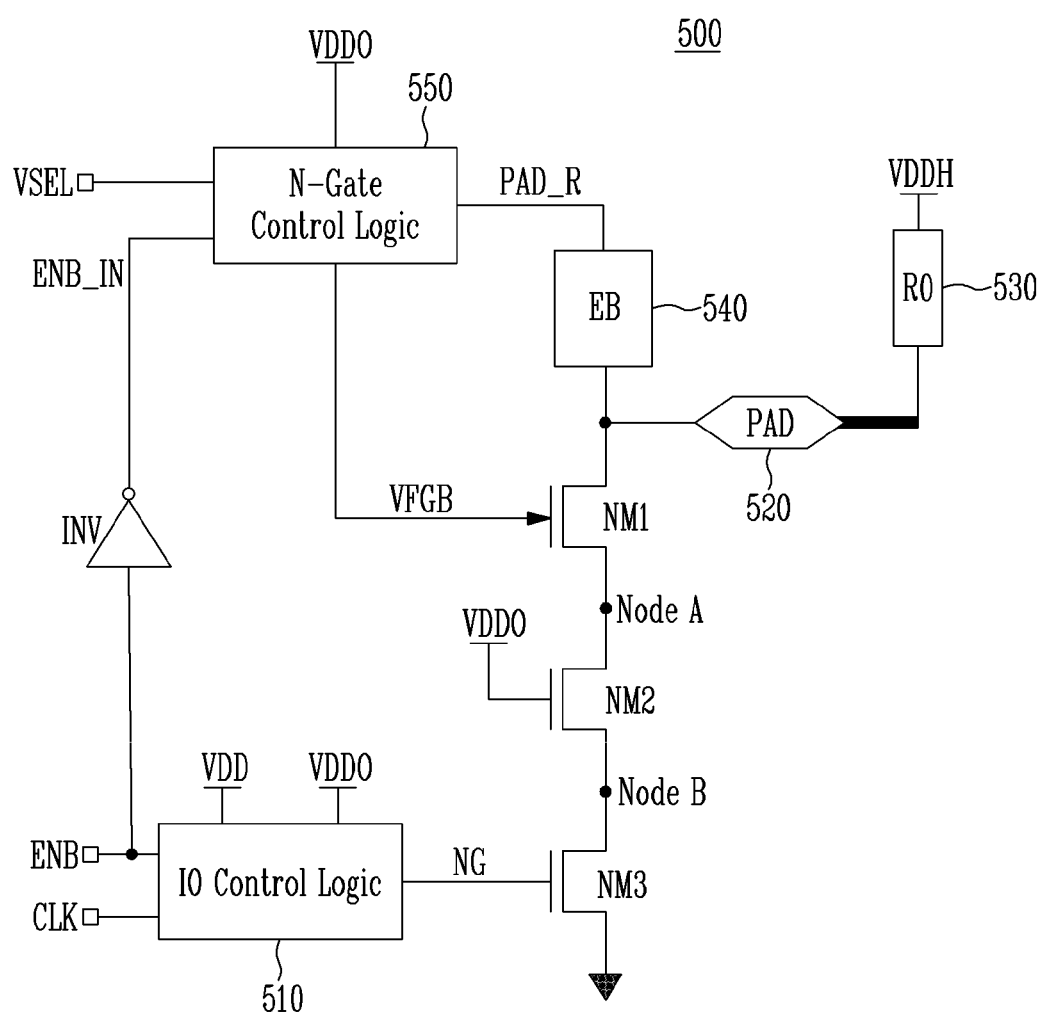
FIG. 14 is a circuit diagram illustrating an output driving circuit according to another embodiment of the present disclosure.

FIG. 14 is a circuit diagram illustrating an output driving circuit 500 according to another embodiment of the present disclosure.

Referring to FIG. 14, the output driving circuit 500 according to an embodiment of the present disclosure may include first, second, and third transistors NM1, NM2, and NM3, which are sequentially connected in series between a pad 520 and a ground node, an input/output control logic 510, a gate control logic 550, and an inverter INV. The input/output control logic 510 receives a clock signal CLK and an enable signal ENB, and transfers a first control signal NG to the third transistor NM3. The gate control logic 550 receives a voltage PAD_R of the pad 520. In addition, the gate control logic 550 may output a feedback voltage VFGB to a gate terminal of the first transistor NM1. The inverter INV inverts the enable signal ENB and transfers an inverted enable signal ENB_IN to the gate control logic 550. In addition, the gate control logic 550 receives a second control signal VSEL. An external high voltage VDDH is applied to the pad 520 through an external resistor $R_0$. In addition, the output driving circuit 500 may further include an ESD block 540 connected between the pad 520 and the gate control logic 550.

As described above, the ESD block 540 may include an ESD circuit with an internal resistor for discharging electrostatic electricity applied from the pad or an ESD control system including the ESD circuit. Configurations and operating methods of the ESD circuit and the ESD control system including the same will be described later with reference to FIG. 36 to FIG. 44. A difference between the output driving circuit 500 of FIG. 14 and the output driving circuit 400 of FIG. 6 is that the gate control logic 550 further receives the second control signal VSEL. Specific configuration and operation of the gate control logic 550 will be described later with reference to FIG. 15.

Figure 15:
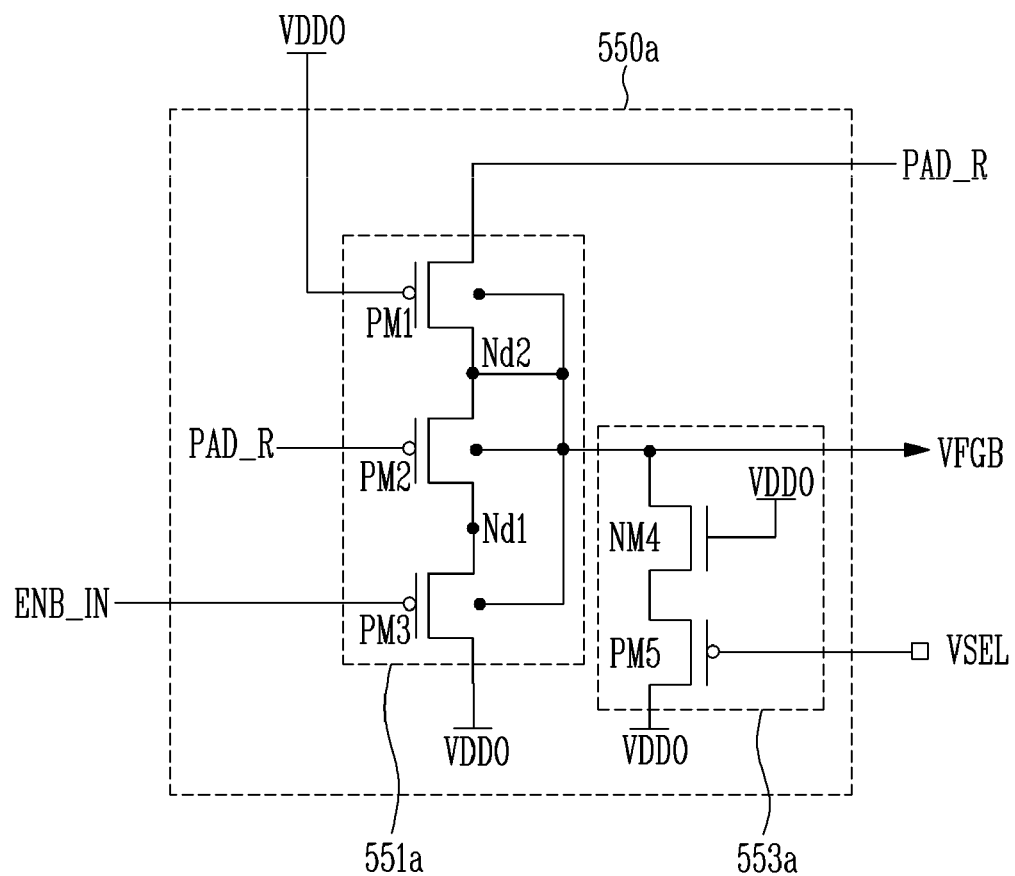
FIG. 15 is a circuit diagram illustrating a gate control logic suitable for use as a gate control logic of FIG. 14 according to an embodiment.

FIG. 15 is a circuit diagram illustrating a gate control logic 550a suitable for use as the gate control logic 550 of FIG. 14 according to an embodiment.

Referring to FIG. 15, the gate control logic 550a includes first, second, and third PMOS transistors PM1, PM2, and PM3 sequentially connected in series between a pad voltage PAD_R and a first power voltage VDDO. A series connection structure of the first, second, and third PMOS transistors PM1, PM2, and PM3 may configure a feedback transistor component 551a. A drain electrode of the first PMOS transistor PM1 and a source electrode of the second PMOS transistor PM2 are connected to a node Nd2. In addition, a drain electrode of the second PMOS transistor PM2 and a source electrode of the third PMOS transistor PM3 are connected to a node Nd1. Meanwhile, the first power voltage VDDO is applied to a gate terminal of the first PMOS transistor PM1, the pad voltage PAD_R is applied to a gate terminal of the second PMOS transistor PM2, and the inverted enable signal ENB_IN is applied to a gate terminal of the third PMOS transistor PM3. In addition, a bulk region voltage of the first, second, and third PMOS transistors PM1, PM2, and PM3 is output as the feedback voltage VFGB.

Meanwhile, a difference between the gate control logic 550a of FIG. 15 and the gate control logic 450a of FIG. 7 is that the gate control logic 550a further includes a fourth NMOS transistor NM4 and a fifth PMOS transistor PM5 sequentially connected in series between an output terminal of the feedback voltage VFGB and the first power voltage VDDO. The fourth NMOS transistor NM4 and the fifth PMOS transistor PM5 may configure an external voltage selector 553a. The first power voltage VDDO is applied to a gate terminal of the fourth NMOS transistor NM4, and the second control signal VSEL is applied to a gate terminal of the fifth PMOS transistor PM5. The disclosed open-drain output structure may operate even in a case where the external high voltage VDDH is 1.8V by the additional fifth PMOS transistor PM5. Meanwhile, when the external high voltage VDDH is 3.3V, the fourth NMOS transistor NM4 causes a drain voltage of the fifth PMOS transistor PM5 to be VDDO−Vth_NM4 (in this case, the drain voltage of the fifth PMOS transistor PM5 becomes about 1.4V), to satisfy a reliability condition of the fifth PMOS transistor PM5.

When the external high voltage VDDH may be 3.3V, the gate control logic 550a shown in FIG. 15 operates identically to the gate control logic 450a shown in FIG. 7. When the external voltage VDDH may be 1.8V, the feedback voltage VFGB is maintained between VDDO−Vth_NM4 and 1.8V (that is, 1.4V (the drain voltage of the fifth PMOS transistor PM5)≤VFGB≤1.8V). That is, an open-drain output structure that is more flexible than the external voltage selector 553a may be used.

Figure 16:
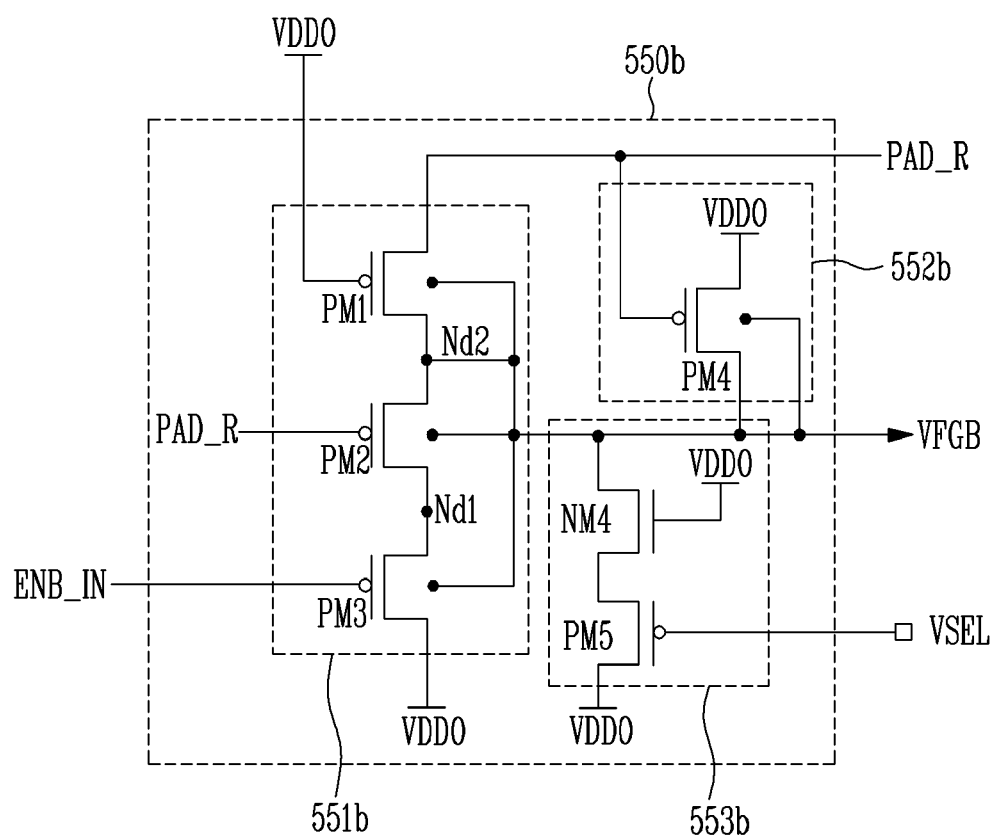
FIG. 16 is a circuit diagram illustrating a gate control logic suitable for use as the gate control logic of FIG. 14 according to another embodiment.

FIG. 16 is a circuit diagram illustrating a gate control logic 550b suitable for use as the gate control logic 550 of FIG. 14 according to another embodiment.

Referring to FIG. 16, the gate control logic 550b may include a feedback transistor component 551b, a voltage stabilizer 552b, and an external voltage selector 553b. The feedback transistor component 551b and the external voltage selector 553b may be substantially the same as the feedback transistor component 551a and the external voltage selector 553b of FIG. 15, respectively. The voltage stabilizer 552b may include the fourth PMOS transistor PM4 as shown in FIG. 11. As described above with reference to FIG. 13, a more stable feedback voltage VFGB may be formed by adding the fourth PMOS transistor PM4.

FIG. 17 is a waveform diagram illustrating an operation of the output driving circuit 500 of FIG. 14, when the external high voltage VDDH is 1.8V. Referring to FIG. 17, the voltage of the pad 520 may increase to a fourth level V4. In an embodiment, the fourth level V4 may be 1.8V. As shown in FIG. 17, when the output driving circuit 500 is configured as shown in FIGS. 14 and 15, a reliability condition of an element may be properly satisfied even though the external high voltage VDDH is the fourth level V4, that is, 1.8V.

However, in a situation in which the first power voltage VDDO has a value of 0V, when the external high voltage VDDH is applied through the pad, a reliability issue of the element may occur. For example, when the first power voltage VDDO is 0V and the external high voltage VDDH exceeding 1.98V is applied to the pad, the voltage of the node A Node A is also 1.98V. At this time, the gate-drain voltage $V_{GD}$ of the second transistor NM2 may exceed 1.98V. Therefore, a reliability condition of the first transistor NM1 may be satisfied, but a reliability condition of the second transistor NM2 may not be satisfied. Therefore, an output driving circuit capable of satisfying the reliability condition of element may be desirable even when the first power voltage VDDO is in an off state, that is, 0V.

Figure 18:
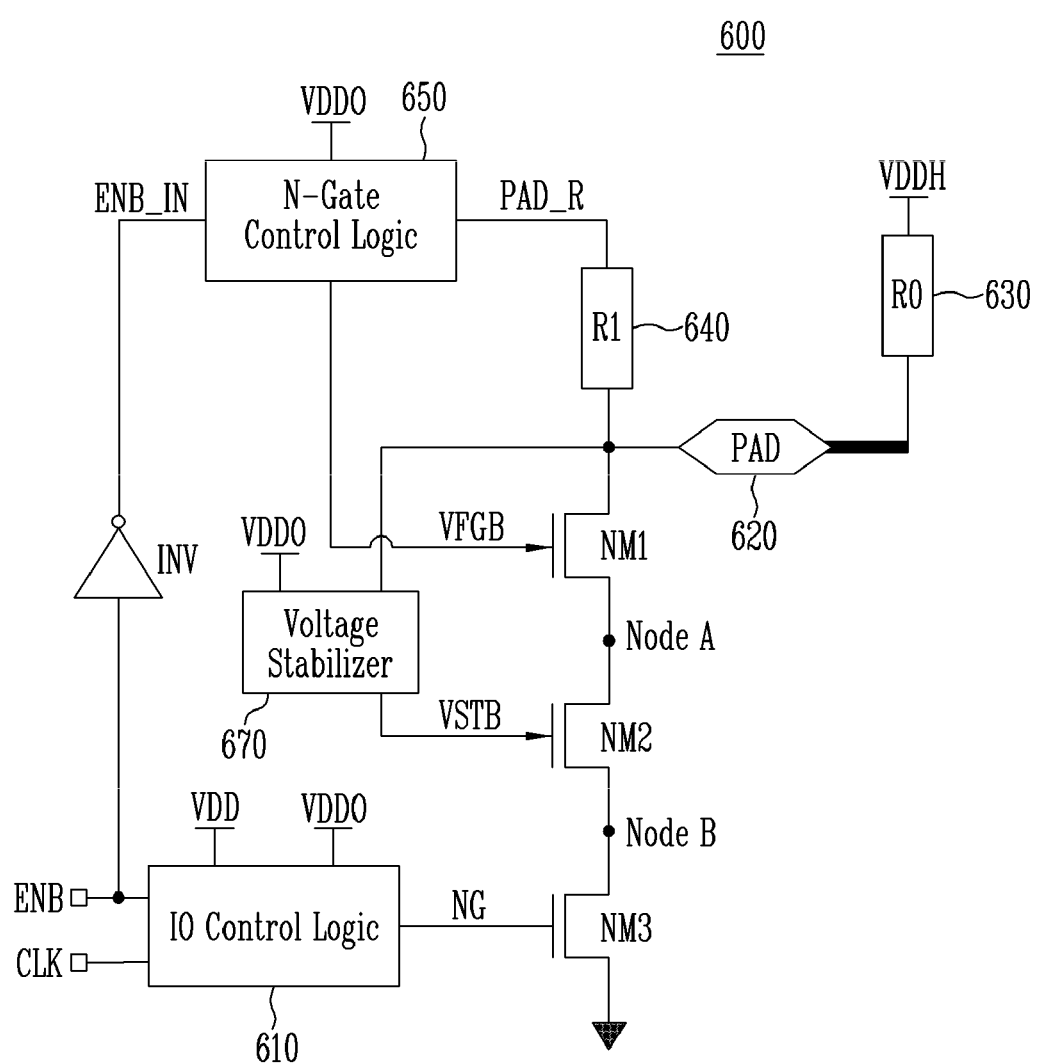
FIG. 18 is a circuit diagram illustrating an output driving circuit according to still another embodiment of the present disclosure.

FIG. 18 is a circuit diagram illustrating an output driving circuit 600 according to still another embodiment of the present disclosure.

Referring to FIG. 18, the output driving circuit 600 according to the still another embodiment of the present disclosure includes first, second, and third transistors NM1, NM2, and NM3, which are sequentially connected in series between a pad 620 and a ground node, an input/output control logic 610, a gate control logic 650, an inverter INV, and a voltage stabilizer 670. The input/output control logic 610 receives a clock signal CLK and an enable signal ENB, and outputs a first control signal NG to the third transistor NM3. The gate control logic 650 receives a voltage PAD_R of the pad 620. In addition, the gate control logic 650 outputs a feedback voltage VFGB to a gate terminal of the first transistor NM1. The inverter INV inverts the enable signal ENB and outputs an inverted enable signal ENB_IN to the gate control logic 650. Meanwhile, the pad 620 is connected to an external high voltage VDDH through an external resistor R0. In addition, the output driving circuit 600 may further include an internal resistor R1 connected between the pad 620 and the gate control logic 650. In an embodiment, the internal resistor R1 may be used as an ESD protection resistor.

The output driving circuit 600 of FIG. 18 may be substantially the same as the output driving circuit 400 of FIG. 6, except that the output driving circuit 600 further includes the voltage stabilizer 670 and the second transistor NM2 receives a stabilization voltage VSTB from the voltage stabilizer 670. Therefore, the gate control logic 650 of FIG. 18 may be implemented as one of the gate control logics 450a of FIG. 7 and the gate control logics 450b of FIG. 11. The voltage stabilizer 670 is connected to the pad 620 to receive a voltage applied to the pad 620, and outputs the stabilization voltage VSTB to a gate terminal of the second transistor NM2.

The stabilization voltage VSTB may be a voltage in a range satisfying a reliability condition of the second transistor NM2. Specifically, the stabilization voltage VSTB may have a value sufficient to make a voltage difference between two terminals of the second transistor NM2 equal to or less than a given value, thereby ensuring reliability of the second transistor NM2. In an embodiment, the stabilization voltage VSTB may be a voltage causing the gate-drain voltage $V_{GD}$ of the second transistor NM2 has a value of 1.98V or less, as shown in Table 1. For example, when a voltage applied through the pad 620 and applied to a drain of the second transistor NM2 through the first transistor is 3.3V, the stabilization voltage VSTB may be a voltage greater than 1.32V and less than 3.3V.

That is, even though the first power voltage VDDO is 0 V, the voltage stabilizer 670 according to an embodiment of the present disclosure may apply the stabilization voltage VSTB having a value of 1.32V or more to the gate terminal of the second transistor NM2. Therefore, the reliability condition of the second transistor NM2 may be satisfied even when a relatively high level (e.g., 3.3 V) of the external high voltage VDDH is applied and the first power voltage VDDO has a relatively low level (e.g., 0V).

Figure 19A:
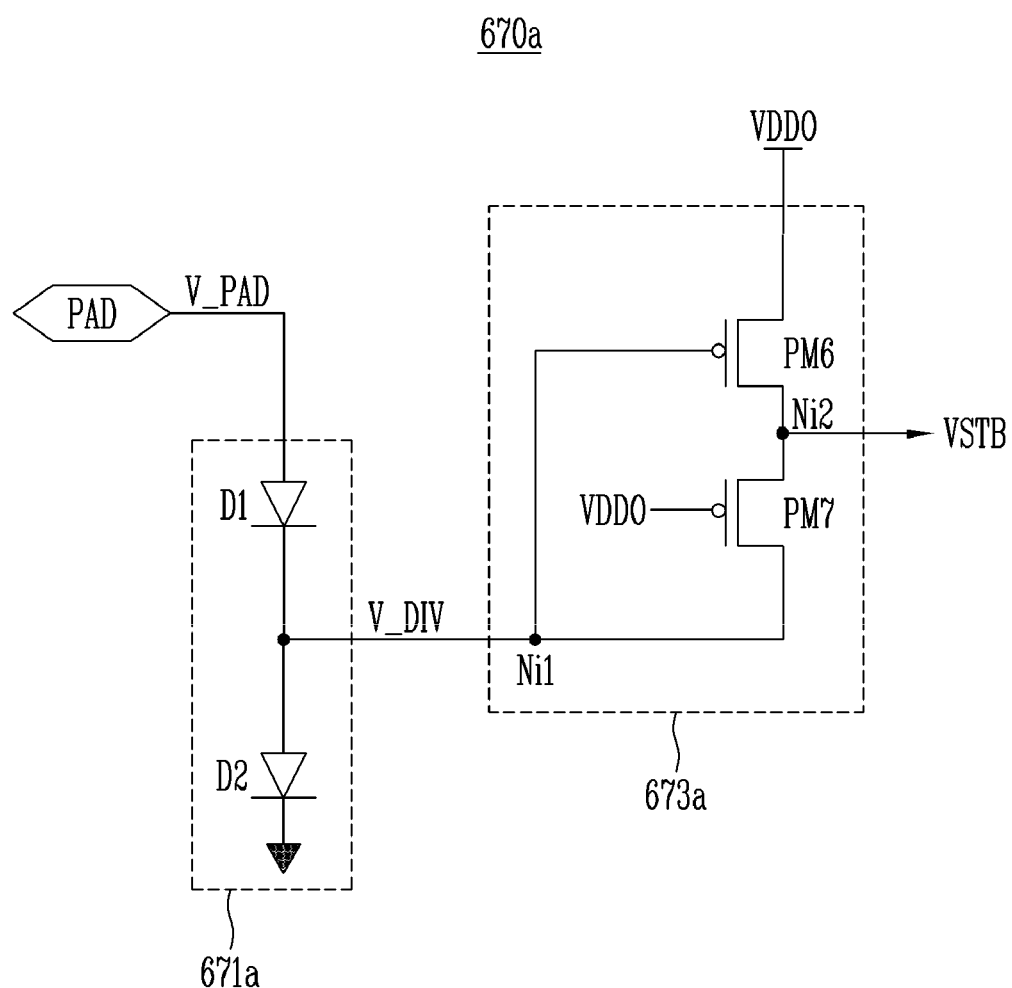
FIG. 19A is a circuit diagram illustrating a voltage stabilizer suitable for use as a voltage stabilizer of FIG. 18 according to an embodiment.

FIG. 19A is a circuit diagram illustrating a voltage stabilizer 670a suitable for use as the voltage stabilizer 670 of FIG. 18, according to an embodiment. Referring to FIG. 19A, the voltage stabilizer 670a according to an embodiment of the present disclosure includes a voltage divider 671a and a stabilization voltage generator 673a.

The voltage divider 671a is connected to a pad (e.g., the pad 620 in FIG. 18), and outputs a division voltage V_DIV generated by dividing a voltage V_PAD applied through the pad, through a first internal node Ni1. In the embodiment of FIG. 19A, the voltage divider 671a includes a first diode D1 and a second diode D2 connected in series between the pad and the ground node. However, embodiments of the present disclosure are not limited thereto, and may be implemented as any type of a division circuit capable of dividing the voltage V_PAD applied through the pad and outputting a division voltage. For example, the voltage divider may include a plurality of resistors connected in series between the pad and the ground node.

In an embodiment, characteristics of the first and second diodes D1 and D2 may be substantially the same. For example, a forward voltage of each of the first and second diodes D1 and D2 may be substantially equal to a half of the voltage V_PAD applied from the pad. In this case, the division voltage V_DIV may have a value corresponding to about a half of the voltage V_PAD applied from the pad. However, embodiments of the present disclosure are not limited thereto, and the voltage divider 671a may be configured so that the division voltage V_DIV has an arbitrary value between the voltage V_PAD applied from the pad and the ground voltage.

The stabilization voltage generator 673a receives the division voltage V_DIV through the first internal node Ni1. In addition, the stabilization voltage generator 673a receives the first power voltage VDDO. In the embodiment of FIG. 19A, the stabilization voltage generator 673a may include a sixth PMOS transistor PM6 and a seventh PMOS transistor PM7 connected in series between the first power voltage VDDO and the first internal node Ni1. The sixth PMOS transistor PM6 is connected between the first power voltage VDDO and a second internal node Ni2. A gate terminal of the sixth PMOS transistor PM6 is connected to the first internal node Ni1. The seventh PMOS transistor PM7 is connected between the second internal node Ni2 and the first internal node Ni1. A gate terminal of the seventh PMOS transistor PM7 is connected to the first power voltage VDDO. Meanwhile, the stabilization voltage generator 673a outputs the stabilization voltage VSTB through the second internal node Ni2.

When the first power voltage VDDO is a voltage of 0V, the seventh PMOS transistor PM7 is turned on. Meanwhile, when the voltage V_PAD applied to the pad is a relatively high voltage, for example, 3.3V in a state in which the first power voltage VDDO is 0V, the division voltage V_DIV is about 1.65V. In this case, the division voltage V_DIV may be a voltage that weakly turns on the sixth PMOS transistor PM6. Since the sixth transistor PM6 is weakly turned on and the seventh PMOS transistor PM7 is relatively strongly turned on, the stabilization voltage generator 673a outputs the stabilization voltage VSTB that is substantially equal to the division voltage V_DIV.

In an embodiment, the stabilization voltage VSTB may have a magnitude sufficient to make a difference between voltages at an end terminal (e.g., the drain) of the second transistor NM2 and a control terminal (e.g., the gate) of the second transistor NM2 equal to or less than a given value (e.g., 1.98V) for satisfying the reliability condition of the second transistor NM2. For example, as described above, when the voltage V_PAD applied to the pad is 3.3V, the stabilization voltage VSTB for satisfying the reliability condition of the second transistor NM2 is a voltage (e.g., about 1.65V) greater than 1.32V. Therefore, the voltage divider 671a may divide the pad voltage of 3.3V, and output a voltage greater than 1.32V as the division voltage V_DIV. In this case, the reliability condition of the second transistor NM2 may be satisfied even though the external high voltage VDDH of 3.3V is applied through the pad in a state in which the first power voltage VDDO is 0V.

When the first power voltage VDDO is a voltage (for example, 1.8V) of a normal state other than 0V, the seventh PMOS transistor PM7 is turned off. For example, when the first power voltage VDDO is about 1.8V, the first power voltage VDDO may be in a range of 1.7V to 1.9V, 1.75V to 1.85V, 1.77V to 1.83V, or 1.79V to 1.81V. Meanwhile, when the voltage V_PAD applied to the pad is a high voltage, for example, 3.3V, the division voltage V_DIV becomes about 1.65V. In this case, the division voltage V_DIV may be a voltage that weakly turns on the sixth PMOS transistor PM6.

Since the sixth transistor PM6 is weakly turned on and the seventh PMOS transistor PM7 is turned off, the stabilization voltage VSTB output through the second internal node Ni2 may be substantially equal to the first power voltage VDDO of the normal state. However, in this case, since the sixth PMOS transistor PM6 is weakly turned on, the stabilization voltage VSTB may increase somewhat slowly to reach the first power voltage VDDO.

Figure 19B:
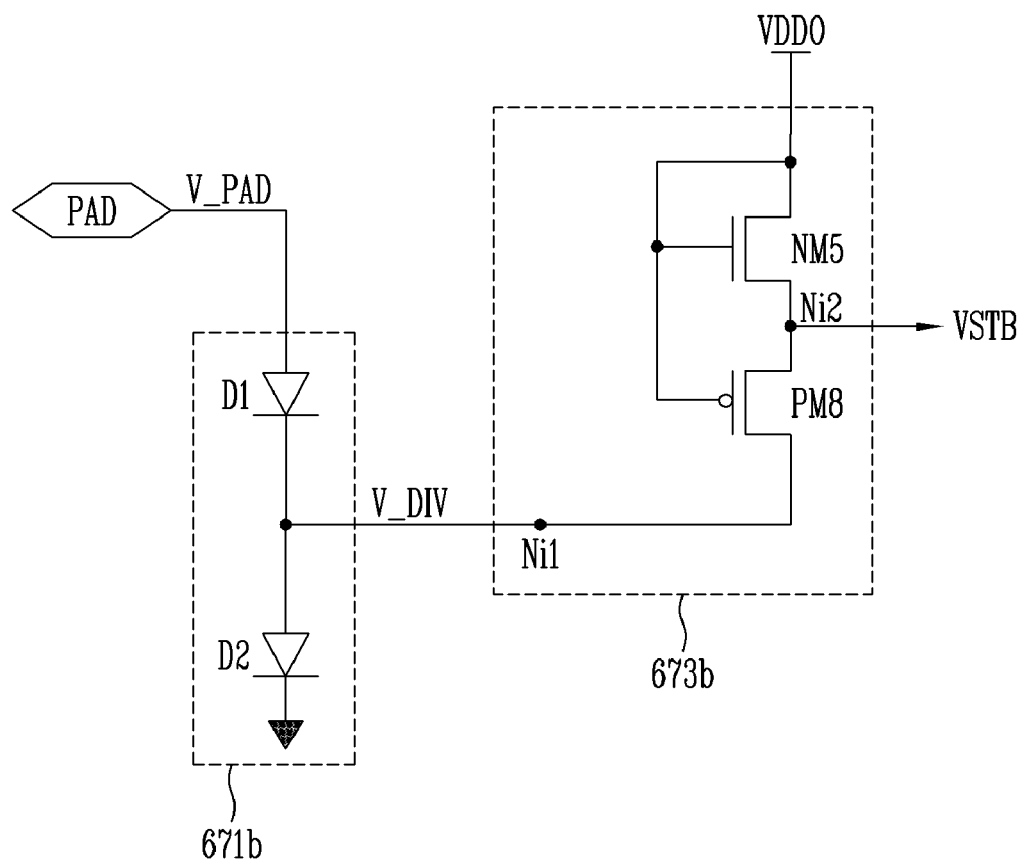
FIGS. 19B, 19C, 19D, 19E, 19F, 19G, 19H, and 19I are circuit diagrams each illustrating a voltage stabilizer suitable for use as the voltage stabilizer of FIG. 18 according to an embodiment.

FIG. 19B is a circuit diagram illustrating a voltage stabilizer 670b suitable for use as the voltage stabilizer 670 of FIG. 18, according to another embodiment. Referring to FIG. 19B, the voltage stabilizer 670b according to another embodiment of the present disclosure includes a voltage divider 671b and a stabilization voltage generator 673b. The voltage divider 671b of FIG. 19B may be substantially the same as the voltage divider 671a of FIG. 19A. Therefore, repetitive description of the voltage divider 671b is omitted.

The stabilization voltage generator 673b receives the division voltage V_DIV through the first internal node Ni1. In addition, the stabilization voltage generator 673b receives the first power voltage VDDO. In the embodiment of FIG. 19B, the stabilization voltage generator 673b may include a fifth NMOS transistor NM5 and an eighth PMOS transistor PM8 connected in series between the first power voltage VDDO and the first internal node Ni1. The fifth NMOS transistor NM5 is connected between the first power voltage VDDO and the second internal node Ni2. A gate terminal of the fifth NMOS transistor NM5 is connected to the first power voltage VDDO. The eighth PMOS transistor PM8 is connected between the second internal node Ni2 and the first internal node Ni1. A gate terminal of the eighth PMOS transistor PM8 is connected to the first power voltage VDDO. Meanwhile, the stabilization voltage generator 673b outputs the stabilization voltage VSTB through the second internal node Ni2.

When the first power voltage VDDO is a voltage of 0V, the fifth NMOS transistor NM5 is turned off, and the eighth PMOS transistor PM8 is turned on. Therefore, in this case, the stabilization voltage generator 673b outputs the division voltage V_DIV as the stabilization voltage VSTB to the gate terminal of the second transistor NM2.

When the first power voltage VDDO is a voltage (for example, 1.8 V) of a normal state other than 0V, the fifth NMOS transistor NM5 is turned on, and the eighth PMOS transistor PM8 is turned off. Therefore, in this case, the stabilization voltage generator 673b outputs the first power voltage VDDO as the stabilization voltage VSTB to the gate terminal of the second transistor NM2 of FIG. 18.

In a case of the stabilization voltage generator 673a of FIG. 19A, since the sixth PMOS transistor PM6 is weakly turned on when the first power voltage VDDO is the voltage of the normal state other than 0V, the stabilization voltage VSTB may increase somewhat slowly to a voltage level of the first power voltage VDDO. In comparison with this, in a case of the stabilization voltage generator 673b of FIG. 19B, the fifth NMOS transistor NM5 turned on by the first power voltage VDDO may quickly increase the stabilization voltage VSTB to a voltage level of the first power voltage VDDO.

Figure 19C:
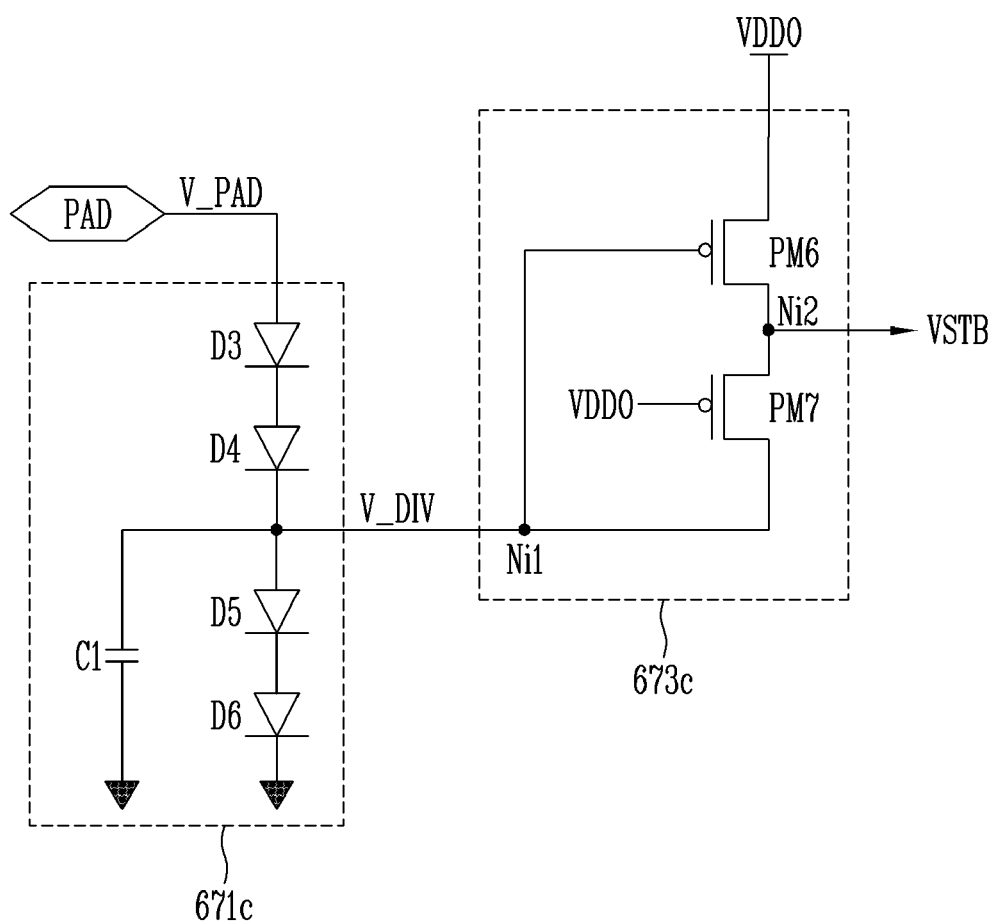

FIG. 19C is a circuit diagram illustrating a voltage stabilizer 670c suitable for used as the voltage stabilizer 670 of FIG. 18, according to another embodiment. Referring to FIG. 19C, the voltage stabilizer 670c according to another embodiment of the present disclosure includes a voltage divider 671c and a stabilization voltage generator 673c. The stabilization voltage generator 673c of FIG. 19C may be substantially the same as the stabilization voltage generator 673a of FIG. 19A. Therefore, repetitive description of the stabilization voltage generator 673c is omitted.

Referring to FIG. 19C, the voltage divider 671c is connected to the pad, and outputs the division voltage V_DIV generated by dividing the voltage V_PAD applied through the pad, through the first internal node Ni1. Differently from the voltage divider 671a of FIG. 19A, which includes the two diodes D1 and D2, in the embodiment of FIG. 19C, the voltage divider 671c includes third to sixth diodes D3 to D6 connected in series between the pad and the ground node. According to a size of the diode and an application voltage, the number of diodes included in the voltage divider 671c may be variously determined. For example, assuming that the same level (e.g., 3.3V) of the voltage can be applied to the pad, each of the third to sixth diodes D3 to D6 in FIG. 19C may have a size such that its forward voltage is about a half of that of each of the first and second diodes D1 and D2 in FIG. 19A, thereby making a voltage drop across the third and fourth diodes D3 and D4 of FIG. 19C substantially equal to that across the first diode D1 of FIG. 19A and making a voltage drop across the fifth and sixth diodes D5 and D6 of FIG. 19C substantially equal to that across the second diode D2 of FIG. 19A. Meanwhile, in FIG. 19C, the number of diodes D3 and D4 connected between the pad and the first internal node Ni1 and the number of diodes D5 and D6 connected between the first internal node Ni1 and the ground are the same. However, embodiments of the present disclosure are not limited thereto, and different numbers of diodes may be connected between the pad and the first internal node Ni1 and between the first internal node Ni1 and the ground.

Meanwhile, the voltage divider 671c shown in FIG. 19C may further include a capacitor C1 connected between the first internal node Ni1 and the ground. That is, the capacitor C1 is connected to the fifth and sixth diodes D5 and D6 in parallel. The division voltage V_DIV output through the first internal node Ni1 may be stably maintained by the capacitor C1 connected between the first internal node Ni1 and the ground.

Figure 19D:
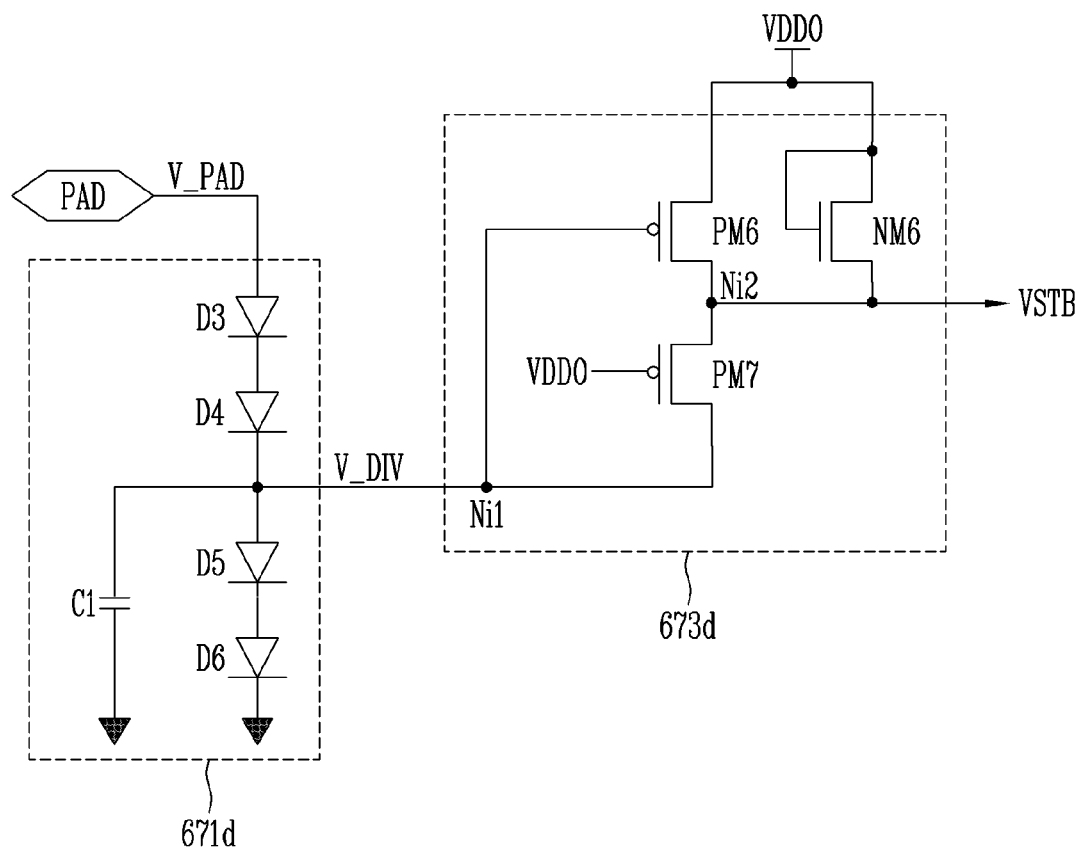

FIG. 19D is a circuit diagram illustrating a voltage stabilizer 670d suitable for used as the voltage stabilizer 670 of FIG. 18, according to another embodiment. Referring to FIG. 19D, the voltage stabilizer 670d according to another embodiment of the present disclosure includes a voltage divider 671d and a stabilization voltage generator 673d. The voltage divider 671d of FIG. 19D may be substantially the same as the voltage divider 671c of FIG. 19C. Therefore, repetitive description of the voltage divider 671d is omitted.

The stabilization voltage generator 673d receives the division voltage V_DIV through the first internal node Ni1. In addition, the stabilization voltage generator 673d receives the first power voltage VDDO. In the embodiment of FIG. 19D, the stabilization voltage generator 673d may include a sixth PMOS transistor PM6 and a seventh PMOS transistor PM7 connected in series between the first power voltage VDDO and the first internal node Ni1, and a sixth NMOS transistor NM6 connected between the first power voltage VDDO and the second internal node Ni2. The sixth PMOS transistor PM6 is connected between the first power voltage VDDO and the second internal node Ni2. A gate terminal of the sixth PMOS transistor PM6 is connected to the first internal node Ni1. The seventh PMOS transistor PM7 is connected between the second internal node Ni2 and the first internal node Ni1. A gate terminal of the seventh PMOS transistor PM7 is connected to the first power voltage VDDO. A gate terminal of the sixth NMOS transistor NM6 is connected to the first power voltage VDDO. Meanwhile, the stabilization voltage generator 673d outputs the stabilization voltage VSTB through the second internal node Ni2.

Comparing FIGS. 19C and 19D, the stabilization voltage generator 673d of FIG. 19D is substantially the same as the stabilization voltage generator 673c of FIG. 19C except that the stabilization voltage generator 673d further includes the sixth NMOS transistor NM6 connected between the first power voltage VDDO and the second internal node Ni2.

When the first power voltage VDDO is a voltage of 0V, the seventh PMOS transistor PM7 is turned on and the sixth NMOS transistor NM6 is turned off. Meanwhile, when the voltage V_PAD applied to the pad is a high voltage, for example, 3.3V in a state in which the first power voltage VDDO is 0V, the division voltage V_DIV is about 1.65V. In this case, the division voltage V_DIV may be a voltage that weakly turns on the sixth PMOS transistor PM6. Since the sixth transistor PM6 is weakly turned on and the seventh PMOS transistor PM7 is relatively strongly turned on, the stabilization voltage generator 673d outputs the stabilization voltage VSTB that is substantially equal to the division voltage V_DIV.

As described above, when the voltage V_PAD applied to the pad is 3.3V, the stabilization voltage VSTB for satisfying the reliability condition of the second transistor NM2 of FIG. 18 is a voltage greater than 1.32V. Therefore, the voltage divider 671d may divide the pad voltage of 3.3V, and output a voltage greater than 1.32V as the division voltage V_DIV. In this case, the reliability condition of the second transistor NM2 may be satisfied even though the external high voltage VDDH of 3.3V is applied through the pad in a state in which the first power voltage VDDO is 0V.

When the first power voltage VDDO is a voltage (for example, 1.8 V) of a normal state other than 0V, the seventh PMOS transistor PM7 is turned off and the sixth NMOS transistor NM6 is turned on. Meanwhile, when the voltage V_PAD applied to the pad is a relatively high voltage, for example, 3.3V, the division voltage V_DIV is about 1.65V. In this case, the division voltage V_DIV may be a voltage that weakly turns on the sixth PMOS transistor PM6. Since the sixth transistor PM6 is weakly turned on and the sixth NMOS transistor NM6 is relatively strongly turned on in a state in which the seventh PMOS transistor is turned off, the stabilization voltage VSTB output through the second internal node Ni2 may be substantially equal to the first power voltage VDDO of the normal state.

In a case of each of the stabilization voltage generators 673a of FIG. 19A and 673c of FIG. 19C, since the sixth PMOS transistor PM6 is weakly turned on when the first power voltage VDDO is the voltage of the normal state other than 0V, the stabilization voltage VSTB may increase somewhat slowly to a level of the first power voltage VDDO. In comparison with this, in a case of the stabilization voltage generator 673d of FIG. 19D, the sixth NMOS transistor NM6 turned on by the first power voltage VDDO may quickly increase the stabilization voltage VSTB to the voltage level of the first power voltage VDDO.

Figure 19E:
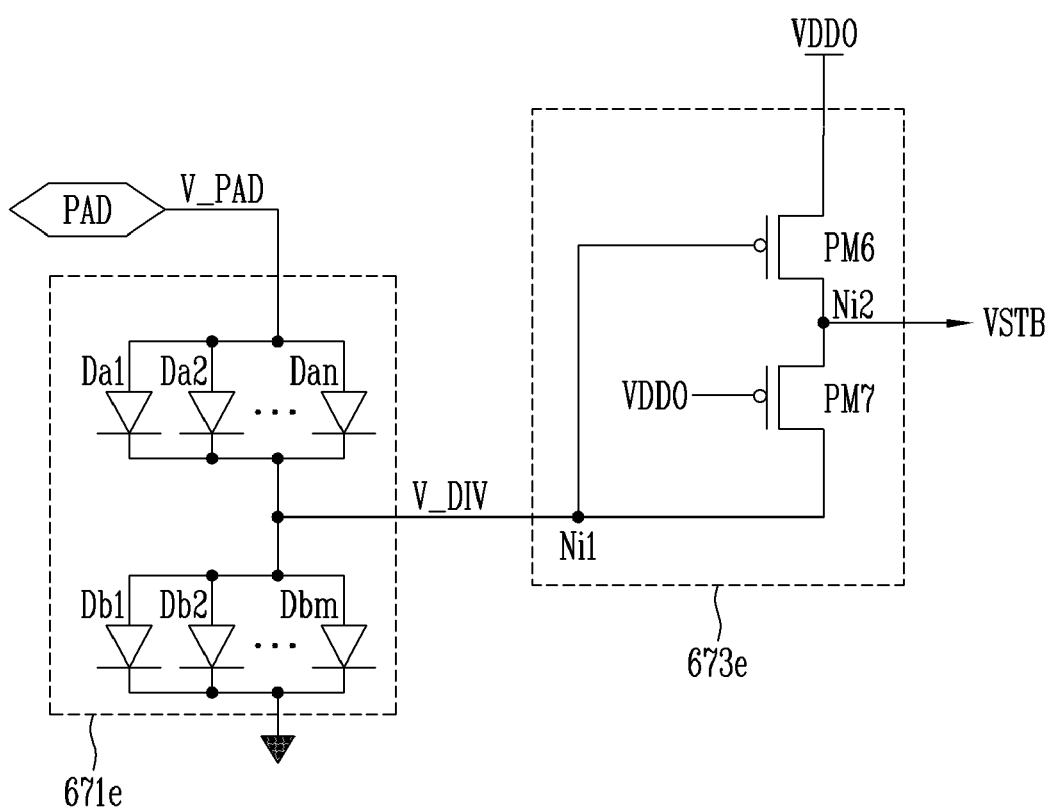

FIG. 19E is a circuit diagram illustrating a voltage stabilizer 670e suitable for use as the voltage stabilizer 670 of FIG. 18, according to another embodiment. Referring to FIG. 19E, the voltage stabilizer 670e according to another embodiment of the present disclosure includes a voltage divider 671e and a stabilization voltage generator 673e. The stabilization voltage generator 673e of FIG. 19E may be substantially the same as the stabilization voltage generator 673a of FIG. 19A. Therefore, repetitive description of the stabilization voltage generator 673e is omitted.

The voltage divider 671e is connected to the pad, and outputs the division voltage V_DIV generated by dividing the voltage V_PAD applied through the pad, through the first internal node Ni1. In the embodiment of FIG. 19E, the voltage divider 671e may include n first diodes Da1, Da2, . . . , and Dan connected in parallel between the pad and the first internal node Ni1 and m second diodes Db1, Db2, . . . , and Dbm connected in parallel between the first internal node Ni1 and the ground node. The number n of the first diodes Da1 to Dan and the number m of the second diodes Db1 to Dbm are natural numbers, and may be the same number or different numbers. When n and m have a value of 1, the voltage divider 671e of FIG. 19E may be substantially the same as the voltage divider 671a of FIG. 19A. According to embodiments of the present disclosure, n and m may be arbitrary natural numbers.

In the embodiment of FIG. 19E, the stabilization voltage generator 673e is substantially the same as the stabilization voltage generator 673a of FIG. 19A. However, embodiments of the present disclosure are not limited thereto, and the voltage stabilizer 670e of FIG. 19E may include the stabilization voltage generator 673b of FIG. 19B or the stabilization voltage generator 673d of FIG. 19D, rather than the stabilization voltage generator 673e.

Figure 19F:
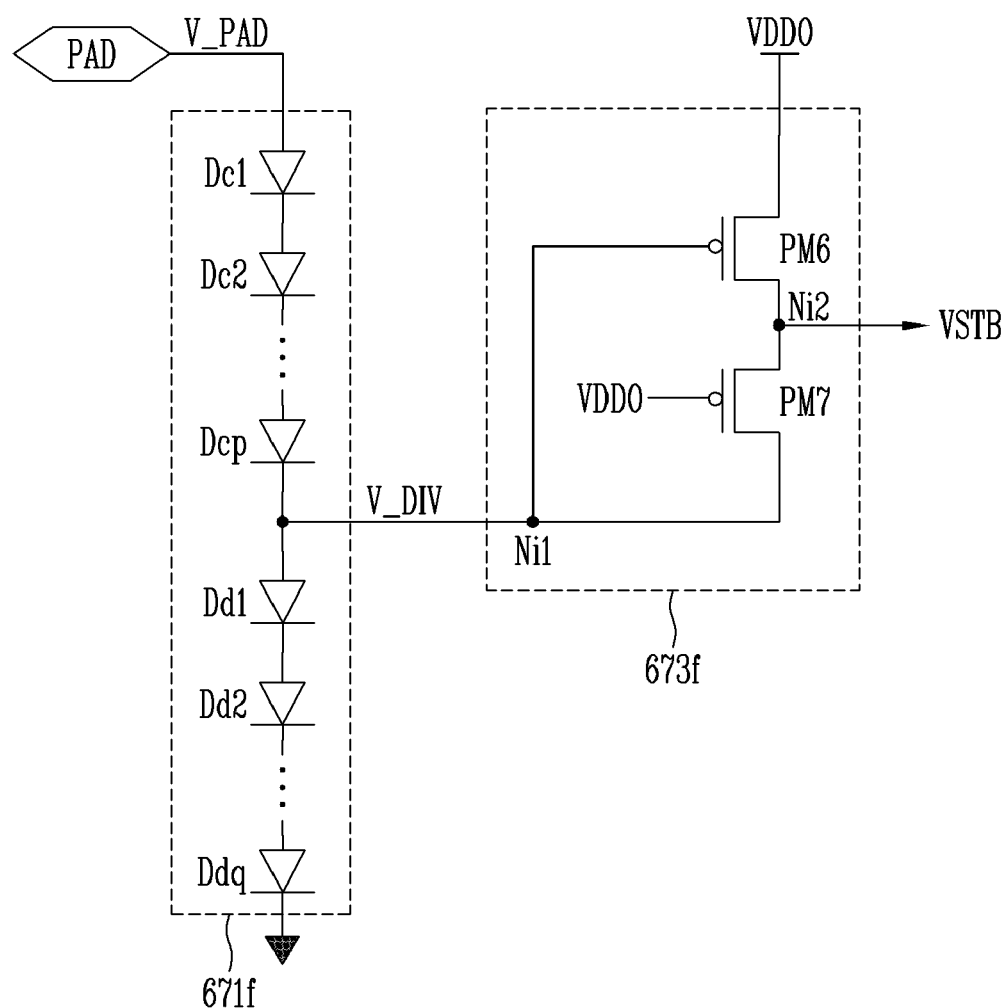

FIG. 19F is a circuit diagram illustrating a voltage stabilizer 670f suitable for used as the voltage stabilizer 670 of FIG. 18, according to another embodiment. Referring to FIG. 19F, the voltage stabilizer 670f according to another embodiment of the present disclosure includes a voltage divider 671f and a stabilization voltage generator 673f. The stabilization voltage generator 673f of FIG. 19F may be substantially the same as the stabilization voltage generator 673a of FIG. 19A. Therefore, repetitive description of the stabilization voltage generator 673f is omitted.

The voltage divider 671f is connected to the pad, and outputs the division voltage V_DIV generated by dividing the voltage V_PAD applied through the pad, through the first internal node Ni1. In the embodiment of FIG. 19F, the voltage divider 671f may include a plurality of first diodes Dc1, Dc2, . . . , and Dcp connected in series between the pad and the first internal node Ni1 and a plurality of second diodes Dd1, Dd2, . . . , and Ddq connected in parallel between the first internal node Ni1 and the ground node. The number "p" of the first diodes Dc1 to Dcp and the number "q" of the second diodes Dd1 to Ddq are natural numbers, and may be the same number or different numbers. When "p" and "q" have a value of 1, the voltage divider 671f of FIG. 19F may be substantially the same as the voltage divider 671a of FIG. 19A. According to embodiments of the present disclosure, p and q may be arbitrary natural numbers.

In the embodiment of FIG. 19F, the stabilization voltage generator 673f is substantially the same as the stabilization voltage generator 673a of FIG. 19A. However, embodiments of the present disclosure are not limited thereto, and the voltage stabilizer 670f of FIG. 19F may include the stabilization voltage generator 673b of FIG. 19B or the stabilization voltage generator 673d of FIG. 19D, rather than the stabilization voltage generator 673f.

Figure 19G:
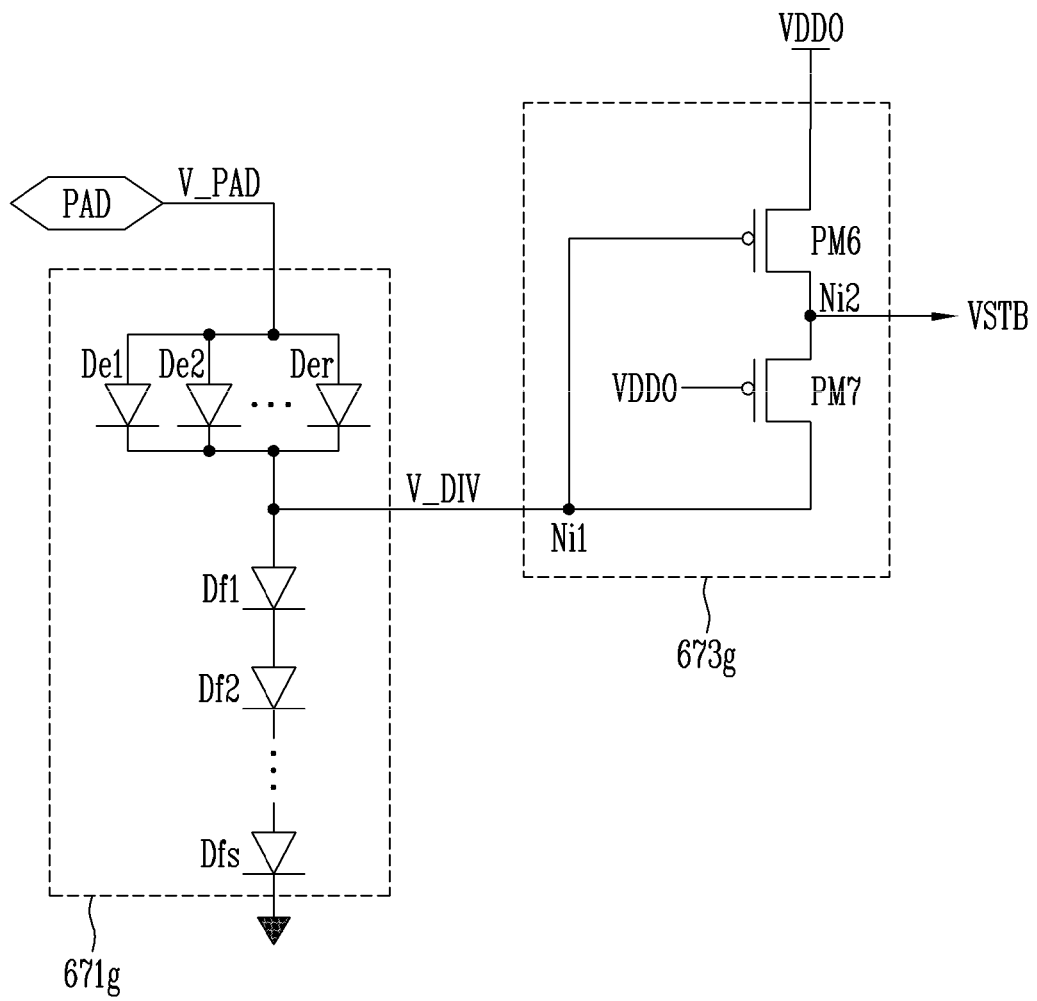

FIG. 19G is a circuit diagram illustrating a stabilization voltage generator 670g suitable for use as the voltage stabilizer 670 of FIG. 18, according to another embodiment of the present disclosure. Referring to FIG. 19G, the voltage stabilizer 670g includes a voltage divider 671g and a stabilization voltage generator 673g. The stabilization voltage generator 673g of FIG. 19G may be substantially the same as the stabilization voltage generator 673a of FIG. 19A. Therefore, repetitive description of the stabilization voltage generator 673g is omitted.

The voltage divider 671g is connected to the pad, and outputs the division voltage V_DIV generated by dividing the voltage V_PAD applied through the pad, through the first internal node Ni1. In the embodiment of FIG. 19G, the voltage divider 671g may include r first diodes De1, De2, . . . , and Der connected in parallel between the pad and the first internal node Ni1 and s second diodes Df1, Df2, . . . , and Dfs connected in series between the first internal node Ni1 and the ground node. The number r of the first diodes De1 to Der and the number s of the second diodes Df1 to Dfs are natural numbers, and may be the same number or different numbers. When r and s have a value of 1, the voltage divider 671g of FIG. 19G may be substantially the same as the voltage divider 671a of FIG. 19A. According to embodiments of the present disclosure, r and s may be arbitrary natural numbers.

In the embodiment of FIG. 19G, the stabilization voltage generator 673g is substantially the same as the stabilization voltage generator 673a of FIG. 19A. However, embodiments of the present disclosure are not limited thereto, and the voltage stabilizer 670g of FIG. 19G may include the stabilization voltage generator 673b of FIG. 19B or the stabilization voltage generator 673d of FIG. 19D, rather than the stabilization voltage generator 673g.

Figure 19H:
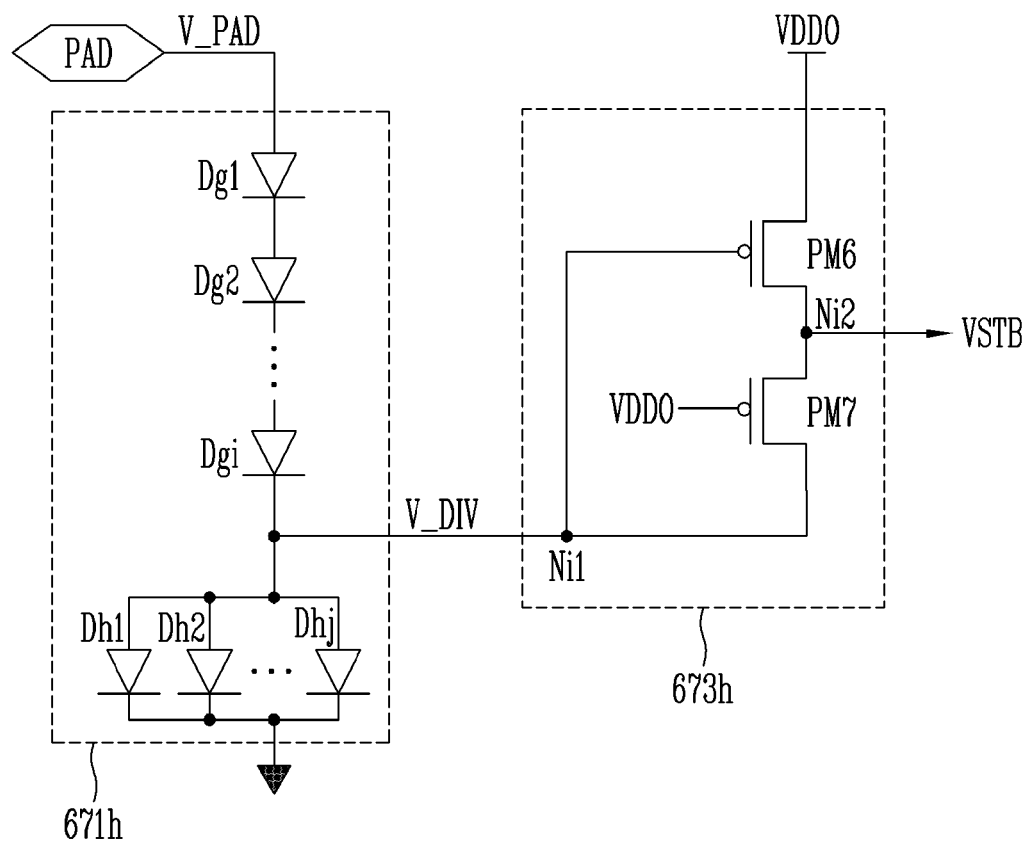

FIG. 19H is a circuit diagram illustrating a voltage stabilizer 670h suitable for use as the voltage stabilizer 670 of FIG. 18, according to another embodiment. Referring to FIG. 19H, the voltage stabilizer 670h according to another embodiment of the present disclosure includes a voltage divider 671h and a stabilization voltage generator 673h. The stabilization voltage generator 673h of FIG. 19H may be substantially the same as the stabilization voltage generator 673a of FIG. 19A. Therefore, repetitive description of the stabilization voltage generator 673h is omitted.

The voltage divider 671h is connected to the pad, and outputs the division voltage V_DIV generated by dividing the voltage V_PAD applied through the pad, through the first internal node Ni1. In the embodiment of FIG. 19H, the voltage divider 671h may include i first diodes Dg1, Dg2, . . . , and Dgi connected in series between the pad and the first internal node Ni1 and j second diodes Dh1, Dh2, . . . , and Dhj connected in parallel between the first internal node Ni1 and the ground node. The number i of the first diodes Dg1 to Dgi and the number j of the second diodes Dh1 to Dhj are natural numbers, and may be the same number or different numbers. When i and j have a value of 1, the voltage divider 671h of FIG. 19H may be substantially the same as the voltage divider 671a of FIG. 19A. According to embodiments of the present disclosure, i and j may be arbitrary natural numbers.

In the embodiment of FIG. 19H, the stabilization voltage generator 673h is substantially the same as the stabilization voltage generator 673a of FIG. 19A. However, embodiments of the present disclosure are not limited thereto, and the voltage stabilizer 670h of FIG. 19H may include the stabilization voltage generator 673b of FIG. 19B or the stabilization voltage generator 673d of FIG. 19D, rather than the stabilization voltage generator 673h.

Figure 19I:
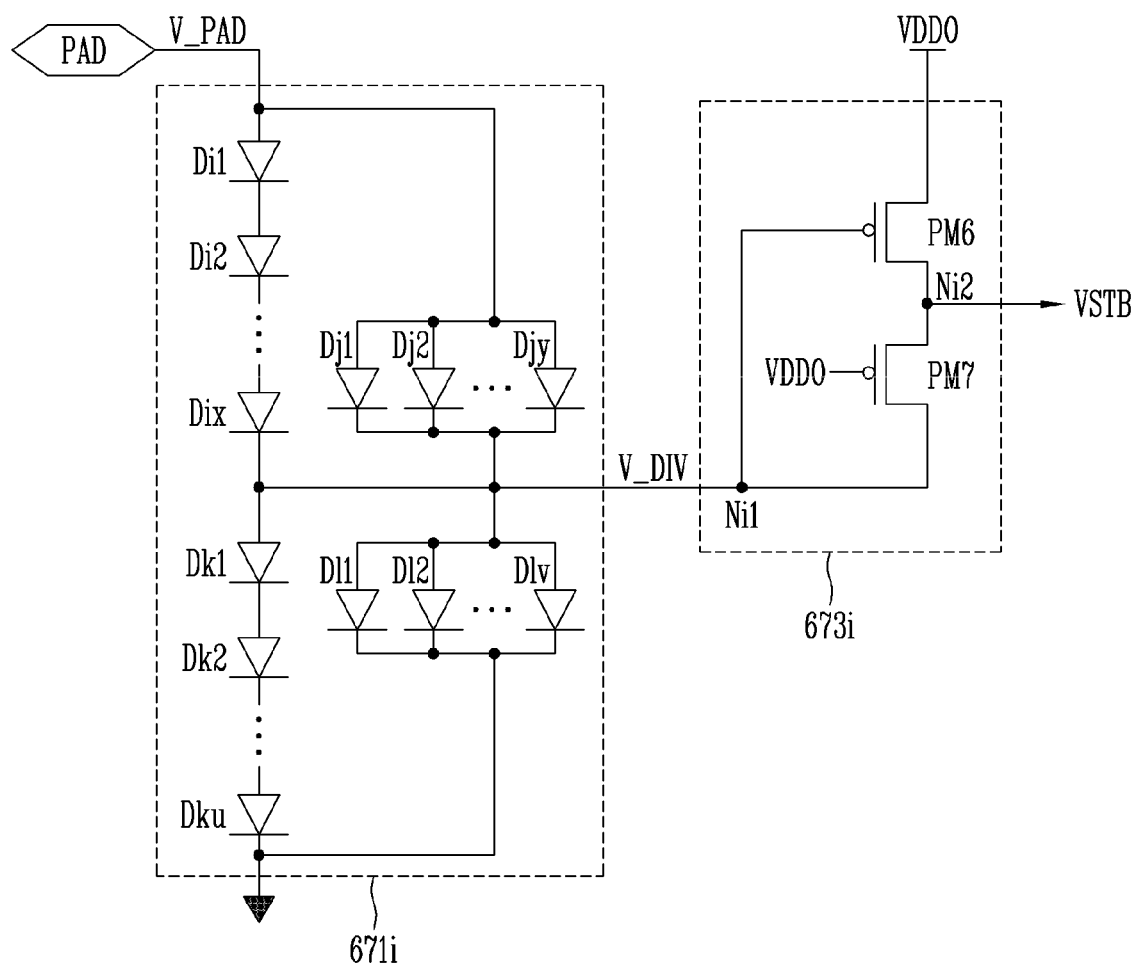

FIG. 19I is a circuit diagram illustrating a voltage stabilizer 670i suitable for use as the voltage stabilizer of FIG. 18, according to another embodiment. Referring to FIG. 19I, the voltage stabilizer 670i according to another embodiment of the present disclosure includes a voltage divider 671i and a stabilization voltage generator 673i. The stabilization voltage generator 673i of FIG. 19I may be substantially the same as the stabilization voltage generator 673a of FIG. 19A. Therefore, repetitive description of the stabilization voltage generator 673i is omitted.

The voltage divider 671i is connected to the pad, and outputs the division voltage V_DIV generated by dividing the voltage V_PAD applied through the pad, through the first internal node Ni1. In the embodiment of FIG. 19I, the voltage divider 671i may include x first diodes Di1, Di2, . . . , and Dix connected in series between the pad and the first internal node Ni1, y second diodes Dj1, Dj2, . . . , and Djy connected in parallel between the pad and the first internal node Ni1, u third diodes Dk1, Dk2, . . . , and Dku connected in series between the first internal node Ni1 and the ground node, and v fourth diodes Dl1, Dl2, . . . , and Dlv connected in parallel between the first internal node Ni1 and the ground node. The numbers x, y, u and v are natural numbers, and may be the same number or different numbers. In the embodiment of FIG. 19I, the stabilization voltage generator 673i is substantially the same as the stabilization voltage generator 673a of FIG. 19A. However, embodiments of the present disclosure are not limited thereto, and the voltage stabilizer 670i of FIG. 19I may include the stabilization voltage generator 673b of FIG. 19B or the stabilization voltage generator 673d of FIG. 19D, rather than the stabilization voltage generator 673i.

Figure 20:
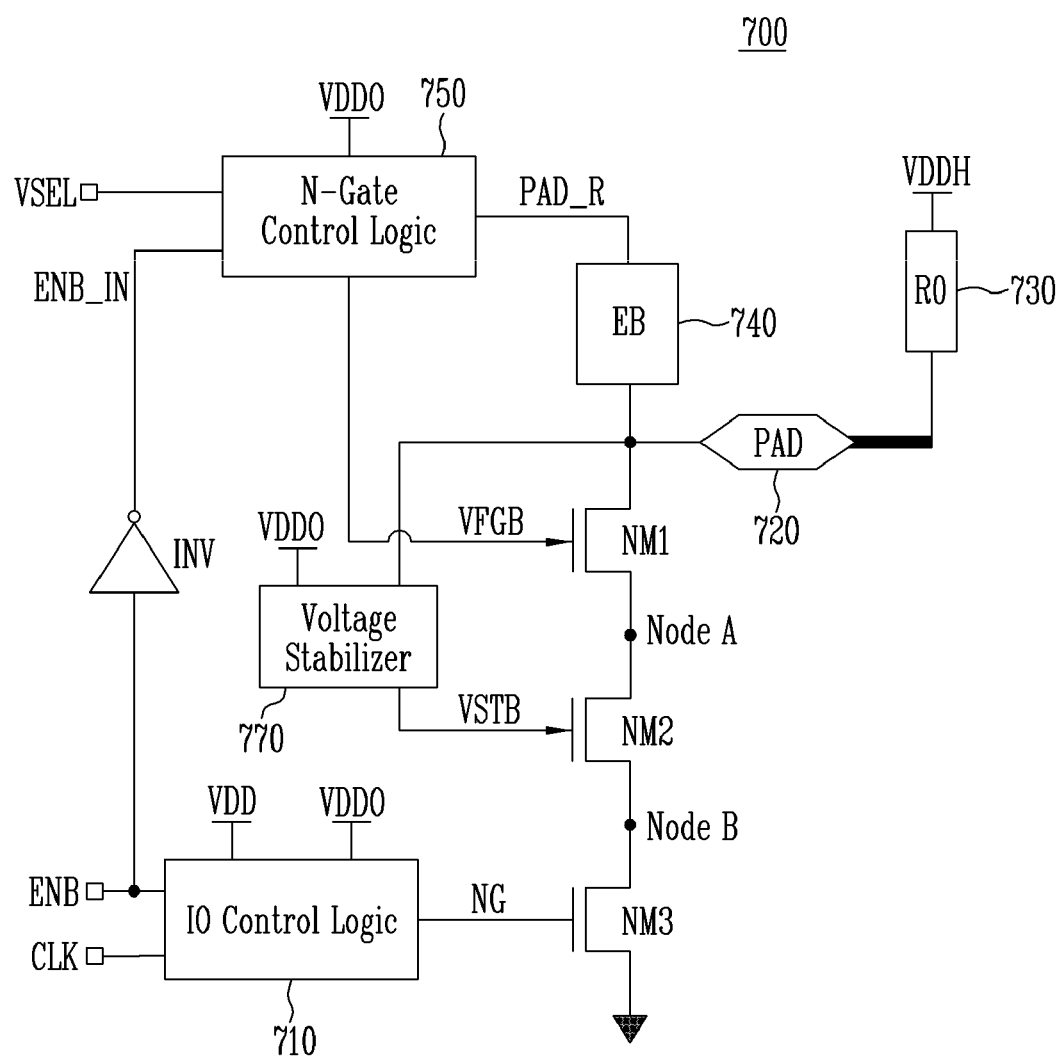
FIG. 20 is a circuit diagram illustrating an output driving circuit according to another embodiment of the present disclosure.

FIG. 20 is a circuit diagram illustrating an output driving circuit 700 according to another embodiment of the present disclosure.

Referring to FIG. 20, the output driving circuit 700 according to an embodiment of the present disclosure includes first, second, and third transistors NM1, NM2, and NM3, which are sequentially connected in series between a pad 720 and a ground node, an input/output control logic 710, a gate control logic 750, an inverter INV, and a voltage stabilizer 770. The input/output control logic 710 receives a clock signal CLK and an enable signal ENB, and outputs a first control signal NG to the third transistor NM3. The gate control logic 750 receives a voltage PAD_R of the pad 720. In addition, the gate control logic 750 outputs a feedback voltage VFGB to a gate terminal of the first transistor NM1. The inverter INV inverts the enable signal ENB and outputs an inverted enable signal ENB_IN to the gate control logic 750. In addition, the gate control logic 750 receives a second control signal VSEL. Meanwhile, the pad 720 is connected to an external high voltage VDDH through an external resistor $R_O$. In addition, the output driving circuit 700 may further include an ESD block 740 including an ESD circuit with at least one internal resistor connected between the pad 720 and the gate control logic 750. The ESD block 740 may discharge an electrostatic applied from the pad. Further, the ESD block 740 may include an ESD control system including the ESD circuit. Configurations and operating methods of the ESD circuit and the ESD control system will be described later with reference to FIG. 36 to FIG. 44.

The output driving circuit 700 of FIG. 20 may be substantially the same as the output driving circuit 500 of FIG. 14, except that the output driving circuit 700 further includes the voltage stabilizer 770. Meanwhile, a difference between the output driving circuit 700 of FIG. 20 and the output driving circuit 600 of FIG. 18 is that the gate control logic 750 additionally receives the second control signal VSEL. Therefore, the gate control logic 750 of FIG. 20 may be implemented as one of the gate control logics 550a and 550b of FIG. 15 or 16. The voltage stabilizer 770 is connected to the pad 720 to receive a voltage applied to the pad 720, and outputs a stabilization voltage VSTB to the gate terminal of the second transistor NM2. The voltage stabilizer 770 of FIG. 20 may be substantially the same as the voltage stabilizer 670 of FIG. 18. Therefore, the voltage stabilizer 770 of FIG. 20 may be implemented as any one of the voltage stabilizers 670a, 670b, 670c, and 670d respectively shown in FIGS. 19A, 19B, 19C, and 19D.

Figure 21:
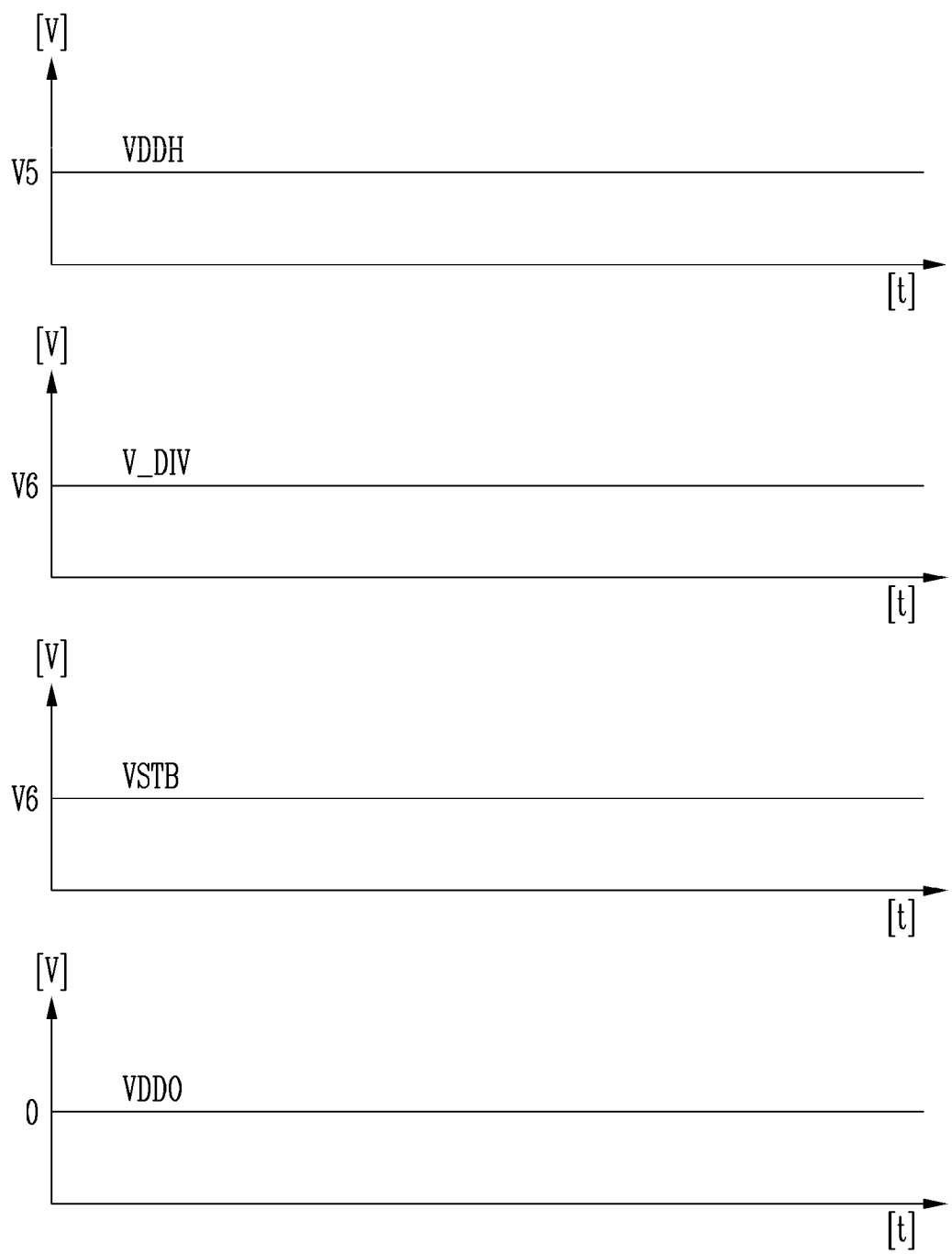
FIGS. 21 and 22 are operation waveform diagrams of the output driving circuit of FIG. 18 when an internal power voltage VDDO is 0V.
Figure 22:
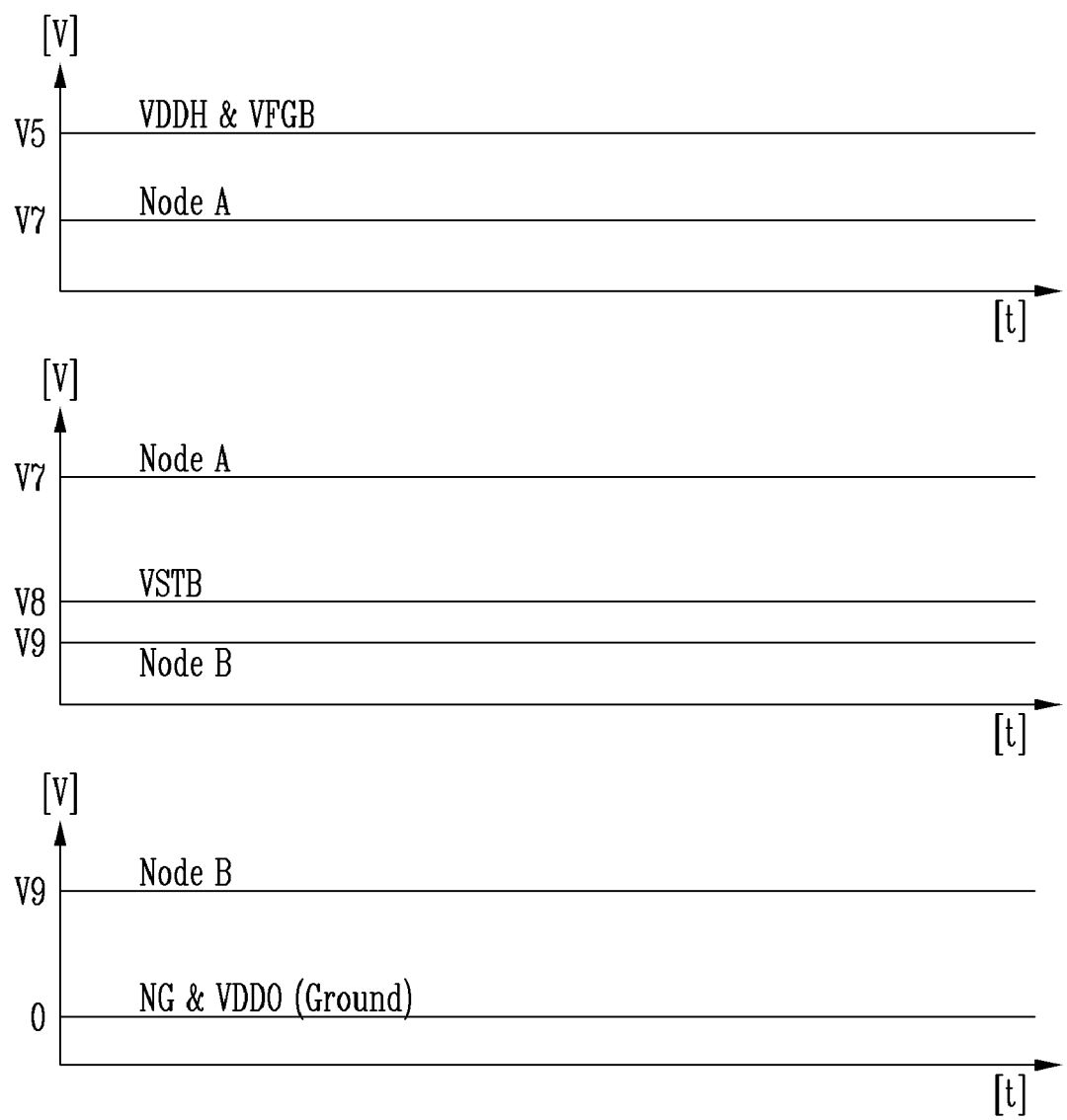

FIGS. 21 and 22 are operation waveform diagrams of the output driving circuit 600 of FIG. 18 when the internal power voltage VDDO is 0V. More specifically, FIGS. 21 and 22 show an operation waveform diagram when the output driving circuit 600 of FIG. 18 includes the voltage stabilizer 670d shown in FIG. 19D.

Referring to FIG. 21, an embodiment in which the external high voltage VDDH applied to the pad is a fifth level V5 is shown. In an embodiment, the fifth level V5 may be 3.3V. FIG. 21 also shows the division voltage V_DIV output to the first internal node Ni1 and the stabilization voltage VSTB output to the second internal node Ni2 when the external high voltage VDDH applied to the pad is 3.3V and the first power voltage VDDO is 0V. The division voltage V_DIV may have a value of a sixth level V6. For example, the sixth level V6 may be 1.65V, which is a half level of the external high voltage VDDH. In this case, the stabilization voltage VSTB may also be the sixth level V6 equal to the division voltage V_DIV, that is, 1.65V. Accordingly, in a case of the output driving circuit 600 according to an embodiment of the present disclosure, when the first power voltage VDDO is 0V and the external high voltage VDDH applied to the pad is a relatively high fifth level V5, for example, 3.3V, the reliability condition of the second transistor NM2 may be satisfied as will be described below in more detail with reference to FIG. 22.

Referring to FIG. 22, when the external high voltage VDDH applied to the pad is the fifth level V5 and the first power voltage VDDO is 0V, gate voltages, drain voltages, and source voltages of the first to third transistors NM1 to NM3 are shown respectively.

In a case of the first transistor NM1, in a first graph of FIG. 22, the drain voltage is the fifth level V5, which is the external high voltage VDDH applied to the pad, and the gate voltage is the feedback voltage VFGB applied from the gate control logic 650. In this case, the feedback voltage VFGB also has a value of the fifth level V5. The source voltage of the first transistor NM1 is the voltage of the node A Node A, and has a value of a seventh level V7 slightly decreased than the drain voltage. In an embodiment, the external high voltage VDDH, the fifth level V5, which is the external high voltage VDDH, may be 3.3V, and thus the feedback voltage VFGB may also be 3.3V. In this case, the seventh level V7, which is the source voltage of the first transistor NM1, may be about 3.16V, slightly decreased than 3.3V.

Meanwhile, in a case of the second transistor NM2, in a second graph of FIG. 22, the drain voltage may have a value of the seventh level V7, which is the voltage of the node A Node A, and the gate voltage may have an eighth level V8 as the stabilization voltage VSTB applied from the voltage stabilizer 670. When the fifth level V5 which is the external high voltage VDDH is 3.3V, as described above, the seventh level V7 may be 3.16V. In addition, as described above with reference to FIG. 21, the stabilization voltage VSTB may be 1.65V. Meanwhile, the source voltage of the second transistor NM2 may be the voltage of the node B Node B, and may be about a ninth level V9 slightly decreased than the gate voltage. In an embodiment, the ninth level V9 may be 1.53V.

Finally, referring to a last graph of FIG. 22, the drain voltage of the third transistor NM3 may have a value of the ninth level V9 which is the voltage of the node B Node B. In addition, the gate of the third transistor NM3 receives the first control signal NG from the input/output control logic 610. However, since the first power voltage VDDO driving the input/output control logic 510 is 0V, the first control signal NG may also be 0V. Accordingly, in a case of the third transistor NM3, the drain voltage is the ninth level V9, for example, 1.53V, and the gate voltage and the source voltage are 0V.

Referring to FIGS. 21 and 22, when the external high voltage VDDH applied to the pad is 3.3V and the first power voltage VDDO is 0V, all of gate-drain voltages $V_{GD}$, gate-source voltages $V_{GS}$, and drain-source voltages $V_{DS}$ of the first to third transistors NM1 to NM3 may be less than a given value (e.g., 1.98V) for ensuring the reliability of the first to third transistors NMa to NM3. Accordingly, reliability conditions of the first to third transistors NM1 to NM3 are satisfied.

Figure 23:
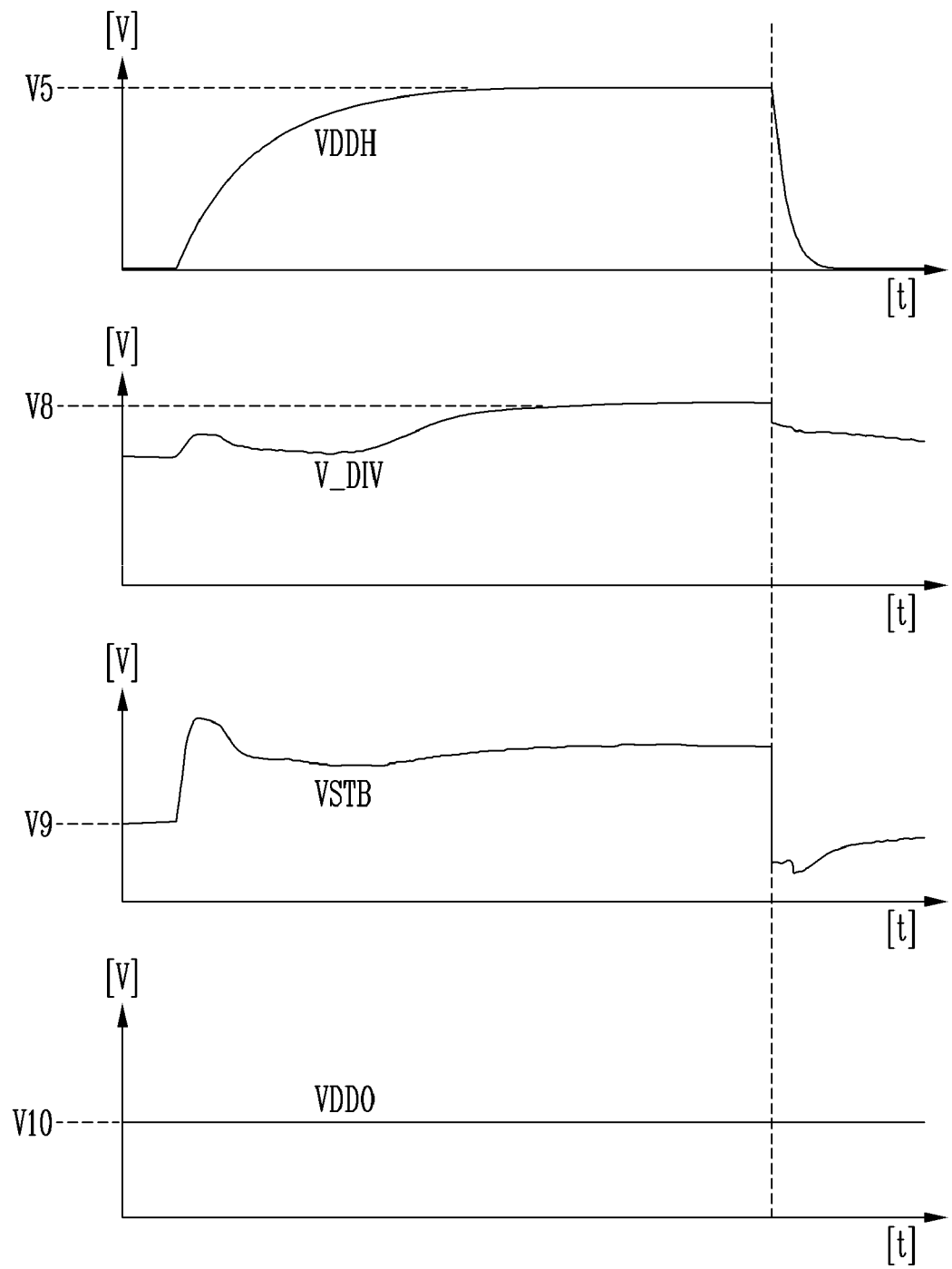
FIGS. 23 and 24 are operation waveform diagrams of the output driving circuit of FIG. 18 when the internal power voltage VDDO is a tenth level V10.
Figure 24:
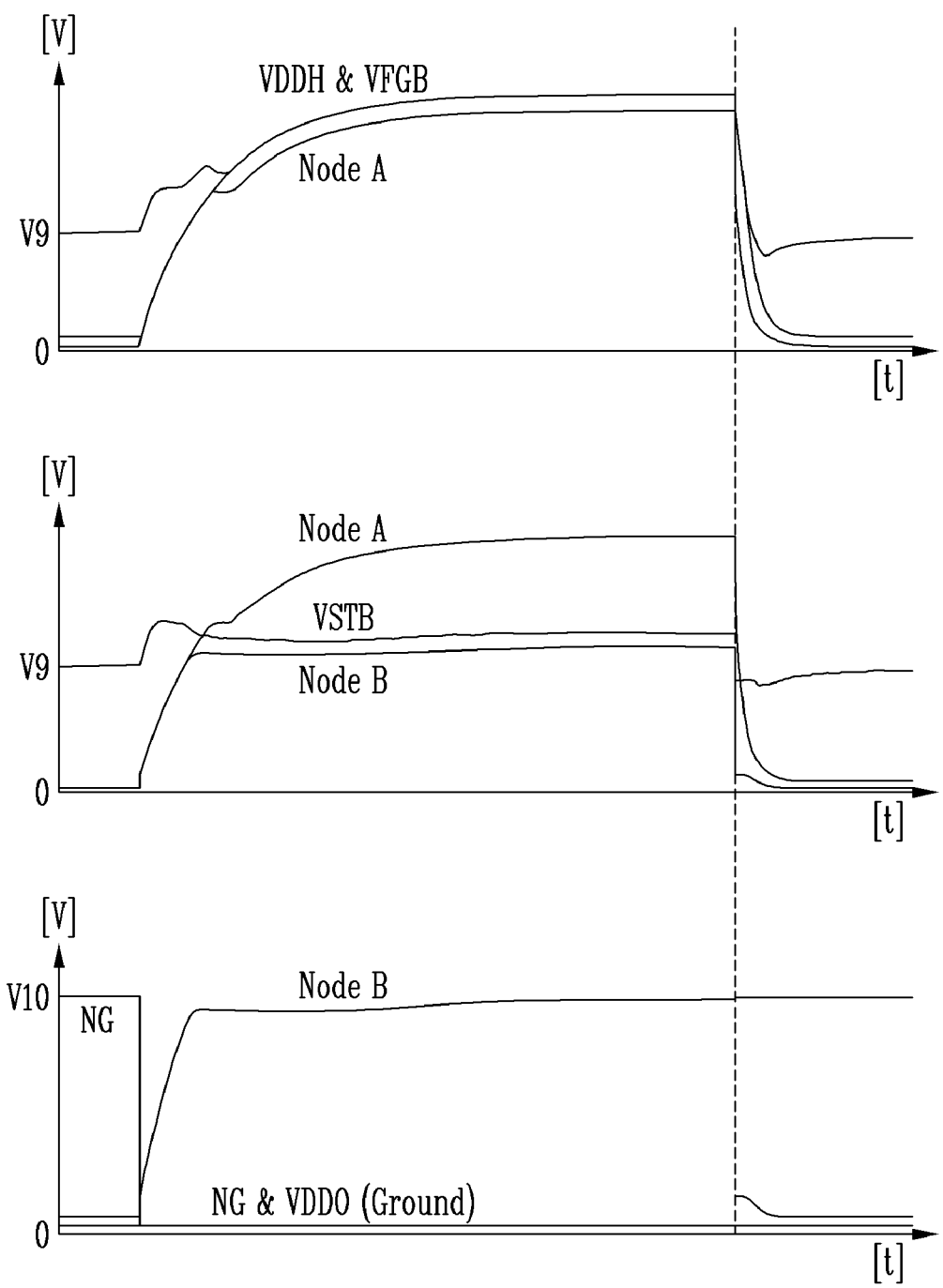

FIGS. 23 and 24 are operation waveform diagrams of the output driving circuit 600 of FIG. 18 when the internal power voltage VDDO is a tenth level V10. In an embodiment, the internal power voltage VDDO may be 1.8V. Referring to FIG. 23, the external high voltage VDDH applied to the pad in a state in which the internal power voltage VDDO is the tenth level V10, for example, 1.8V, increases from 0V to the fifth level V5, for example, 3.3V. Accordingly, the division voltage V_DIV output to the first internal node Ni1 may increase to reach the eighth level V8, that is, about 1.65V level, and the stabilization voltage VSTB may increase from the ninth level V9 (e.g., about 1.6V) and then settles to about 1.94V level. Accordingly, all of the gate-drain voltages $V_{GD}$, the gate-source voltages $V_{GS}$, and the drain-source voltages $V_{DS}$ of the first to third transistors NM1 to NM3 may be less than 1.98V as will be described below in more detail with reference to FIG. 24.

Referring to FIG. 24, gate voltages, drain voltages, and source voltages of the first to third transistors NM1 to NM3 are shown respectively, when the internal power voltage VDDO is the tenth level V10 and the external high voltage VDDH increases from 0V to the fifth level V5. For example, the tenth level V10 may be 1.8V, and the fifth level V5 may be 3.3V. As shown in FIG. 24, when the internal power voltage VDDO is 1.8V and the external high voltage VDDH increases from 0V to 3.3V, all of the gate-drain voltages $V_{GD}$, the gate-source voltages $V_{GS}$, and the drain-source voltages $V_{DS}$ of the first to third transistors NM1 to NM3 may change within a range less than 1.98V. Accordingly, the reliability conditions of the first to third transistors NM1 to NM3 are satisfied.

Figure 25:
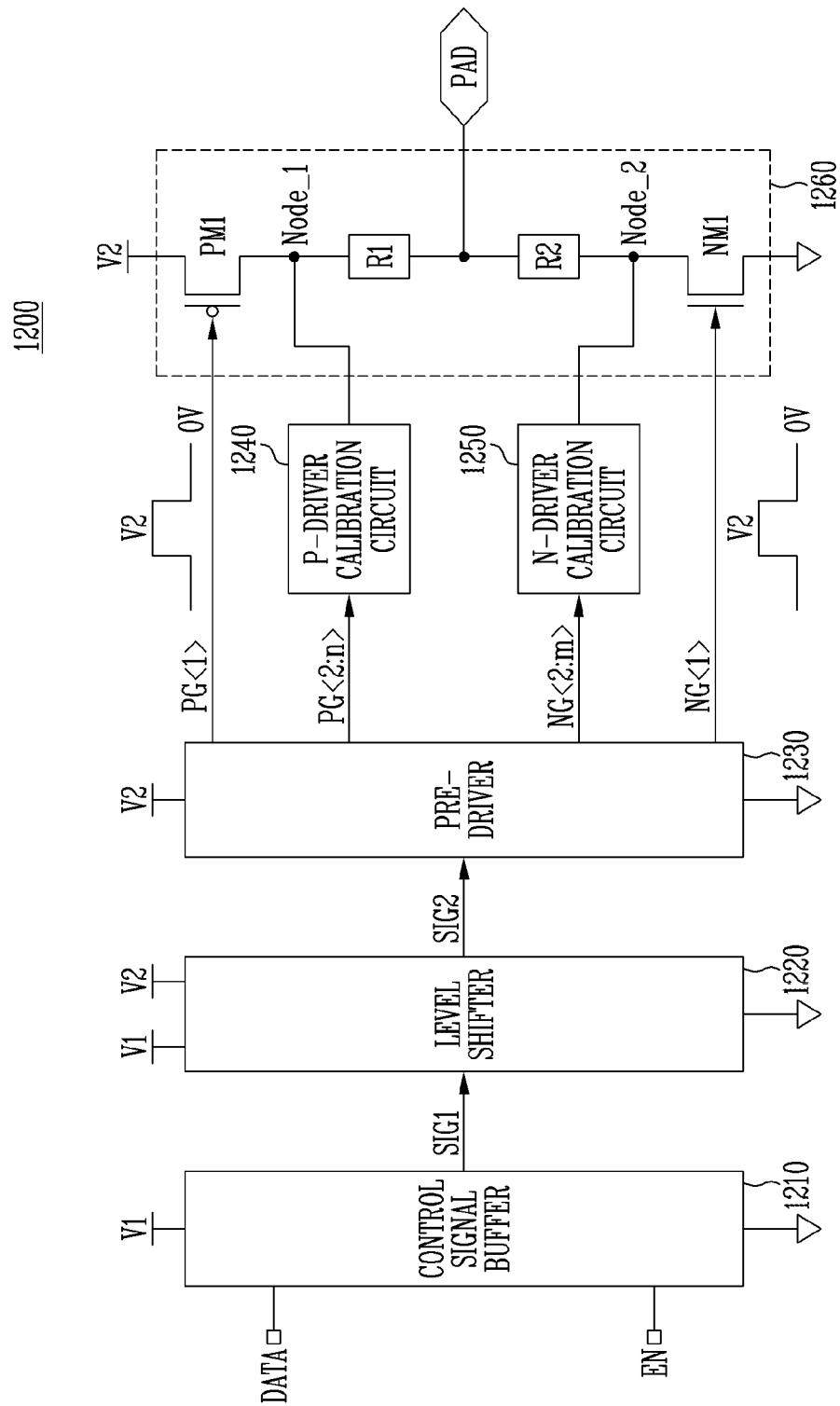
FIG. 25 is a circuit diagram illustrating an output driving circuit according to an embodiment of the present disclosure.

FIG. 25 is a circuit diagram illustrating an output driving circuit 1200 according to an embodiment of the present disclosure.

Referring to FIG. 25, the output driving circuit 1200 includes a control signal buffer 1210, a level shifter 1220, a pre-driver 1230, a first driver calibration circuit (e.g., a P-driver calibration circuit) 1240, a second driver calibration circuit (e.g., an N-driver calibration circuit 1250), and a driver (e.g., a pull-up-pull-down driver) 1260. The pull-up-pull-down driver 1260 includes a PMOS transistor PM1, an NMOS transistor NM1, a first resistor R1, and a second resistor R2. The control signal buffer 1210 receives a data signal DATA and an enable signal EN, and outputs a first signal SIG1. The control signal buffer 1210 may be operated by a first power voltage V1. Therefore, the first signal SIG1 may be a signal having a voltage range between 0V and the first power voltage V1. In an embodiment, the first power voltage V1 may be a voltage having any value in a range of 0.8V to 1V.

The level shifter 1220 receives the first signal SIG1 and level-shifts the first signal SIG1 to generate a second signal SIG2. The level shifter 1220 may be operated by the first power voltage V1 and a second power voltage V2. The second power voltage V2 may be an external voltage having a value greater than the first power voltage V1. The first power voltage V1 may be an internal voltage. Therefore, the second signal SIG2 may be a signal having a voltage range between 0V and the second power voltage V2. In an embodiment, the second power voltage V2 may be a voltage having any value in a range of 1.2V to 1.8V.

The pre-driver 1230 outputs a plurality of PMOS gate signals PG<1:n> and a plurality of NMOS gate signals NG<1:m> based on the second signal SIG2. A first PMOS gate signal PG<1> among the PMOS gate signals PG<1:n> is applied to the PMOS transistor PM1. Second to n-th PMOS gate signals PG<2:n> among the PMOS gate signals PG<1:n> are applied to the P-driver calibration circuit 1240. A first NMOS gate signal NG<1> among the NMOS gate signals NG<1:n> is applied to the NMOS transistor NM1. Second to n-th NMOS gate signals NG<2:n> among the NMOS gate signals NG<1:n> are applied to the N-driver calibration circuit 1250. That is, the pre-driver 1230 may output the PMOS gate signals PG<1:n> and the NMOS gate signals NG<1:m> of a code form.

The P-driver calibration circuit 1240 may be a circuit for calibrating an impedance of a first node NODE_1. An embodiment of the P-driver calibration circuit 1240 is described later with reference to FIG. 26A. Meanwhile, the N-driver calibration circuit 1250 may be a circuit for calibrating an impedance of a second node NODE_2. An embodiment of the N-driver calibration circuit 1250 is described later with reference to FIG. 26B.

Meanwhile, the pre-driver 1230 may operate by the second power voltage V2. Therefore, the PMOS gate signals PG<1:n> and the NMOS gate signals NG<1:m> may be signals each having a voltage range between 0V and the second power voltage V2. In particular, as shown in FIG. 25, the first PMOS gate signal PG<1> applied to the PMOS transistor PM1 and the first NMOS gate signal NG<1> applied to the NMOS transistor NM1 may be signals having a voltage range between 0V and the second power voltage V2. Therefore, in the output driving circuit 1200 shown in FIG. 25, the PMOS transistor PM1 and the NMOS transistor NM1 connected through a pad and the first and second resistors R1 and R2 may not be implemented as a thin gate oxide device satisfying the condition of [Tables 1 or 2]. Instead, the PMOS transistor PM1 and the NMOS transistor NM1 shown in the output driving circuit 1200 of FIG. 25 may be implemented as a medium gate oxide device or a thick gate oxide device.

Figure 26A:
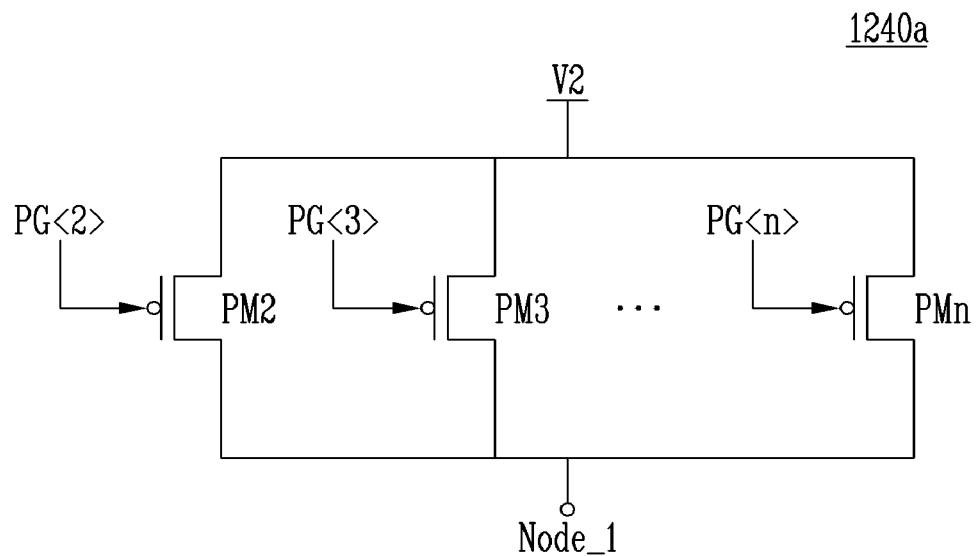
FIG. 26A is a circuit diagram illustrating a P-driver calibration circuit according to an embodiment of the present disclosure.

FIG. 26A is a circuit diagram illustrating a P-driver calibration circuit 1240a suitable for use as the P-driver calibration circuit 1240 of FIG. 25, according to an embodiment of the present disclosure.

Referring to FIG. 26A, the P-driver calibration circuit includes second to n-th PMOS transistors PM2 to PMn. The second to n-th PMOS transistors PM2 to PMn may be connected in parallel between the second power voltage V2 and the first node NODE_1. Meanwhile, the second to n-th PMOS gate signals PG<2:n> may be applied to gate terminals of the second to n-th PMOS transistors PM2 to PMn. Accordingly, the impedance of the first node NODE_1 may be calibrated by the second to n-th PMOS gate signals PG<2:n> output in the code form.

Figure 26B:
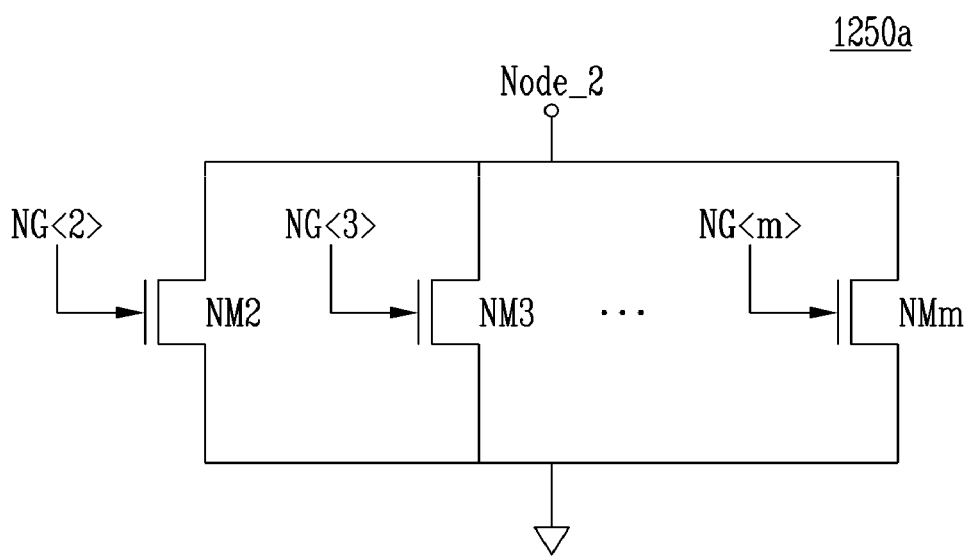
FIG. 26B is a circuit diagram illustrating an N-driver calibration circuit according to an embodiment of the present disclosure.

FIG. 26B is a circuit diagram illustrating an N-driver calibration circuit 1250a suitable for use as the N-driver calibration circuit 1250 of FIG. 25, according to an embodiment of the present disclosure. Referring to FIG. 26B, the N-driver calibration circuit includes second to m-th NMOS transistors NM2 to NMm. The second to m-th NMOS transistors NM2 to NMm may be connected in parallel between the second node NODE_2 and a ground. Meanwhile, the second to m-NMOS gate signals NG<2:m> may be applied to gate terminals of the second to m-th NMOS transistors NM2 to NMm. Accordingly, the impedance of the second node NODE_2 may be calibrated by the second to m-th NMOS gate signals NG<2:m> output in the code form.

Figure 27:
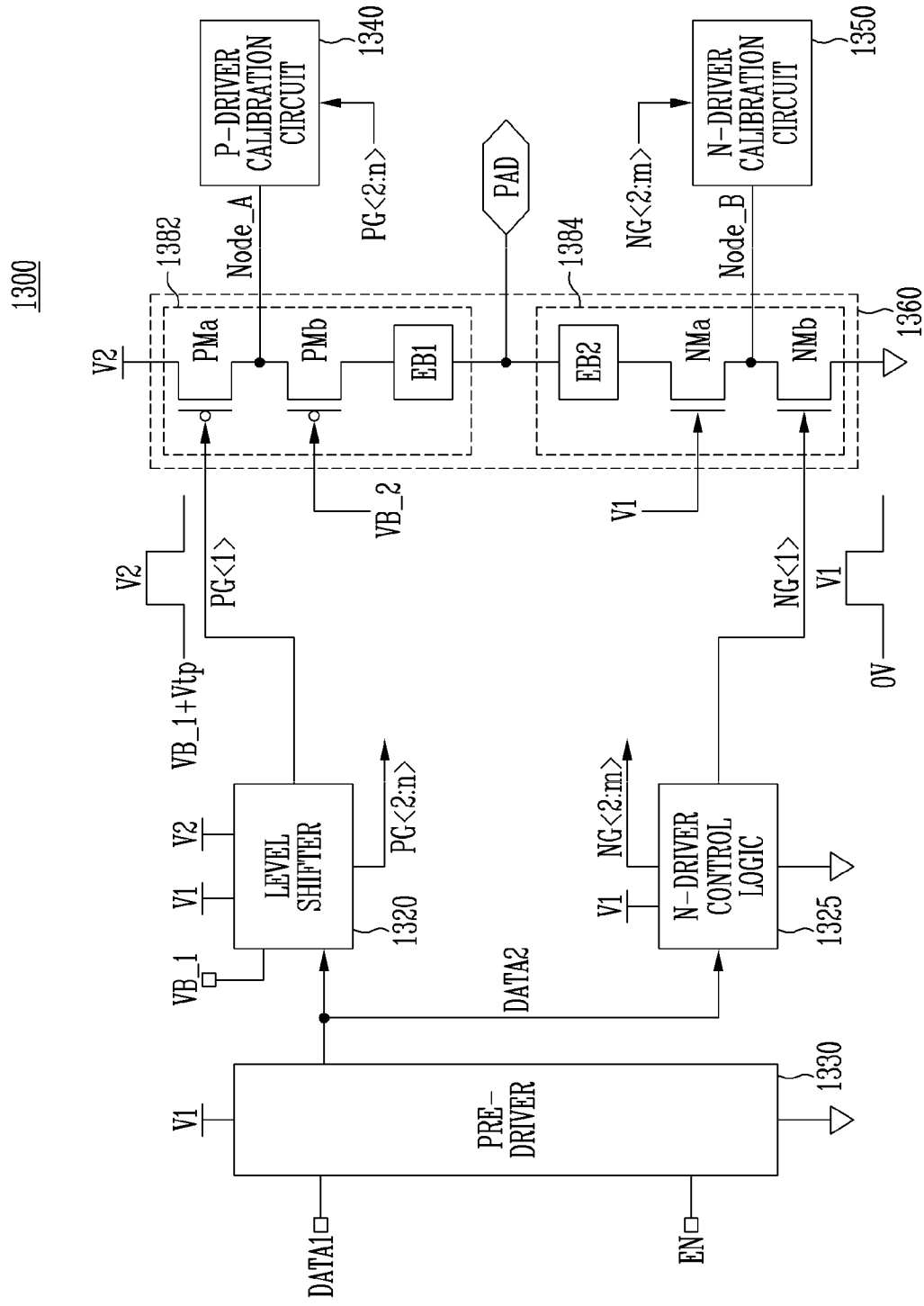
FIG. 27 is a block diagram illustrating an output driving circuit 1300 according to another embodiment of the present disclosure.

FIG. 27 is a block diagram illustrating an output driving circuit 1300 according to another embodiment of the present disclosure.

Referring to FIG. 27, the output driving circuit 1300 may include a pre-driver 1330, a level shifter 1320, a driver control logic (e.g., an N-driver control logic) 1325, a first driver calibration circuit (e.g., a P-driver calibration circuit) 1340, a second driver calibration circuit (e.g., an N-driver calibration circuit) 1350, and a pull-up-pull-down driver (or a pull-up-down driver) 1360. The pull-up-pull-down driver 1360 includes a first PMOS transistor PMa, a second PMOS transistor PMb, a first NMOS transistor Nma, a second NMOS transistor NMb, a first ESD block EB1, and a second ESD block EB2. For example, the pull-up-pull-down driver 1360 include a pull-up driver 1382 and a pull-down driver 1384, such that the pull-up driver 1382 includes the first PMOS transistor PMa, the second PMOS transistor PMb, and the first ESD block EB1, and the pull-down driver 1384 includes the first NMOS transistor Nma, the second NMOS transistor NMb, and the second ESD block EB2. The P-driver calibration circuit 1340 is connected to a node NODE_A of the pull-up-pull-down driver 1360. The N-driver calibration circuit 1350 is connected to a node NODE_B of the pull-up-pull-down driver 1360.

In FIG. 27, the P-driver calibration circuit 1340 and the N-driver calibration circuit 1350 may be substantially the same as the P-driver calibration circuit 1240a and the N-driver calibration circuit 1250a shown in FIGS. 26A and 26B, respectively. Therefore, repetitive description of the P-driver calibration circuit 1340 and the N-driver calibration circuit 1350 is omitted.

In a case of the output driving circuit 1200 shown in FIG. 25, the level shifter 1220 and the pre-driver 1230 may operate by the second power voltage V2. On the other hand, in a structure of the output driving circuit 1300 shown in FIG. 27, most of circuits except for the level shifter 1320 driving the first PMOS transistor PMa may operate by the relatively low first power voltage V1. Therefore, in a case of the output driving circuit 1300 shown in FIG. 27, power consumption may be reduced compared to the output driving circuit 1200 shown in FIG. 25.

The pre-driver 1330 may receive a first data signal DATA1 and the enable signal EN, and output a second data signal DATA2. The pre-driver 1330 may operate by the first power voltage V1. Therefore, the second data signal DATA2 may be a signal having a voltage range between 0V and the first power voltage V1. In an embodiment, the first power voltage V1 may be a voltage having a value in a range of 0.8V to 1V. The second data signal DATA2 may be a signal indicating data substantially the same as the first data signal DATA1. However, the second data signal DATA2 may be a signal of which a voltage range is determined by the first power voltage V1.

The level shifter 1320 operates based on the first and second power voltages V1 and V2, and receives the second data signal DATA2. The level shifter 1320 outputs a first control signal (e.g., the first PMOS gate signal) PG<1> based on a first bias voltage VB_1. In an embodiment, the level shifter 1320 may output the first PMOS gate signal PG<1> having a value sufficient to keep a voltage difference between a control terminal (e.g., a gate terminal) and a first end terminal (e.g., a source terminal) of the first PMOS transistor PMa, a voltage difference between the control terminal and a second end terminal (e.g., a drain terminal) of the first PMOS transistor PMa, and a voltage difference between the second end terminal and the first end terminal of the first PMOS transistor PMa equal to or less than a given value (e.g., 1.06V in Table 1). For example, the level shifter 1320 according to an embodiment of the present disclosure may output the first PMOS gate signal PG<1> having a voltage range of a voltage (VB_1+Vtp) to the second power voltage V2. Therefore, the gate-source voltage VGS, the gate-drain voltage VGD, and the drain-source voltage VDS of the first PMOS transistor PMa satisfy the reliability condition described by [Tables 1 or 2]. The voltage Vtp may be a threshold voltage value of a PMOS transistor included in the level shifter 1320.

Meanwhile, the level shifter 1320 outputs the second to n-th PMOS gate signals PG<2:n> based on the first bias voltage VB_1. Similar to the first PMOS gate signal PG<1>, the level shifter 1320 may output the second to n-th PMOS gate signals PG<2:n> each having a voltage range of (VB_1+Vtp) to V2. The level shifter 1320 may generate the second to n-th PMOS gate signals PG<2:n> as a calibration control signal for controlling the P-driver calibration circuit 1340.

An embodiment of the level shifter 1320 of FIG. 27 is described later with reference to FIG. 28.

Meanwhile, the N-driver control logic 1325 operates based on the first power voltage V1 and receives the second data signal DATA2. The N-driver control logic 1325 outputs a second control signal (e.g., the first NMOS gate signal) NG<1> based on the first power voltage V1. In an embodiment, the N-driver control logic 1325 may output the first NMOS gate signal NG<1> having a value sufficient to keep a voltage difference between a control terminal (e.g., a gate terminal) and a first end terminal (e.g., a source terminal) of the second NMOS transistor NMb, a voltage difference between the control terminal and a second end terminal (e.g., a drain terminal) of the second NMOS transistor NMb, and a voltage difference between the second end terminal and the first end terminal of the second NMOS transistor NMb equal to or less than a given value (e.g., 1.98V or 1.06V in Tables 1 or 2). For example, the N-driver control logic 1325 according to an embodiment of the present disclosure may output the first NMOS gate signal NG<1> having a voltage range of 0V to the first power voltage V1. Therefore, the gate-source voltage VGS, the gate-drain voltage VGD, and the drain-source voltage VDS of the second NMOS transistor NMb satisfy the reliability condition described by [Tables 1 or 2]. For example, the gate-source voltage VGS of the second NMOS transistor NMB is kept equal to or less than the first power voltage V1, which is less than 1.06V. The N-driver control logic 1325 according to an embodiment of the present disclosure may further generate the second to m-th NMOS gate signals NG<2:m> as a calibration control signal for controlling the N-driver calibration circuit 1350.

A second bias voltage VB_2 is applied to a gate terminal of the second PMOS transistor PMb of the pull-up-pull-down driver 1360. In addition, the first power voltage V1 is applied to a gate terminal of the first NMOS transistor NMa of the pull-up-pull-down driver 1360.

The first bias voltage VB_1 and the second bias voltage VB_2 may have voltage values selected to satisfy the reliability condition of the thin gate oxide elements included in the output driving circuit 1300. According to an embodiment, the first bias voltage VB_1 and the second bias voltage VB_2 may be input from the outside of the output driving circuit 1300. In another embodiment, the first bias voltage VB_1 and the second bias voltage VB_2 may be generated internally in the output driving circuit 1300. In this case, the first bias voltage VB_1 and the second bias voltage VB_2 may be generated internally by regulating the first power voltage V1 or the second power voltage V2. In this case, the output driving circuit 1300 may further include a regulating circuit for generating the first bias voltage VB_1 or the second bias voltage VB_2.

At least one of the first and second ESD blocks EB1, EB2 may include an ESD circuit with an internal resistor for discharging electrostatic electricity applied from the pad. Further, the internal resistor may stabilize the pad voltage. Alternately, at least one of the first and second ESD blocks EB1, EB2 may include an ESD control system including the ESD circuit. Configurations and operating methods of the ESD circuit and the ESD control system including the same will be described later with reference to FIG. 36 to FIG. 44.

Figure 28:
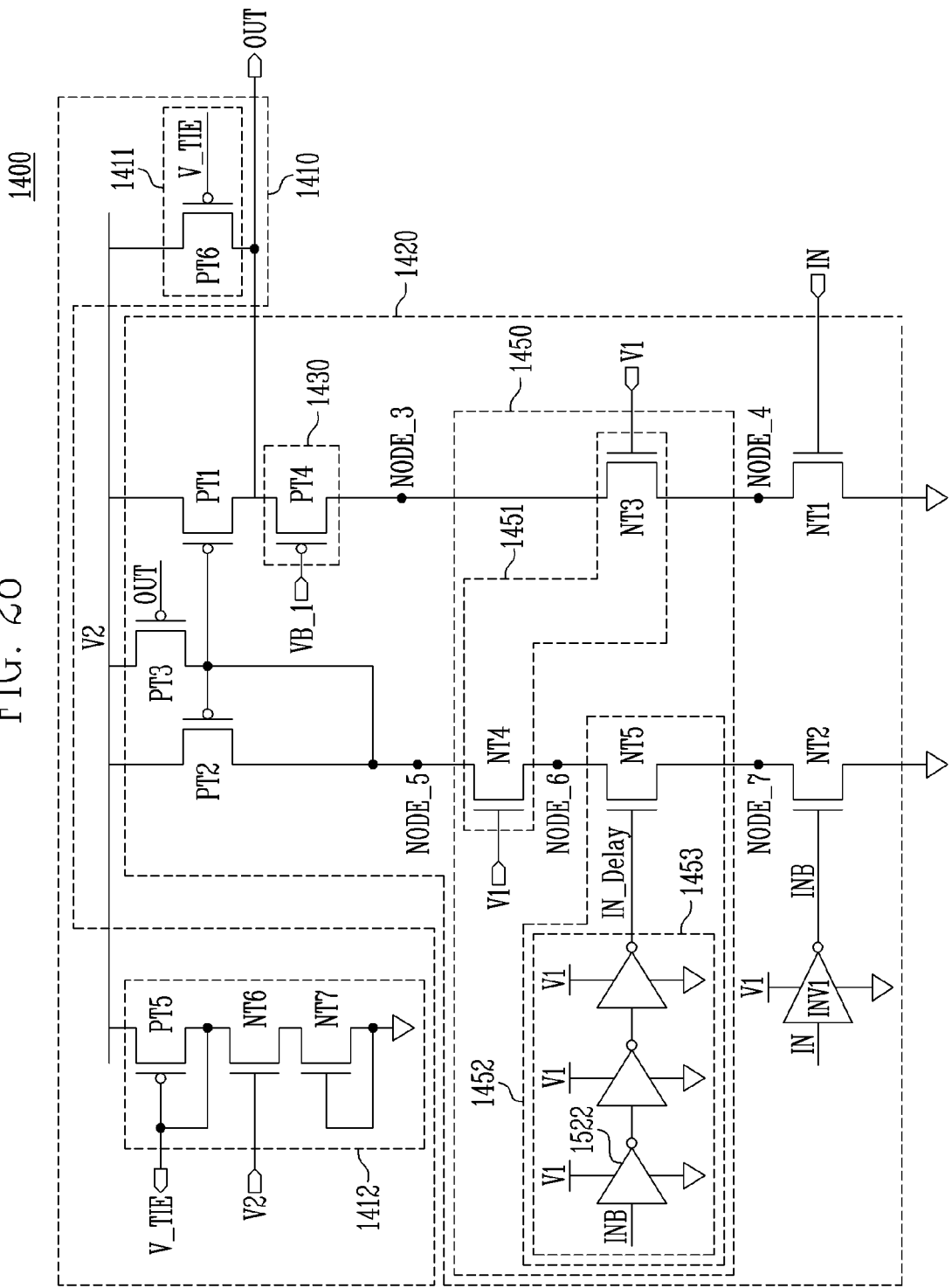
FIG. 28 is a diagram illustrating a configuration of a level shifter shown in FIG. 27 according to an embodiment of the present disclosure.

FIG. 28 is a diagram illustrating a configuration of a level shifter 1400 suitable for use as the level shifter 1320 shown in FIG. 27.

Referring to FIG. 28, the level shifter 1400 may include a current mirror 1420, a first adjustment circuit 1430, and a second adjustment circuit 1410.

The level shifter 1400 according to an embodiment of the present disclosure may further include a third adjustment circuit 1450.

Since elements (e.g., transistors) configuring the level shifter 1400 use an operation voltage lower than the existing operation voltage, each of these elements may be designed as a thin gate oxide element. Therefore, an output driving circuit (e.g., the output driving circuit 1300 in FIG. 27) including the level shifter 1400 according to an embodiment of the present disclosure may operate at a high speed, and power consumption may be reduced compared to the output driving circuit 1200 shown in FIG. 25.

The current mirror 1420 may receive an input signal IN according to the first power voltage V1 and mirror a current corresponding to the second power voltage V2 according to a level of the input signal IN to generate an output signal OUT. The input signal IN may be the second data signal DATA2 shown in FIG. 27. In addition, the output signal OUT may be the first PMOS gate signal PG<1> shown in FIG. 27.

The second power voltage V2 may have a level higher than that of the first power voltage V1.

The current mirror 1420 may include an inverter INV1 and a plurality of switching elements NT1, NT2, PT1, PT2, and PT3. The plurality of switching elements NT1, NT2, PT1, PT2, and PT3 may be implemented as transistors.

A first current path of the current mirror 1420 may be formed by a plurality of switching elements PT1, PT4, NT3, and NT1.

A second current path of the current mirror 1420 may be formed by a plurality of switching elements PT2, NT4, NT5, and NT2.

The first adjustment circuit 1430 may be connected to a terminal of the output voltage OUT of the current mirror 1420 and may be configured to adjust a voltage level of the terminal of the output voltage OUT according to the first bias voltage VB_1.

The first adjustment circuit 1430 may include the switching element PT4.

The second adjustment circuit 1410 may be connected to a terminal of the second power voltage V2 in parallel with the current mirror 1420 and may be configured to adjust the voltage level of the terminal of the output voltage OUT of the current mirror 1420.

The second adjustment circuit 1410 may include an output voltage compensator 1411 and a compensation voltage generator 1412.

The output voltage compensator 1411 may prevent the voltage level of the terminal of the output voltage OUT from being lower than the voltage level increased by the first adjustment circuit 1430 according to a compensation voltage V_TIE.

The compensation voltage generator 1412 may be connected to the terminal of the second power voltage V2 in parallel with the current mirror 1420 to generate the compensation voltage V_TIE.

The second adjustment circuit 1410 may include a plurality of switching elements PT5, PT6, NT6, and NT7.

The third adjustment circuit 1450 may be connected to the first current path and the second current path of the current mirror 1420, and may be configured to adjust a voltage level of the first current path and the second current path and block a leakage current.

The third adjustment circuit 1450 may include a first adjuster 1451 and a second adjuster 1452.

The first adjuster 1451 may adjust the voltage level of the first current path and the second current path of the current mirror 1420 according to the first power voltage V1.

The second adjuster 1452 may block the leakage current of the second current path of the current mirror 1420 according to the input signal IN. The second adjuster 1452 may include a delay circuit 453.

The third adjustment circuit 1450 may include the delay circuit 453 and a plurality of switching elements NT3, NT4, and NT5.

For example, assuming that the first power voltage V1 is 0.8V and the second power voltage V2 is 1.2 V, in order to secure the reliability of all elements configuring the level shifter 1400, node voltage differences Vds, Vgs, and Vg are required to remain, for example, 1.06V or less, in any operation condition.

Therefore, the level shifter 1400 according to the embodiment shown in FIG. 28 is designed to satisfy the above-described node voltage difference condition using the first adjustment circuit 1430 and the second adjustment circuit 1410, and additionally, the third adjustment circuit 1450 of the level shifter 1400 is configured to improve stability and a leakage current prevention function.

The first switching element NT1 may include one end connected to a ground terminal, another end connected to a node NODE_4, and a control end receiving the input signal IN.

At this time, one end of the plurality of switching elements NT1, NT2, PT1, PT2, and PT3 may be a source or a drain, another end may be a drain or a source, and a control end may be a gate.

The inverter INV1 may invert the input signal IN to generate an inverted input signal INB.

The second switching element NT2 may include one end connected to the ground terminal, another end connected to a node NODE_7, and a control end receiving the inverted input signal INB.

The third switching element PT1 may include one end connected to the terminal of the second power voltage V2 and another end connected to the terminal of the output voltage OUT.

The fourth switching element PT2 may include one end connected to the terminal of the second power voltage V2 and another end connected to a node NODE_5.

The fifth switching element PT4 may include one end connected to the terminal of the output voltage OUT, another end connected to a node NODE_3, and a control end receiving the first bias voltage VB_1.

The first bias voltage VB_1 may be, for example, 0.12V.

Since the fifth switching element PT4 receives the first bias voltage VB_1 through the control end, for example, the gate, in an AC operation, the output voltage OUT may have a variation range corresponding to VB_1+Vth_PT4 to V2, and in a DC operation, the output voltage OUT may be fixed to VB_1+Vth_PT4 or V2, Vth_PT4 denoting a threshold voltage of the fifth switching element PT4. Therefore, the above-described node voltage difference condition may be satisfied. The voltage Vtp shown in FIG. 27 may be a threshold voltage Vth_PT4 of the switching element PT4. That is, the first PMOS gate signal PG<1> shown in FIG. 27 has the variation range corresponding to VB_1+Vth_PT4 to V2.

The sixth switching element PT6 may include one end connected to the terminal of the second power voltage V2, another end connected to the terminal of the output voltage OUT, and a control end receiving the compensation voltage V_TIE.

The seventh to ninth switching elements PT5, NT6, and NT7 may be connected between the terminal of the second power voltage V2 and the ground terminal, and may generate the compensation voltage V_TIE according to the second power voltage V2.

Current mirroring of the sixth switching element PT6 may be performed according to the compensation voltage V_TIE generated by the seventh to ninth switching elements PT5, NT6, and NT7, and a current according thereto may be supplied to the terminal of the output voltage OUT.

Since the sixth switching element PT6 continuously supplies the current to the terminal of the output voltage OUT, the output voltage OUT may be prevented from being lower than VB_1+Vth_PT4 even though the input signal IN of a high level is input to the control end of the first switching element NT1.

The sixth switching element PT6 prevents the output voltage OUT from being lower than VB_1+Vth_PT4, and thus operation reliability of the third switching element PT1 may be secured.

The tenth switching element NT3 includes one end connected to the node NODE_3, another end connected to the node NODE_4, and a control end receiving the first power voltage V1.

Since the tenth switching element NT3 receives the first power voltage V1 through the control end, operation reliability of the first switching element NT1 may be secured by lowering a voltage of the node NODE_4 by V1−Vth_NT3, Vth_NT3 denoting a threshold voltage of the tenth switching element NT3.

The eleventh switching element NT4 includes one end connected to the node NODE_5, another end connected to a node NODE_6, and a control end receiving the first power voltage V1.

The eleventh switching element NT4 may also operate in the same manner as the tenth switching element NT3 to secure an operation reliability of the twelfth switching element NT5, which is described later.

The delay circuit 453 may be implemented as an inverter array 453 including a plurality of inverters 522.

The inverter array 453 may delay and invert the inverted input signal INB to generate a delayed input signal IN_Delay.

The twelfth switching element NT5 includes one end connected to the node NODE_6, another end connected to the node NODE_7, and a control end receiving the delayed input signal IN_Delay.

The twelfth switching element NT5 may operate at a time difference from the second switching element NT2 according to the delayed input signal IN_Delay to minimize the leakage current by preventing a current path from being formed for more than a time required for a level transition of the terminal of the output voltage OUT. For example, the twelfth switching element NT5 may be turned on a given time interval after the second switching element NT2 has been turned on, the given time interval corresponding to the delay amount of the delay circuit 453.

FIG. 28 shows the configuration of the level shifter 1400 generating the output signal OUT corresponding to the first PMOS gate signal PG<1> in FIG. 27. However, embodiments of the present disclosure are not limited thereto. A level shifter according to an embodiment of the present disclosure may also generate the second to n-th PMOS gate signals PG<2:n> identically to the first PMOS gate signal PG<1>.

Figure 29:
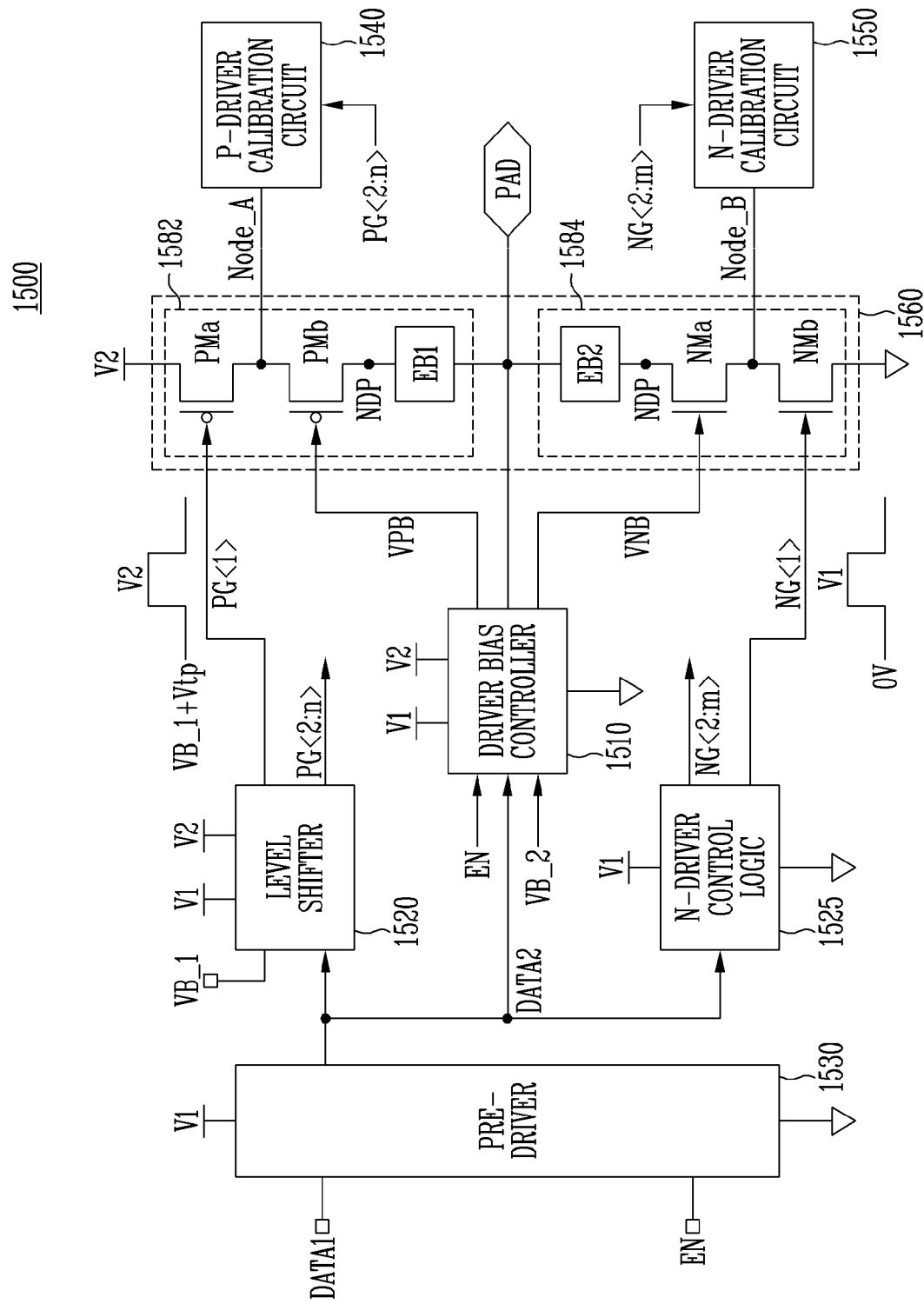
FIG. 29 is a block diagram illustrating an output driving circuit 1500 according to still another embodiment of the present disclosure.

FIG. 29 is a block diagram illustrating an output driving circuit 1500 according to still another embodiment of the present disclosure.

Referring to FIG. 29, the output driving circuit 1500 includes a pre-driver 1530, a level shifter 1520, a driver control logic (e.g., an N-driver control logic) 1525, a first driver calibration circuit (e.g., a P-driver calibration circuit) 1540, a second driver calibration circuit (e.g., an N-driver calibration circuit) 1550, a pull-up-pull-down driver (or a pull-up-down driver) 1560, and a driver bias controller 1510. The pull-up-down driver 1560 includes a first PMOS transistor PMa, a second PMOS transistor PMb, a first NMOS transistor Nma, a second NMOS transistor NMb, a first ESD block EB1, and a second ESD block EB2. For example, the pull-up-pull-down driver 1560 include a pull-up driver 1582 and a pull-down driver 1584, such that the pull-up driver 1582 includes the first PMOS transistor PMa, the second PMOS transistor PMb, and the first resistor Ra, and the pull-down driver 1584 includes the first NMOS transistor Nma, the second NMOS transistor NMb, and the second ESD block EB2. In FIG. 29, the pre-driver 1530, the level shifter 1520, the N-driver control logic 1525, the P-driver calibration circuit 1540, and the N-driver calibration circuit 1550 may be substantially the same as the pre-driver 1330, the level shifter 1320, the N-driver control logic 1325, the P-driver calibration circuit 1340, and the N-driver calibration circuit 1350 shown in FIG. 27, respectively. Therefore, repetitive description of the pre-driver 1530, the level shifter 1520, the N-driver control logic 1525, the P-driver calibration circuit 1540, and the N-driver calibration circuit 1550 is omitted.

The driver bias controller 1510 may operate based on the first and second power voltages V1 and V2. In addition, the driver bias controller 1510 may be connected to the pad and receive the enable signal EN, the second data signal DATA2, and the second bias voltage VB_2. The driver bias controller 1510 generates a first bias voltage (e.g., a P-bias voltage) VPB and a second bias voltage (e.g., an N-bias voltage) VNB that change according to a pad state, based on one or more of the received signals. The P-bias voltage VPB is applied to the second PMOS transistor PMb of the pull-up-pull-down driver 1560. The N-bias voltage VNB is applied to the first NMOS transistor NMa of the pull-up-pull-down driver 1560. The driver bias controller 1510 controls the P-bias voltage VPB to have a value between the second bias voltage VB_2 and the first power voltage V1, according to the state of the pad. As the P-bias voltage VPB has the value between the second bias voltage VB_2 and the first power voltage V1, when a voltage of the pad has a voltage value between 0V and the second power voltage V2, the reliability condition of the thin gate oxide device described through [Tables 1 or 2] is satisfied during an operation of the second PMOS transistor PMb.

As the output driving circuits are disclosed in U.S. patent application Ser. No. 17/713,158, filed Apr. 4, 2022, the entire disclosure of which is incorporated herein by reference.

In addition, the driver bias controller 1510 controls the N-bias voltage VNB to have a value between the first power voltage V1 and the second power voltage V2, according to the state of the pad. As the N-bias voltage VNB has the value between the first power voltage V1 and the second power voltage V2, when the voltage of the pad has a voltage value between 0V and the second power voltage V2, the reliability condition of the thin gate oxide device described through [Tables 1 or 2] is satisfied during an operation of the first NMOS transistor NMa.

An embodiment of the driver bias controller 1510 shown in FIG. 29 is described with reference to FIG. 30.

Figure 30:
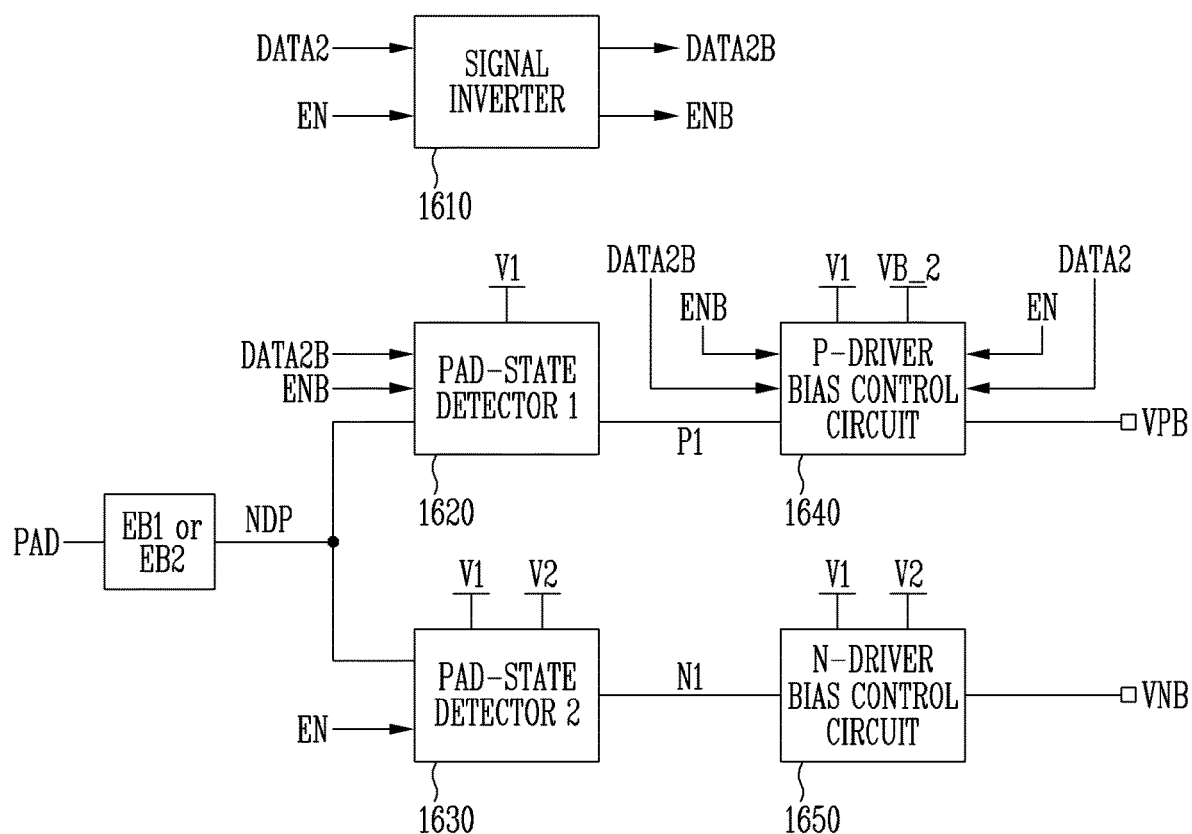
FIG. 30 is a block diagram illustrating a driver bias controller 1600 according to an embodiment of the present disclosure.

FIG. 30 is a block diagram illustrating a driver bias controller 1600 according to an embodiment of the present disclosure.

Referring to FIG. 30, the driver bias controller 1600 includes a signal inverter 1610, a first pad-state detector 1620, a second pad-state detector 1630, a P-driver bias control circuit 1640, an N-driver bias control circuit 1650, and an internal resistor RI. The internal resistor RI is connected to the pad. The P-driver bias control circuit 1640 and the N-driver bias control circuit 1650 are connected to the internal resistor RI.

The signal inverter 1610 may receive the second data signal DATA2 and the enable signal EN to generate a second inverted data signal DATA2B and an inverted enable signal ENB. An example configuration of the signal inverter 1610 is described later with reference to FIG. 31.

The first pad-state detector 1620 detects a voltage state of the pad having a voltage between 0V and the second power voltage V2. More specifically, the voltage of the pad may be changed from a low voltage to a high voltage or from a high voltage to a low voltage, in a range of 0V to the second power voltage V2. The first pad-state detector 1620 detects the voltage state of the pad, which is changed as described above, and outputs a detection result to a node P1. To this end, the first pad-state detector 1620 operates based on the first power voltage V1 and receives the second inverted data signal DATA2B and the inverted enable signal ENB. A detailed configuration of the first pad-state detector 1620 is described with reference to FIG. 32.

The P-driver bias control circuit 1640 is connected to the first pad-state detector 1620 through the node P1. The P-driver bias control circuit 1640 may operate based on the first power voltage V1 and the second bias voltage VB_2. In addition, the P-driver bias control circuit 1640 receives the second data signal DATA2, the enable signal EN, the second inverted data signal DATA2B, and the inverted enable signal ENB. The P-driver bias control circuit 1640 generates a P-bias voltage VPB according to the second inverted data signal DATA2B input based on the pad state detected by the first pad-state detector 1620. A detailed configuration of the P-driver bias control circuit 1640 is described with reference to FIG. 33.

The second pad-state detector 1630 detects the pad voltage PAD_R. For example, the pad voltage PAD_R may include a range between 0V and the second power voltage V2. More specifically, the voltage of the pad may be changed from a low voltage to a high voltage or from a high voltage to a low voltage in a range of 0V to the second power voltage V2. The second pad-state detector 1630 detects the voltage state of the pad, which is changed as described above, and outputs the detection result to a node N1. To this end, the second pad-state detector 1630 operates based on the first and second power voltages V1 and V2, and receives the enable signal EN. In addition, although not shown in FIG. 30, the second pad-state detector 1630 may receive the first PMOS gate signal PG<1> generated by the level shifter 1520. A detailed configuration of the second pad-state detector 1630 is described with reference to FIG. 34.

The N-driver bias control circuit 1650 is connected to the second pad-state detector 1630 through the node N1. The N-driver bias control circuit 1650 generates an N-bias voltage VNB according to the pad state detected by the second pad-state detector 1630. The N-driver bias control circuit 1650 may operate based on the first and second power voltages V1 and V2. A detailed configuration of the N-driver bias control circuit 1650 is described with reference to FIG. 35.

Figure 31:
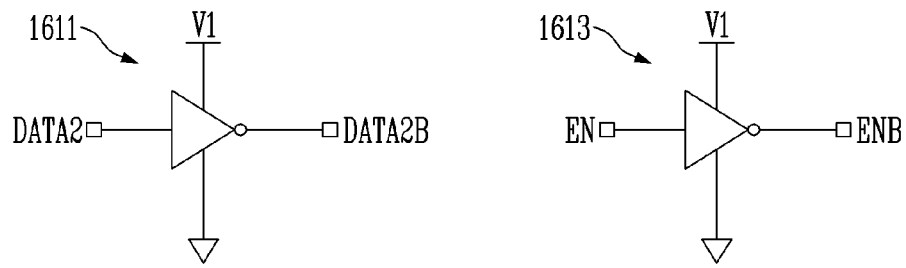
FIG. 31 is a diagram illustrating signal inverter 1610 of FIG. 30 according to an embodiment of the present disclosure.

FIG. 31 is a diagram illustrating a signal inverter 1610a suitable for use as the signal inverter 1610 of FIG. 30, according to an embodiment. Referring to FIG. 31, the signal inverter 1610a may include a plurality of inverters 1611 and 1613. The inverter 1611 operates based on the first power voltage V1, and inverts the second data signal DATA2 to output the second inverted data signal DATA2B. The inverter 1613 operates based on the first power voltage V1, and inverts the enable signal EN to output the inverted enable signal ENB. Since the plurality of inverters 1611 and 1613 operate based on the first power voltage V1, each of the second inverted data signal DATA2B and the inverted enable signal ENB may be signals having a voltage value between 0V and the first power voltage V1.

Figure 32:
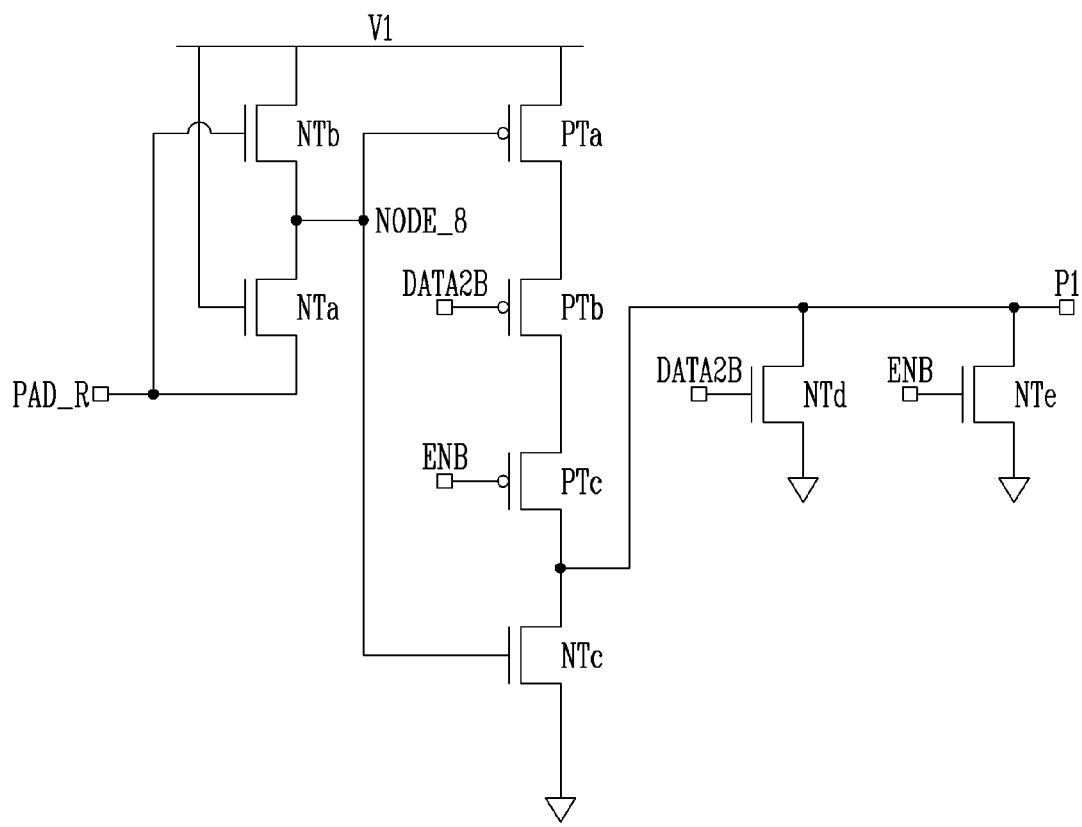
FIG. 32 is a diagram illustrating a first pad-state detector 1620 of FIG. 30 according to an embodiment of the present disclosure.

FIG. 32 is a diagram illustrating a first pad-state detector 1620a suitable for use as the first pad-state detector 1620 of FIG. 30, according to an embodiment.

Referring to FIG. 32, the first pad-state detector 1620 includes NMOS transistors NTa, NTb, NTc, NTd, and NTe and PMOS transistors PTa, PTb, and PTc. The NMOS transistors NTa and NTb are connected in series between the first power voltage V1 and a node NPD. The first pad-state detector 1620 is connected to the resistor RI of FIG. 30 through the node NPD. In an embodiment, a voltage of the node NPD may be the same as the voltage of the pad. A gate of the NMOS transistor NTa is connected to the first power voltage V1, and a gate of the NMOS transistor NTb is connected to the node NPD. The NMOS transistor NTb is included to block a leakage current. When there is no NMOS transistor NTb, a voltage of a node Node_8 has a level value of the first power voltage V1−a threshold voltage $VT_{NM1}$ of the NMOS transistor NTa. In this case, since a voltage of $V1-VT_{NM1}$ is supplied to a gate of the PMOS transistor PTa or a gate of the NMOS transistor NTc, not the first power voltage V1, a leakage current path may be generated. When the NMOS transistor NTb is connected between the first power voltage V1 and the node NODE_8, the first power voltage V1 is completely supplied to the node NODE_8 to prevent an occurrence of the leakage current. In other words, since the NMOS transistor NTb is connected between the first power voltage V1 and the node NODE_8 as shown in FIG. 32, the voltage of the node NODE_8 may have a level substantially equal to the first power voltage V1, rather than $V1-VT_{NM1}$, thereby preventing an occurrence of the leakage current.

The PMOS transistors PTa, PTb, and PTc are connected in series between the first power voltage V1 and the node P1. The gate of the PMOS transistor PTa is connected to the node NODE_8. The second inverted data signal DATA2B is applied to the gate of the PMOS transistor PTb. The inverted enable signal ENB is applied to a gate of the PMOS transistor PTc.

When the enable signal EN is deactivated to a logic low, the inverted enable signal ENB is activated to a logic high. Therefore, in this case, the PMOS transistor PTc is turned off, and thus a voltage transfer path between the first power voltage V1 and the node P1 is blocked regardless of the second data signal DATA2.

The NMOS transistor NTc is connected between the node P1 and the ground. The gate of the NMOS transistor NTc is connected to the node NODE_8.

The NMOS transistors NTd and NTe are connected in parallel between the node P1 and the ground. The second inverted data signal DATA2B is applied to a gate of the NMOS transistor NTd. The inverted enable signal ENB is applied to a gate of the NMOS transistor NTe.

When the enable signal EN is deactivated to a logic low, the inverted enable signal ENB is activated to a logic high. Therefore, in this case, the NMOS transistor NTe is turned on, and thus the voltage of the node P1 maintains a low level regardless of the second data signal DATA2.

According to a circuit structure of FIG. 32, the voltage of the node P1 is determined according to the pad voltage and the second data signal DATA2. When the voltage of the pad PAD is a low voltage, for example, the ground voltage and a signal of the second inverted data signal DATA2B is a voltage of a logic high state, the PMOS transistor PTb is turned off and the NMOS transistor NTd is turned on, and thus the voltage of the node P1 becomes a logic low state.

The voltage state of the pad may be the same as that of the second data signal DATA2, but some delay may occur between the two states. That is, when the second data signal DATA2 is changed from a logic low state to a logic high state, that is, when the second inverted data signal DATA2B is changed from a logic high state to a logic low state, the pad voltage maintains a logic low state during a certain time period from a time point of the change. In this period, this causes the voltage of the node P1 to be in a logic low state by the NMOS transistor NTd. The PMOS transistor PTb receiving the second inverted data signal DATA2B having a logic low state through the gate is turned on and the NMOS transistor NTd is turned off. Therefore, the voltage of the node P1 temporarily increases to the first power voltage V1. That is, the second inverted data signal DATA2B has a logic low state, the inverted enable signal ENB has a logic low state, and the pad voltage has a logic low state during a given time period, the PMOS transistors PTa, PTb, PTc are turned on and the NMOS transistors NTc, NTd, and NTe are turned off. As a result, the first power voltage V1 and the node P1 are coupled to increase the voltage of the node P1 substantially equal to the first power voltage V1. Subsequently, the pad voltage changes to a logic high state to turn on the NMOS transistor NTb, and thus the voltage of the node NODE_8 increases to turn on the NMOS transistor NTc, thereby coupling the node P1 to the ground. Accordingly, the voltage of the node P1 increases to the first power voltage V1 during the time period, and then decreases.

Figure 33:
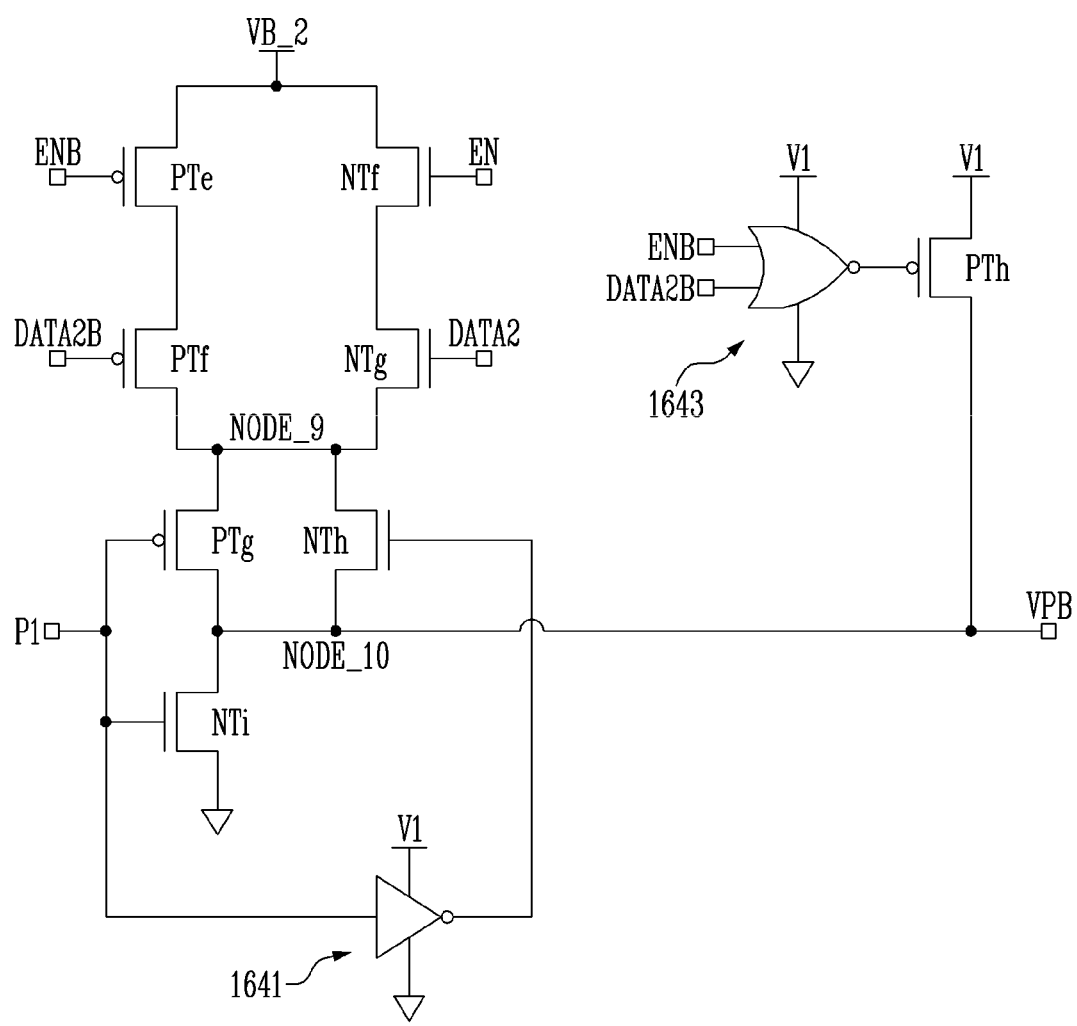
FIG. 33 is a diagram illustrating a P-driver bias control circuit 1640 of FIG. 30 according to an embodiment of the present disclosure.

FIG. 33 is a diagram illustrating a P-driver bias control circuit 1640a suitable for use as the P-driver bias control circuit 1640 of FIG. 30, according to an embodiment. Referring to FIG. 33, the P-driver bias control circuit 1640a may include NMOS transistors NTf, NTg, NTh, and NTi, PMOS transistors PTe, PTf, PTg, and PTh, an inverter 1641, and a negative-OR gate (NOR gate) 1643. The NMOS transistors NTf and NTg are connected in series between the second bias voltage VB_2 and a node NODE_9. The enable signal EN is applied to a gate of the NMOS transistor NTf, and the second data signal DATA2 is applied to a gate of the NMOS transistor NTg. The PMOS transistors PTe and PTf are connected in series between the second bias voltage VB_2 and the node NODE_9. The inverted enable signal ENB and the second inverted data signal DATA2B are applied to gate terminals of the PMOS transistors PTe and PTf, respectively.

The PMOS transistor PTg and the NMOS transistor NTh are connected in parallel between the node NODE_9 and a node NODE_10. The node NODE_10 may be directly connected to an output terminal of the P-driver bias control circuit 1640. The P-bias voltage VPB is output through the output terminal of the P-driver bias control circuit 1640. Meanwhile, the NMOS transistor NTi is connected between the node NODE_10 and the ground.

A gate terminal of the PMOS transistor PTg and a gate terminal of the NMOS transistor NTi are connected to the node P1. The node P1 may be an output node of the first pad-state detector 1620. Meanwhile, an input terminal of the inverter 1641 may be connected to the node P1, and an output terminal of the inverter 1641 may be connected to the gate of the NMOS transistor NTh.

The NOR gate 1643 performs an NOR operation on the inverted enable signal ENB and the second inverted data signal DATA2B, and output the operation result to the gate of the PMOS transistor PTh. The PMOS transistor PTh is connected between the first power voltage V1 and an output terminal VPB of the P-driver bias control circuit 1640a. In a case of the NOR gate 1643, an output of a logic-low is applied to the gate of the PMOS transistor PTh regardless of a level of the second inverted data signal DATA2B while the inverted enable signal ENB has a logic-high state. In this case, the PMOS transistor PTh is turned on to output the first power voltage V1 to the output terminal. At this time, the second PMOS transistor PMb shown in FIG. 29 is turned off.

When a voltage level of the node P1 is a low level, a voltage VPB of the output terminal becomes the first power voltage V1. In this state, when a voltage level of the second data signal DATA2 increases from a low level to a high level, the voltage of the node P1 temporarily increases to a level of the first power voltage V1. As the voltage level of the node P1 increases, the NMOS transistor NTi is turned on, and thus the P-bias voltage VPB output to the output terminal temporarily decreases to a low level, that is, the ground voltage level.

When the voltage VPB of the output terminal is the first power voltage V1, this voltage is applied to the gate of the second PMOS transistor PMb of FIG. 29. At this time, a source voltage of the second PMOS transistor PMb, that is, a voltage of the node NODE_A has a level of the first power voltage V1 added a threshold voltage $VT_{PMb}$ of the second PMOS transistor PMb. Since a drain voltage of the second PMOS transistor PMb, that is, the pad voltage PAD_R is a low level, in a state in which the voltage of the pad PAD is not increased to the first power voltage V1 or more, even though the P-bias voltage VPB momentarily decreases to a low level, for example, 0V, the gate-source voltage VGS, the gate-drain voltage VGD, and the drain-source voltage VDS of the second PMOS transistor PMb are within the reliability range condition described through [Table 1].

Meanwhile, in a situation in which the voltage of the pad PAD increases to the first power voltage V1 or more, the voltage of the node P1 decreases again to a low level. At this time, the P-bias voltage VPB temporarily increases to the first power voltage V1 to satisfy the reliability condition of the second PMOS transistor PMb. Thereafter, the P-bias voltage VPB is changed to the second bias voltage VB_2 in a state in which the voltage of the pad PAD is stabilized to the second power voltage V2.

Accordingly, the first pad-state detector 1620 and the P-driver bias control circuit 1640 output the P-bias voltage VPB having a voltage value between the second bias voltage VB_2 and the first power voltage V1. Accordingly, the second PMOS transistor PMb may operate in a state that satisfies the reliability condition of [Tables 1 or 2].

Figure 34:
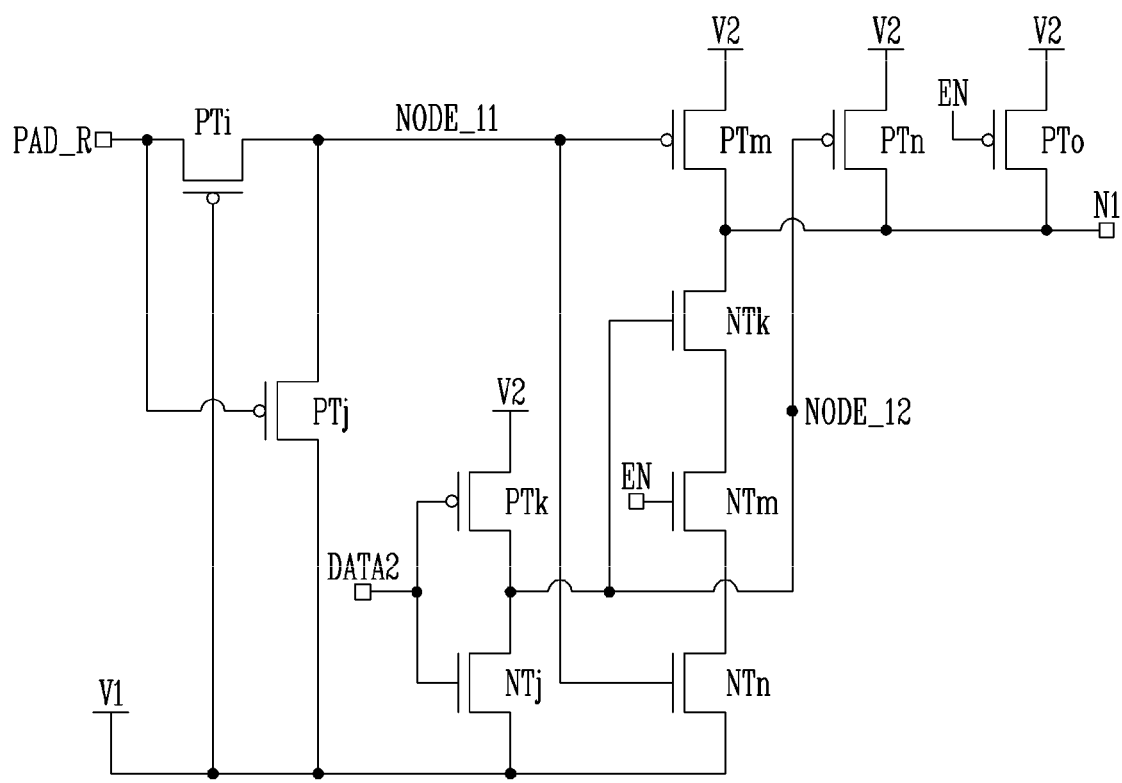
FIG. 34 is a diagram illustrating a second pad-state detector 1630a of FIG. 30 according to an embodiment of the present disclosure.

FIG. 34 is a diagram illustrating a second pad-state detector 1630a suitable for use as the second pad-state detector 1630 of FIG. 30, according to an embodiment.

Referring to FIG. 34, the second pad-state detector 1630 1630a may include NMOS transistors NTj, NTk, NTm, and NTn, and PMOS transistors PTi, PTj, PTk, PTm, PTn, and PTo.

The PMOS transistor PTi is connected between the node NPD and a node NODE_11. A gate of the PMOS transistor PTi is connected to the first power voltage V1. The PMOS transistor PTj is connected between the node NODE_11 and the first power voltage V1. A gate of the PMOS transistor PTj is connected to the node NPD. The PMOS transistor PTk and the NMOS transistor NTj are connected in series between the second power voltage V2 and the first power voltage V1. Gates of the PMOS transistor PTk and the NMOS transistor NTj are connected to the first PMOS gate signal PG<1>. The PMOS transistor PTm is connected between the second power voltage V2 and the node N1. A gate of the PMOS transistor PTm is connected to the node NODE_11. The NMOS transistors NTk, NTm, and NTn are connected in series between the node N1 and the first power voltage V1. A gate of the NMOS transistor NTk is connected to a node NODE_12. The enable signal EN is applied to a gate of the NMOS transistor NTm. The node NODE_11 is connected to a gate of the NMOS transistor NTn.

The PMOS transistors PTn and PTo are connected in parallel between the second power voltage V2 and the node N1. A gate of the PMOS transistor PTn is connected to a node NODE_12. A gate of the PMOS transistor PTo is connected to the enable signal EN.

When the second data signal DATA2 has a low level voltage value, and thus, the voltage of the pad PAD is 0V, the PMOS transistor PTk may be turned on by the second data signal DATA2 of a low state. Accordingly, a voltage of the node NODE_12 becomes a level of the second power voltage V2. When the voltage of the pad PAD increases to a high level, for example, the level of the second power voltage V2, the NMOS transistor NTj may be turned on by the second data signal DATA2 of a high state. Accordingly, the voltage of the node NODE_12 becomes a level of the first power voltage V1.

When the voltage of the pad PAD is changed from a high level to a low level, due to a delay time between the voltage of the pad PAD and the second data signal DATA2, a voltage level of the node NODE_12 temporarily decreases from the second power voltage V2 to the first power voltage V1.

In addition, when the enable signal EN is activated to a high level, an inverter configured of the PMOS transistor PTm and the NMOS transistor NTk, NTm, and NTn is activated. In this case, the voltage of the node NODE_12 is changed according to the voltage of the pad PAD and the node NPD. When the enable signal EN is deactivated to a low level, the inverter configured of the PMOS transistor PTm and the NMOS transistors NTk, NTm, and NTn is deactivated, and the voltage of the node N1 is fixed to the second power voltage V2 by the PMOS transistor PTo.

Figure 35:
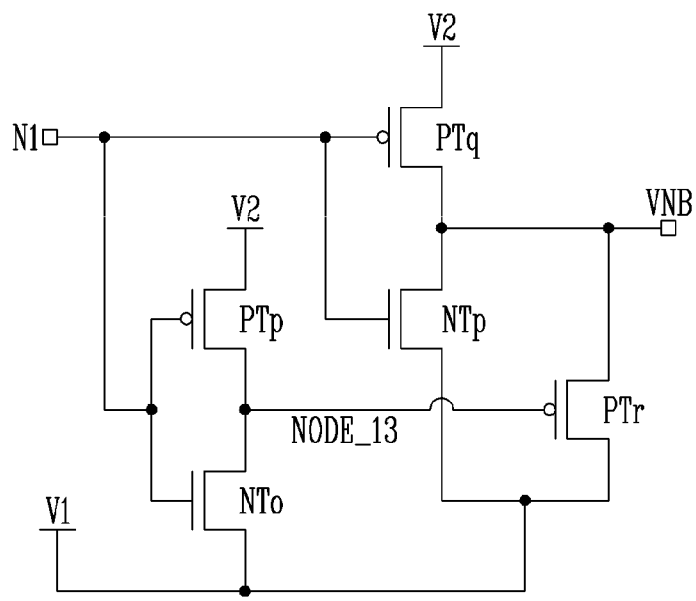
FIG. 35 is a diagram illustrating an N-driver bias control circuit 1650a of FIG. 30 according to an embodiment of the present disclosure.

FIG. 35 is a diagram illustrating an N-driver bias control circuit 1650a suitable for used as the N-driver bias control circuit 1650 of FIG. 30, according to an embodiment. Referring to FIG. 35, the N-driver bias control circuit 165011650a includes NMOS transistors NTo and NTp and PMOS transistors PTp, PTq, and PTr.

The PMOS transistor PTp and the NMOS transistor NTo are connected between the second power voltage V2 and the first power voltage V1. Gates of the PMOS transistor PTp and the NMOS transistor NTo are connected to the node N1. The PMOS transistor PTp and the NMOS transistor NTo are connected to each other through a node NODE_13.

Meanwhile, the PMOS transistor PTq and the NMOS transistor NTp are connected between the second power voltage V2 and the first power voltage V1. Gates of the PMOS transistor PTq and the NMOS transistor NTp are connected to the node N1. The PMOS transistor PTq and the NMOS transistor NTp are connected to each other by a node outputting the N-bias voltage VNB.

The PMOS transistor PTr is connected between the node outputting the N-bias voltage VNB and the first power voltage V1. A gate of the PMOS transistor PTr is connected to the node NODE_13.

When a voltage level of the node N1 as the input terminal is the second power voltage V2, the N-bias voltage VNB becomes the level of the first power voltage V1 by the NMOS transistor NTp. When the voltage of the node N1 temporarily decreases from the second power voltage V2 to the first power voltage V1 due to a delay between the pad voltage PAD_R and the second data signal DATA2, the N-bias voltage VNB is temporarily increased to the second power voltage V2.

Accordingly, the second pad-state detector 1630 and the N-driver bias control circuit 1650 output the N-bias voltage VNB having a voltage value between the first power voltage V1 and the second power voltage V2. Thus, the first NMOS transistor NMa may operate in a state that satisfies the reliability condition of [Tables 1 or 2].

Figure 36:
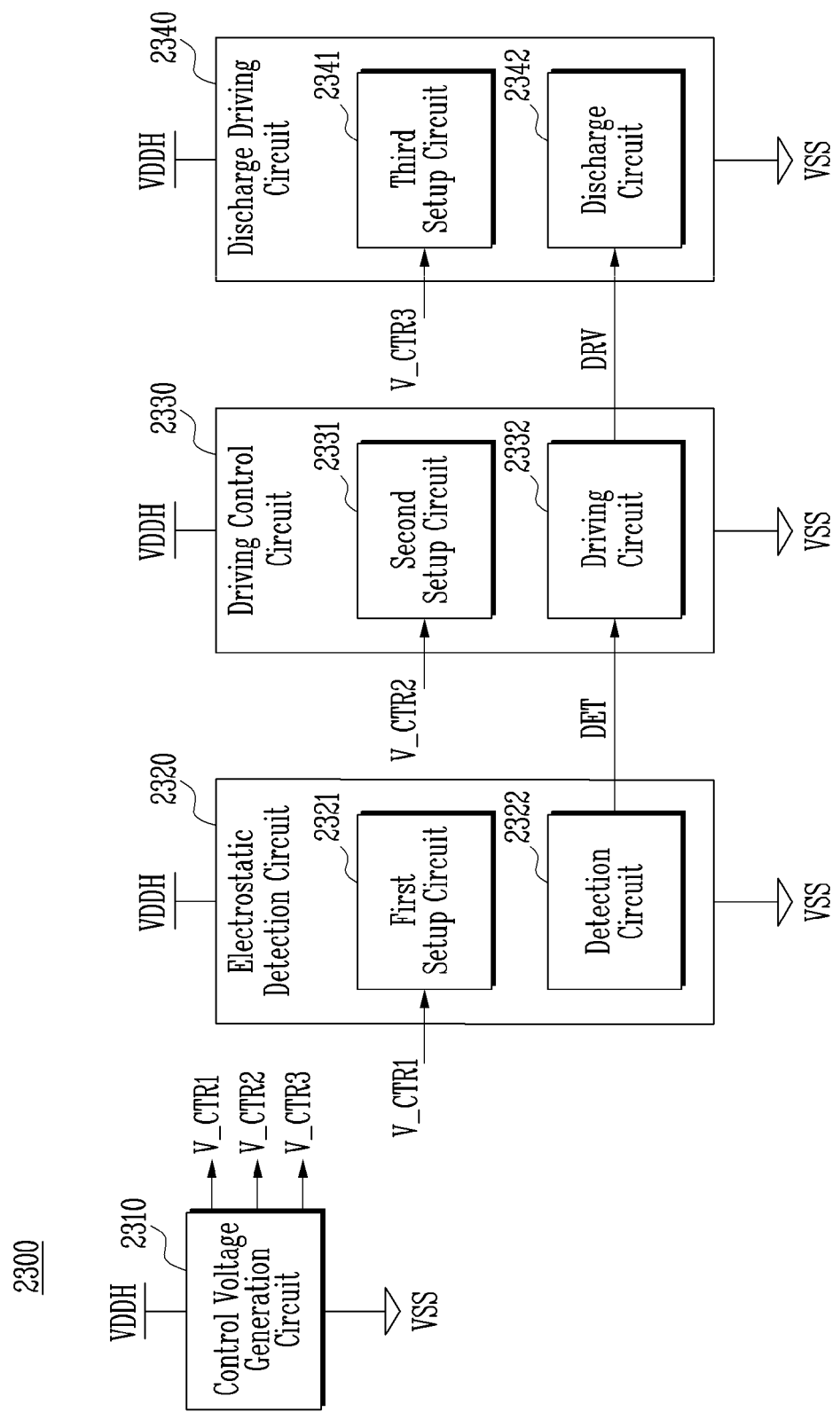
FIG. 36 is a block diagram illustrating a configuration of an electrostatic discharge circuit in accordance with an embodiment.

FIG. 36 is a block diagram illustrating a configuration of an electrostatic discharge circuit 2300 in accordance with an embodiment.

Referring to FIG. 36, the electrostatic discharge circuit 2300 may be configured to sense and discharge electrostatic electricity transferred through a supply voltage VDDH. More specifically, the electrostatic discharge circuit 2300 may include a control voltage generation circuit 2310, an electrostatic detection circuit 2320, a driving control circuit 2330 and a discharge driving circuit 2340.

The control voltage generation circuit 2310 may be configured to generate first to third control voltages V_CTR1 to V_CTR3 through a division operation on the supply voltage VDDH. The supply voltage VDDH may have a relatively high voltage level. For example, the supply voltage VDDH may be higher than the allowable voltage of a low voltage transistor included in the electrostatic discharge circuit 2300. For example, the supply voltage VDDH may be one of approximately 3.3V±10%, approximately 2.5V±10% and approximately 1.8V±10%. For reference, a supply voltage having a relatively low voltage level, which will be described below, may include the allowable voltage of the low voltage transistor. For example, the supply voltage having a relatively low voltage level may be one of approximately 1.8V±10%, approximately 1.2V±10% and approximately 0.8V±10%. The control voltage generation circuit 2310 may be coupled between a voltage terminal to which the supply voltage VDDH is applied and a voltage terminal to which a ground voltage VSS is applied.

Figure 37:
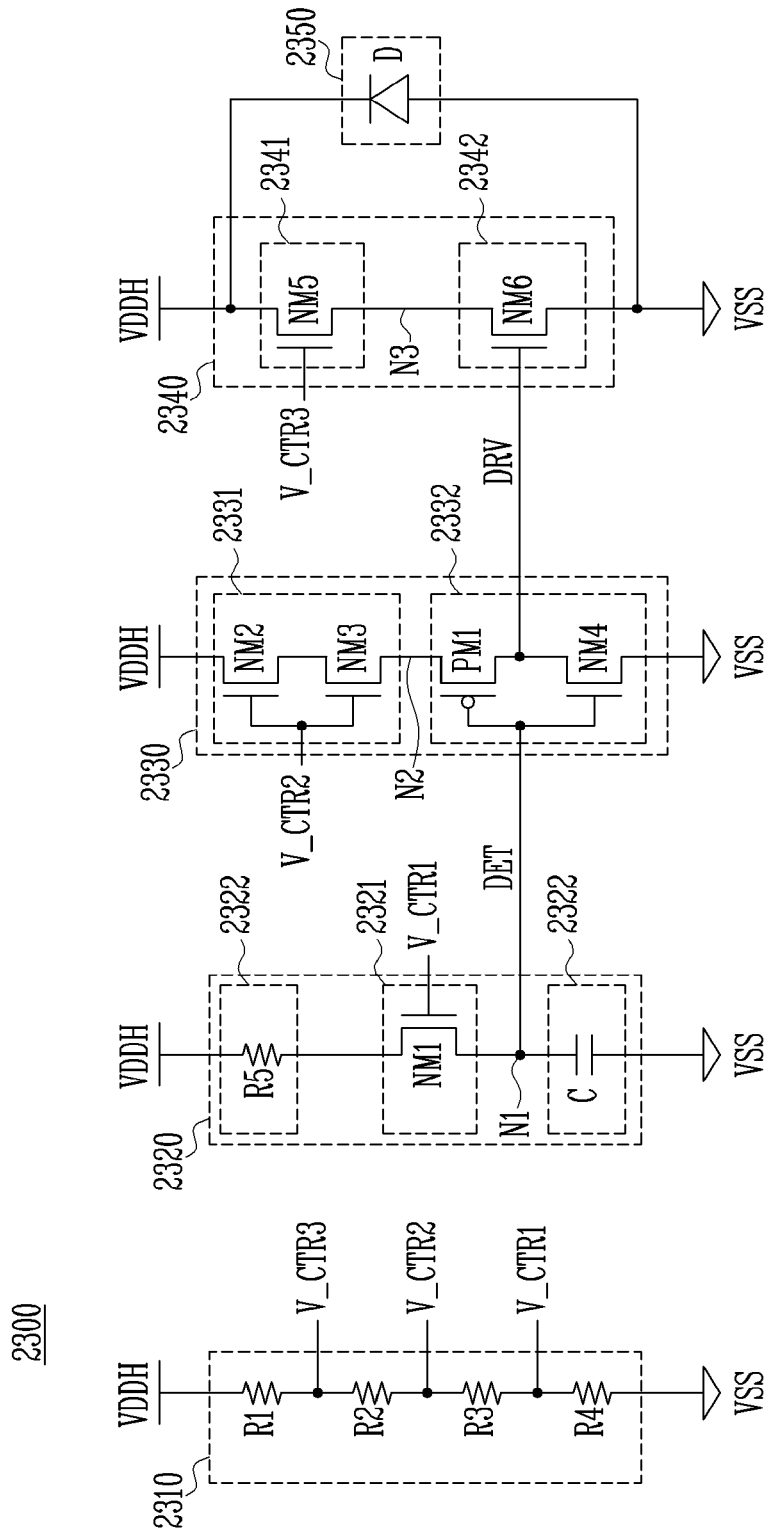
FIG. 37 is a circuit diagram illustrating a circuit configuration of the electrostatic discharge circuit of FIG. 36.

The first to third control voltages V_CTR1 to V_CTR3 generated by the control voltage generation circuit 2310 may have the same voltage level. Furthermore, at least one of the first to third control voltages V_CTR1 to V_CTR3 may have a different voltage level. FIG. 37 which will be described below illustrates the case in which the first to third control voltages V_CTR1 to V_CTR3 have voltage levels different from one another.

The electrostatic detection circuit 2320 may be configured to set a first setup voltage based on the first control voltage V_CTR1, and detect electrostatic electricity transferred through the first setup voltage. The electrostatic detection circuit 2320 may generate an electrostatic detection signal DET by detecting electrostatic electricity. The electrostatic detection circuit 2320 may be coupled between the voltage terminal to which the supply voltage VDDH is applied and the voltage terminal to which the ground voltage VSS is applied. More specifically, the electrostatic detection circuit 2320 may include a first setup circuit 2321 and a detection circuit 2322.

The first setup circuit 2321 may be configured to receive the supply voltage VDDH, and generate the first setup voltage based on the first control voltage V_CTR1. The detection circuit 2322 may be configured to detect electrostatic electricity transferred through the first setup voltage, and output the electrostatic detection signal DET. The detailed circuit configurations of the first setup circuit 2321 and the detection circuit 2322 will be described below with reference to FIG. 37.

The driving control circuit 2330 may be configured to set a second setup voltage based on the second control voltage V_CTR2, and generate a driving control signal DRV based on the electrostatic detection signal DET. The driving control circuit 2330 may be coupled to the voltage terminal to which the supply voltage VDDH is applied and the voltage terminal to which the ground voltage VSS is applied. More specifically, the driving control circuit 2330 may include a second setup circuit 2331 and a driving circuit 2332.

The second setup circuit 2331 may be configured to receive the supply voltage VDDH, and generate the second setup voltage based on the second control voltage V_CTR2. The driving circuit 2332 may be configured to generate the driving control signal DRV based on the electrostatic detection signal DET. The detailed circuit configurations of the second setup circuit 2331 and the driving circuit 2332 will be described below with reference to FIG. 37.

The discharge driving circuit 2340 may be configured to set a third setup voltage based on the third control voltage V_CTR3, and perform a discharge operation on the electrostatic electricity transferred through the third setup voltage based on the driving control signal DRV. The discharge driving circuit 2340 may be coupled between the voltage terminal to which the supply voltage VDDH is applied and the voltage terminal to which the ground voltage VSS is applied. More specifically, the discharge driving circuit 2340 may include a third setup circuit 2341 and a discharge circuit 2342.

The third setup circuit 2341 may be configured to receive the supply voltage VDDH, and generate the third setup voltage based on the third control voltage V_CTR3. The discharge circuit 2342 may be configured to form a discharge path for the third setup voltage based on the driving control signal DRV. The detailed circuit configurations of the third setup circuit 2341 and the discharge circuit 2342 will be described below with reference to FIG. 37.

FIG. 37 is a circuit diagram illustrating the circuit configuration of the electrostatic discharge circuit 2300 of FIG. 36.

Referring to FIG. 37, the electrostatic discharge circuit 2300 may include the control voltage generation circuit 2310, the electrostatic detection circuit 2320, the driving control circuit 2330 and the discharge driving circuit 2340.

The control voltage generation circuit 2310 may include first to fourth resistors R1 to R4 coupled in series between the voltage terminal to which the supply voltage VDDH is applied and the voltage terminal to which the ground voltage VSS is applied.

The first to fourth resistors R1 to R4 may generate the first to third control voltages V_CTR1 to V_CTR3 by dividing the supply voltage VDDH. The third control voltage V_CTR3 may be outputted from a node to which the first and second resistors R1 and R2 are coupled in common, the second control voltage V_CTR2 may be outputted from a node to which the second and third resistors R2 and R3 are coupled in common, and the first control voltage V_CTR1 may be outputted from a node to which the third and fourth resistors R3 and R4 are coupled in common. Therefore, the first to third control voltages V_CTR1 to V_CTR3 may have different voltage levels. Furthermore, the first to third control voltages V_CTR1 to V_CTR3 may have voltage levels which are sequentially low based on the voltage level of the supply voltage VDDH. That is, among the first to third control voltages V_CTR1 to V_CTR3, the third control voltage V_CTR3 may have the highest voltage level, the second control voltage V_CTR2 may have the second height voltage level, and the first control voltage V_CTR1 may have the lowest voltage level.

The control voltage generation circuit 2310 having the above-described configuration may generate the first to third control voltages V_CTR1 to V_CTR3 through the division operation on the supply voltage VDDH.

In embodiments, the control voltage generation circuit 2310 may include first to third resistors R1 to R3 coupled in series between the voltage terminal to which the supply voltage VDDH is applied and the voltage terminal to which the ground voltage VSS is applied. The first to third resistors R1 to R3 may generate the first to third control voltages V_CTR1 to V_CTR3 by dividing the supply voltage VDDH. For example, the first and second control voltages V_CTR1 and V_CTR2 may have the substantial same voltage level. For example, the second and third control voltages V_CTR2 and V_CTR3 may have the substantial same voltage level.

The electrostatic detection circuit 2320 may include the detection circuit 2322 and the first setup circuit 2321. The electrostatic detection circuit 2320 may include a fifth resistor R5, a first NMOS transistor NM1 and a capacitor C, which are coupled in series between the voltage terminal to which the supply voltage VDDH is applied and the voltage terminal to which the ground voltage VSS is applied. The first NMOS transistor NM1 may be included in the first setup circuit 2321. The fifth resistor R5 and the capacitor C may be included in the detection circuit 2322.

The first NMOS transistor NM1 may be coupled between the fifth resistor R5 and a first node N1, and configured to receive the first control voltage V_CTR1 through a gate terminal thereof. The first NMOS transistor NM1 may be turned on based on the first control voltage V_CTR1. Thus, the supply voltage VDDH may be transferred to the first node N1 through the fifth resistor R5 and the first NMOS transistor NM1. Therefore, the first node N1 may receive the supply voltage VDDH, and form the first setup voltage.

The capacitor C may be coupled between the first node N1 and the voltage terminal to which the ground voltage VSS is applied. The capacitor C may be opened or shorted according to the current characteristic of the first setup voltage formed in the first node N1. In other words, the capacitor C may be opened when the first setup voltage of the first node N1 has a DC characteristic, and shorted when the first setup voltage of the first node N1 has an AC characteristic. That is, the capacitor C may be opened or shorted according to the characteristic of a current flowing through the first node N1.

More specifically, when no electrostatic electricity is contained in the supply voltage VDDH, the first setup voltage of the first node N1 may have a DC characteristic. At this time, a current path between the first node N1 and the ground terminal may be opened by the capacitor C. Therefore, the first node N1 may have a voltage level corresponding to the supply voltage VDDH or a voltage level similar to the supply voltage VDDH. When electrostatic electricity is contained in the supply voltage VDDH, the voltage level of the supply voltage VDDH is instantaneously changed by a high voltage. Thus, the first setup voltage of the first node N1 may have an AC characteristic. At this time, the current path between the first node N1 and the ground terminal may be shorted by the capacitor. The first node N1 may have a voltage level corresponding to the ground voltage VSS or a voltage level similar to the ground voltage VSS.

The first node N1 may have a voltage level corresponding to whether there is electrostatic electricity transferred through the supply voltage VDDH. Through the electrostatic detection signal DET outputted from the first node N1, it is possible to detect whether electrostatic electricity occurred.

The electrostatic detection circuit 2320 having the above-described configuration may set the first setup voltage in the first node N1 based on the first control voltage V_CTR1. The electrostatic detection circuit 2320 may generate the electrostatic detection signal DET by detecting electrostatic electricity transferred through the first node N1. The electrostatic detection circuit 2320 may generate the electrostatic detection signal DET by detecting electrostatic electricity contained the first setup voltage.

The driving control circuit 2330 may include the second setup circuit 2331 and the driving circuit 2332. The driving control circuit 2330 may include a second NMOS transistor NM2, a third NMOS transistor NM3, a first PMOS transistor PM1 and a fourth NMOS transistor NM4, which are coupled in series between the voltage terminal to which the supply voltage VDDH is applied and the voltage terminal to which the ground voltage VSS is applied. The second and third NMOS transistors NM2 and NM3 may be included in the second setup circuit 2331. The first PMOS transistor PM1 and the fourth NMOS transistor NM4 may be included in the driving circuit 2332.

The second and third NMOS transistors NM2 and NM3 may be coupled in series between a second node N2 and the voltage terminal to which the supply voltage VDDH is applied, and receive the second control voltage V_CTR2 through gate terminals thereof. The second and third NMOS transistors NM2 and NM3 may be turned on based on the second control voltage V_CTR2. Thus, the supply voltage VDDH may be transferred to the second node N2 through the second and third NMOS transistors NM2 and NM3. Therefore, the second node N2 may receive the supply voltage VDDH and form the second setup voltage.

The first PMOS transistor PM1 and the fourth NMOS transistor NM4 may be coupled in series between the second node N2 and the voltage terminal to which the ground voltage VSS is applied, and receive the electrostatic detection signal DET through gate terminals thereof. Thus, when the electrostatic detection signal DET has a voltage level corresponding to logic 'high', the fourth NMOS transistor NM4 may be turned on. Furthermore, when the electrostatic detection signal DET has a voltage level corresponding to logic 'low', the first PMOS transistor PM1 may be turned on.

As described above, the electrostatic detection signal DET may have a voltage level corresponding to the supply voltage VDDH when no electrostatic electricity is detected. That is, the electrostatic detection signal DET may become logic 'high'. Therefore, the fourth NMOS transistor NM4 may be turned on based on the electrostatic detection signal DET. At this time, the driving control signal DRV may become logic 'low' to correspond to the ground voltage VSS. The electrostatic detection signal DET may have a voltage level corresponding to the ground voltage VSS when electrostatic electricity is detected. That is, the electrostatic detection signal DET may become logic 'low'. Therefore, the first PMOS transistor PM1 may be turned on based on the electrostatic detection signal DET. At this time, the driving control signal DRV may become logic 'high' to correspond to the second setup voltage.

The driving control circuit 2330 having the above-described configuration may set the second setup voltage in the second node N2 based on the second control voltage V_CTR2. Furthermore, the driving control circuit 2330 may generate the driving control signal DRV based on the electrostatic detection signal DET.

The discharge driving circuit 2340 may include the third setup circuit 2341 and the discharge circuit 2342. The discharge driving circuit 2340 may include fifth and sixth NMOS transistors NM5 and NM6 coupled in series between the voltage terminal to which the supply voltage VDDH is applied and the voltage terminal to which the ground voltage VSS is applied. The fifth NMOS transistor NM5 may be included in the third setup circuit 2341. The sixth NMOS transistor NM6 may be included in the discharge circuit 2342.

The fifth NMOS transistor NM5 may be coupled between a third node N3 and the voltage terminal to which the supply voltage VDDH is applied, and receive the third control voltage V_CTR3 through a gate terminal thereof. The fifth NMOS transistor NM5 may be turned on based on the third control voltage V_CTR3. The supply voltage VDDH may be transferred to the third node N3 through the fifth NMOS transistor NM5. Therefore, the third node N3 may receive the supply voltage VDDH and form the third setup voltage.

The sixth NMOS transistor NM6 may be coupled between the third node N3 and the voltage terminal to which the ground voltage VSS is applied, and receive the driving control signal DRV through a gate terminal thereof. When the driving control signal DRV is logic 'low', the sixth NMOS transistor NM6 may be turned off. On the other hand, when the driving control signal DRV is logic 'high', the sixth NMOS transistor NM6 may be turned on. Therefore, when the sixth NMOS transistor NM6 is turned on, the third node N3 and the voltage terminal to which the ground voltage VSS is applied may be coupled to each other. That is, the sixth NMOS transistor NM6 may form a discharge path for the third setup voltage formed in the third node N3, based on the driving control signal DRV.

As described above, when no electrostatic electricity is detected, the driving control signal DRV may become logic 'low'. The sixth NMOS transistor NM6 may be turned off based on the driving control signal DRV. On the other hand, when electrostatic electricity is detected, the driving control signal DRV may become logic 'high'. The sixth NMOS transistor NM6 may be turned on based on the driving control signal DRV. At this time, the sixth NMOS transistor NM6 may form a discharge path. Therefore, electrostatic electricity transferred from the supply voltage VDDH may be discharged to the voltage terminal to which the ground voltage VSS is applied, through the discharge path.

The discharge driving circuit 2340 having the above-described configuration may set the third setup voltage in the third node N3 based on the third control voltage V_CTR3. Furthermore, the discharge driving circuit 2340 may perform a discharge operation on the electrostatic electricity transferred through the supply voltage VDDH, based on the driving control signal DRV.

The electrostatic discharge circuit 2300 in accordance with the present embodiment may use the supply voltage VDDH corresponding to a high voltage of 3.3V, for example. The first to sixth NMOS transistors NM1 to NM6 and the first PMOS transistor PM1, which are included in the electrostatic discharge circuit 2300, may be all implemented as low voltage transistors. The low voltage transistor may include a transistor which is used when implementing an integrated circuit using a supply voltage of 1.8V, for example.

In general, the low voltage transistor may occupy a smaller area and require a lower design cost than the high voltage transistor. As described above, the electrostatic discharge circuit 2300 may detect and discharge electrostatic electricity transferred through the supply voltage VDDH corresponding to a high voltage, while using the low voltage transistors. In other words, the electrostatic discharge circuit 2300 in accordance with the present embodiment may not only perform a discharge operation on electrostatic electricity transferred through the supply voltage VDDH, but also reduce the area of the electrostatic discharge circuit 2300.

The reason why low voltage transistors can be used in the electrostatic discharge circuit 2300 in accordance with the present embodiment may be described as follows.

In general, a transistor may have a reliability guarantee condition depending on an operation characteristic thereof. The low voltage transistor may perform a normal circuit operation only when the voltage levels of the source, drain and gate terminals of the transistor have the reliability guarantee condition. In the case of an integrated circuit using a supply voltage of 1.8V, a voltage difference $V_{gd}$ between the gate and drain terminals of the low voltage transistor, a voltage difference $V_{gs}$ between the gate and source terminals thereof, and a voltage difference $V_{ds}$ between the drain and source terminals thereof need to have a reliability guarantee condition of 1.98V or less. The electrostatic discharge circuit 2300 in accordance with the present embodiment may receive the supply voltage VDDH of 3.3V corresponding to a high voltage, and the first to sixth NMOS transistors NM1 to NM6 and the first PMOS transistor PM1 may each maintain the reliability guarantee condition for the low voltage transistor.

Hereafter, for convenience of description, it is assumed that the first control voltage V_CTR1, the second control voltage V_CTR2 and the third control voltage V_CTR3, which are obtained by dividing the supply voltage VDDH of 3.3V is 2.3V, 2.4V, and 2.5V, respectively. Furthermore, it is assumed that the threshold voltages of the first to sixth NMOS transistors NM1 to NM6 and the first PMOS transistor PM1 are 0.5V.

The first NMOS transistor NM1 may receive the first control voltage V_CTR1 of 2.3V through the gate terminal thereof. Therefore, the voltage difference Vgd between the gate and drain terminals may become 1V (=3.3V−2.3V), the voltage difference Vgs between the gate and source terminals may become 0.5V (=2.3V−1.8V), and the voltage difference Vds between the drain and source terminals may become 1.5V (=3.3V−1.8V), under the supposition that the fifth resistor R5 is ignored. That is, the gate, drain and source terminals of the first NMOS transistor NM1 may have a range of 1.98V or less, which corresponds to the reliability guarantee condition for the low voltage transistor.

The second NMOS transistor NM2 may receive the second control voltage V_CTR2 of 2.4V through the gate terminal thereof. Therefore, the voltage difference Vgd between the gate and drain terminals may become 0.9V (=3.3V−2.4V), the voltage difference Vgs between the gate and source terminals may become 0.5V (=2.4V−1.9V), and the voltage difference Vds between the drain and source terminals may become 1.4V (=3.3V−1.9V). That is, the gate, drain and source terminals of the second NMOS transistor NM2 may have a range of 1.98V or less which corresponds to the reliability guarantee condition for the low voltage transistor. Similarly, the gate, drain and source terminals of the third NMOS transistor NM3, the first PMOS transistor PM1 and the fourth NMOS transistor NM4 may all have a range of 1.98V or less which corresponds to the reliability guarantee condition for the low voltage transistor.

The fifth NMOS transistor NM5 may receive the third control voltage V_CTR3 of 2.5V through the gate terminal thereof. Therefore, the voltage difference Vgd between the gate and drain terminals may become 0.8V (=3.3V−2.5V), the voltage difference Vgs between the gate and source thereof may become 0.5V (=2.5V−2V), and the voltage difference Vds between the drain and source terminals may become 1.3V (=3.3V−2V). That is, the gate, drain and source terminals of the fifth NMOS transistor NM5 may have a range of 1.98V or less which corresponds to the reliability guarantee condition for the low voltage transistor. That is, the gate, drain and source terminals of the sixth NMOS transistor NM6 may all have a range of 1.98V or less which corresponds to the reliability guarantee condition for the low voltage transistor.

In particular, in case of the fifth NMOS transistor NM5, a current Ids flowing from the drain terminal to the source terminal may be maximized, because the voltage level of the third control voltage V_CTR3 is 2.5V. That is, the electrostatic discharge circuit 2300 in accordance with the present embodiment may maximize the current Ids flowing from the drain terminal to the source terminal of the fifth NMOS transistor NM5, thereby maximizing the discharge efficiency for electrostatic electricity.

The electrostatic discharge circuit in accordance with the present embodiment may further include a reverse discharge circuit 2350.

Referring to FIG. 387, the reverse discharge circuit 2350 may be configured to discharge electrostatic electricity, transferred through the ground voltage VSS, as the supply voltage VDDH. The reverse discharge circuit 2350 may be configured as a diode D coupled between the voltage terminal to which the ground voltage VSS is applied and the voltage terminal to which the supply voltage VDDH is applied.

The reverse discharge circuit 2350 having the above-described configuration may discharge electrostatic electricity, transferred through the ground voltage VSS, to the voltage terminal to which the supply voltage VDDH is applied.

The electrostatic discharge circuit 2300 in accordance with the present embodiment may perform a discharge operation on not only the electrostatic electricity transferred through the supply voltage VDDH but also the static electricity transferred through the ground voltage VSS.

Figure 38:
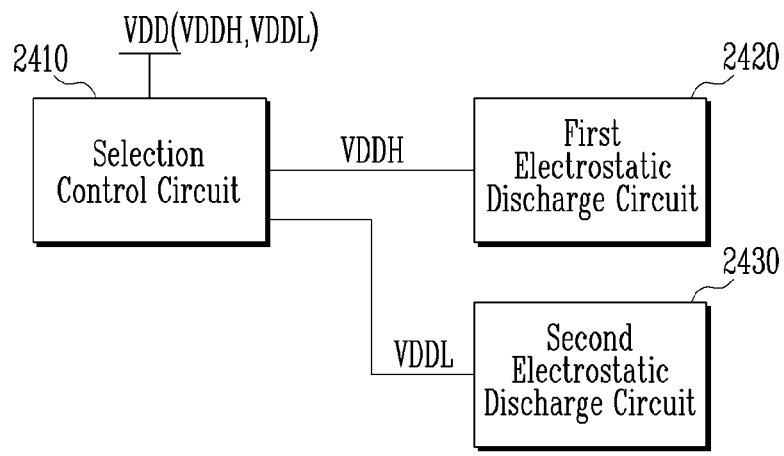
FIG. 38 is a block diagram illustrating a configuration of an electrostatic discharge control system in accordance with an embodiment.

FIG. 38 is a block diagram illustrating a configuration of an electrostatic discharge control system 2400 in accordance with an embodiment.

Referring to FIG. 38, the electrostatic discharge control system 2400 may be configured to control a discharge operation on electrostatic electricity transferred through multiple supply voltages in an integrated circuit using the multiple supply voltages. Hereafter, for convenience of description, the case will be described, in which a supply voltage terminal VDD receives one first supply voltage VDDH among approximately 3.3V±10%, approximately 2.5V±10% and approximately 1.8V±10%, for example, which correspond to high voltages, and receives one second supply voltage VDDL among approximately 1.8V±10%, approximately 1.2V±10% and approximately 0.8V±10%, for example, which correspond to low voltages. When the first supply voltage VDDH of 3.3V is applied to the supply voltage terminal VDD, the electrostatic discharge control system 2400 may control a discharge operation on electrostatic electricity transferred through the first supply voltage VDDH. Furthermore, when the second supply voltage VDDL of 1.8V is applied to the supply voltage terminal VDD, the electrostatic discharge control system 2400 may control a discharge operation on electrostatic electricity transferred through the second supply voltage VDDL. More specifically, the electrostatic discharge control system 2400 may include a selection control circuit 2410, a first electrostatic discharge circuit 2420 and a second electrostatic discharge circuit 2430.

The selection control circuit 2410 may be configured to selectively control the first or second electrostatic discharge circuit 2420 or 2430 based on any one supply voltage applied to the supply voltage terminal VDD between the first and second supply voltages VDDH and VDDL. The selection control circuit 2410 may be designed to selectively activate the first and second electrostatic discharge circuits 2420 and 2430. For example, the selection control circuit 2410 may selectively provide the first or second supply voltage VDDH or VDDL to the first and second electrostatic discharge circuits 2420 and 2430. That is, the selection control circuit 2410 may provide the first supply voltage VDDH to the first electrostatic discharge circuit 2420, and provide the second supply voltage VDDL to the second electrostatic discharge circuit 2430. The first electrostatic discharge circuit 2420 may be selectively activated based on the first supply voltage VDDH provided thereto. Furthermore, the second electrostatic discharge circuit 2430 may be selectively activated based on the second supply voltage VDDL provided thereto.

Figure 39:
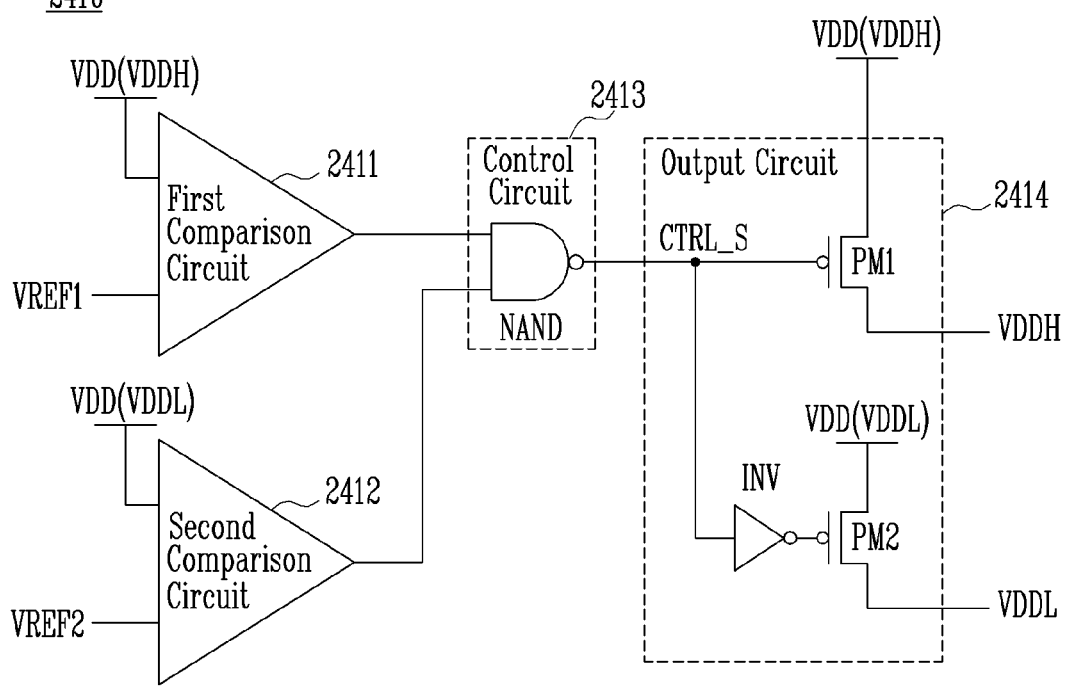
FIG. 39 is a diagram illustrating a configuration of a selection control circuit of FIG. 38.

FIG. 39 is a diagram illustrating a configuration of the selection control circuit 2410 of FIG. 38.

Referring to FIG. 39, the selection control circuit 2410 may include a first comparison circuit 2411, a second comparison circuit 2412, a control circuit 2413 and an output circuit 2414.

The first comparison circuit 2411 may be configured to compare a supply voltage transferred to the supply voltage terminal VDD to a first reference voltage VREF1 corresponding to the first supply voltage VDDH. When the supply voltage applied to the supply voltage terminal VDD is lower than the first supply voltage VDDH, the first comparison circuit 2411 may generate a logic 'low' output signal, for example. When the first supply voltage VDDH is applied to the supply voltage terminal VDD, the first comparison circuit 2411 may generate a logic 'high' output signal, for example.

The second comparison circuit 2412 may be configured to compare a supply voltage transferred to the supply voltage terminal VDD to a second reference voltage VREF2 corresponding to the second supply voltage VDDL. When the supply voltage applied to the supply voltage terminal VDD is lower than the second supply voltage VDDL, the second comparison circuit 2412 may generate a logic 'low' output signal, for example. Furthermore, when the second supply voltage VDDL is applied to the supply voltage terminal VDD, the second comparison circuit 2412 may generate a logic 'high' output signal, for example.

The control circuit 2413 may be configured to generate a selection control signal CTR_S based on the output signals of the first and second comparison circuits 2411 and 2412. The control circuit 2413 may include a NAND gate NAND. The NAND gate NAND may receive the output signals of the first and second comparison circuits 2411 and 2412, perform a NAND operation on the received signals, and output the selection control signal CTR_S.

The output circuit 2414 may be configured to selectively output the first or second supply voltage VDDH or VDDL based on the select control signal CTR_S. More specifically, the output circuit 2414 may include a first PMOS transistor PM1, an inverter INV and a second PMOS transistor PM2.

The first PMOS transistor PM1 may receive the selection control signal CTR_S through a gate terminal thereof. The first PMOS transistor PM1 may be turned on when the selection control signal CTR_S is logic 'low'. When the first PMOS transistor PM1 is turned on, the first supply voltage VDDH applied to the supply voltage terminal VDD may be outputted as an output voltage. The inverter INV may invert and output the selection control signal CTR_S. Then, the second PMOS transistor PM2 may receive the output signal of the inverter INV through a gate terminal thereof. The second PMOS transistor PM2 may be turned on when the output signal of the inverter INV is logic 'low'. When the second PMOS transistor PM2 is turned on, the second supply voltage VDDL applied to the supply voltage terminal VDD may be outputted as an output voltage.

Hereafter, the circuit operation of the selection control circuit 2410 will be described with reference to FIG. 39.

In the following descriptions, the case in which the second supply voltage VDDL corresponding to a low voltage is applied to the supply voltage terminal VDD will be taken as an example.

The second comparison circuit 2412 of FIG. 39 may receive the second supply voltage VDDL, compare the second supply voltage VDDL to a second reference voltage VREF2, and output a logic 'high' output signal. At this time, the first comparison circuit 2411 may generate a logic 'low' output signal, because the first reference voltage VREF1 has a higher voltage level than the second reference voltage VREF2. Then, the NAND gate NAND may output the logic 'high' selection control signal CTR_S based on the logic 'low' output signal of the first comparison circuit 2411 and the logic 'high' output signal of the second comparison circuit 2412. Thus, the second PMOS transistor PM2 may be turned on based on the selection control signal CTR_S, and output the second supply voltage VDDL. At this time, the first PMOS transistor PM1 may maintain a turn-off state.

Next, the case in which the first supply voltage VDDH corresponding to a high voltage is applied to the supply voltage terminal VDD will be described as follows.

The first comparison circuit 2411 of FIG. 39 may receive the first supply voltage VDDH, compare the first supply voltage VDDH to the first reference voltage VREF1, and output a logic 'high' output signal. At this time, the second comparison circuit 2412 may also generate a logic 'high' output signal. Then, the NAND gate NAND may output the logic 'low' selection control signal CTR_S based on the logic 'high' output signal of the first comparison circuit 2411 and the logic 'high' output signal of the second comparison circuit 2412. Thus, the first PMOS transistor PM1 may be turned on based on the selection control signal CTR_S, and output the first supply voltage VDDH. At this time, the second PMOS transistor PM2 may maintain a turn-off state.

When the first supply voltage VDDH is applied to the supply voltage terminal VDD, the selection control circuit 2410 having the above-described configuration may output the first supply voltage VDDH, and provide the first supply voltage VDDH to the first electrostatic discharge circuit 2420 of FIG. 38. Furthermore, when the second supply voltage VDDL is applied to the supply voltage terminal VDD, the selection control circuit 2410 may output the second supply voltage VDDL, and provide the second supply voltage VDDL to the second electrostatic discharge circuit 2430 of FIG. 38.

Referring back to FIG. 38, the first electrostatic discharge circuit 2420 may be activated by the first supply voltage VDDH received from the selection control circuit 2410. Furthermore, the first electrostatic discharge circuit 2420 may perform a discharge operation on electrostatic electricity transferred through the first supply voltage VDDH. The first electrostatic discharge circuit 2420 may correspond to the electrostatic discharge circuit 2300 of FIGS. 1 and 2. That is, the first electrostatic discharge circuit 2420 may include the control voltage generation circuit 2310, the electrostatic detection circuit 2320, the driving control circuit 2330 and the discharge driving circuit 2340 of FIG. 386.

The second electrostatic discharge circuit 2430 may be activated by the second supply voltage VDDL received from the selection control circuit 2410. Furthermore, the second electrostatic discharge circuit 2430 may perform a discharge operation on electrostatic electricity transferred through the second supply voltage VDDL.

Figure 40:
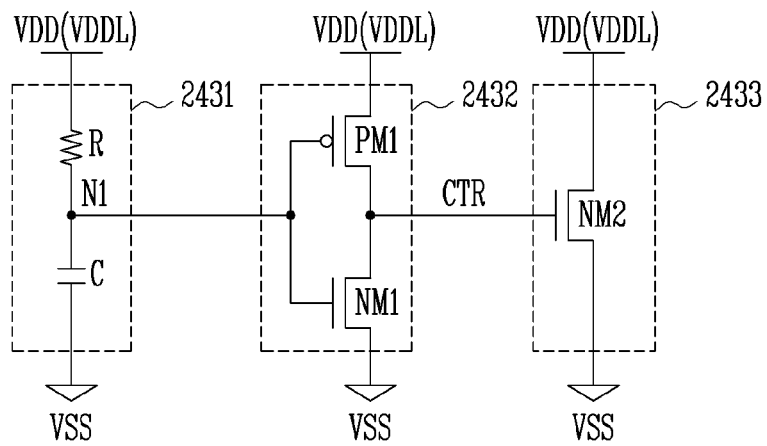
FIG. 40 is a circuit diagram illustrating a configuration of a second electrostatic discharge circuit of FIG. 38.

FIG. 40 is a circuit diagram illustrating a configuration of the second electrostatic discharge circuit 2430 of FIG. 38.

Referring to FIG. 40, the second electrostatic discharge circuit 2430 may include a detection circuit 2431, a driving circuit 2432 and a discharge circuit 2433. The second electrostatic discharge circuit 2430 may receive the second supply voltage VDDL from the supply voltage terminal VDD.

The detection circuit 2431 may be configured to detect electrostatic electricity transferred through the second supply voltage VDDL. The detection circuit 2431 may include a resistor R and a capacitor C, which are coupled in series between the supply voltage terminal VDD and the voltage terminal to which the ground voltage VSS is applied.

The driving circuit 2432 may be configured to generate the control signal CTR based on the output signal of the detection circuit 2431. The driving circuit 2432 may include a first PMOS transistor PM1 and a first NMOS transistor NM1, which are coupled in series between the supply voltage terminal VDD and the voltage terminal to which the ground voltage VSS is applied.

The discharge circuit 2433 may be configured to form a discharge path for the second supply voltage VDDL based on the control signal CTR. The discharge circuit 2433 may include a second NMOS transistor NM2 coupled between the supply voltage terminal VDD and the voltage terminal to which the ground voltage VSS is applied.

The second electrostatic discharge circuit 2430 may receive the second supply voltage VDDL and perform a discharge operation. Therefore, the first and second NMOS transistors NM1 and NM2 and the first PMOS transistor PM1, which are included in the second electrostatic discharge circuit 2430, may include low voltage transistors.

Hereafter, overall circuit operations of the electrostatic discharge control system 2400 will be described with reference to FIGS. 3 to 5.

First, the case in which the first supply voltage VDDH corresponding to a high voltage is applied to the supply voltage terminal VDD will be described as follows.

As described above, the selection control circuit 2410 of FIG. 39 may output the first supply voltage VDDH when the first supply voltage VDDH is applied to the supply voltage terminal VDD. Therefore, the first electrostatic discharge circuit 2420 may be activated, and the second electrostatic discharge circuit 2430 may be inactivated. Then, the first electrostatic discharge circuit 2420 of FIG. 38 may receive the first supply voltage VDDH, and perform the discharge operation described with reference to FIG. 387. Therefore, the electrostatic electricity transferred through the first supply voltage VDDH may be discharged through the ground voltage VSS.

Next, the case in which the second supply voltage VDDL corresponding to a low voltage is applied to the supply voltage terminal VDD will be described as follows.

As described above, the selection control circuit 2410 of FIG. 39 may output the second supply voltage VDDL when the second supply voltage VDDL is applied to the supply voltage terminal VDD. Therefore, the first electrostatic discharge circuit 2420 may be inactivated, and the second electrostatic discharge circuit 2430 may be activated.

When no electrostatic electricity is contained in the second supply voltage VDDL, a first node N1 of the detection circuit 2431 of FIG. 40 may have a voltage level corresponding to the second supply voltage VDDL. That is, the first node N1 may become logic 'high'. Then, the driving circuit 2432 may generate the logic 'low' control signal CTR based on a logic 'high' output signal outputted from the detection circuit 2431. At this time, the second NMOS transistor NM2 of the discharge circuit 2433 may maintain a turn-off state.

When electrostatic electricity is contained in the second supply voltage VDDL, the first node N1 of the detection circuit 2431 of FIG. 40 may have a voltage level corresponding to the ground voltage VSS. That is, the first node N1 may become logic 'low'. Then, the driving circuit 2432 may generate the logic 'high' control signal CTR based on a logic 'low' output signal outputted from the detection circuit 2431. Then, the second NMOS transistor NM2 of the discharge circuit 2433 may be turned on based on the control signal CTR. Therefore, the electrostatic electricity transferred through the second supply voltage VDDL may be discharged through the ground voltage VSS.

As described above, when the second supply voltage VDDL corresponding to a low voltage is applied to the supply voltage terminal VDD, the second electrostatic discharge circuit 2430 may be activated. In this case, the first electrostatic discharge circuit 2420 may be inactivated. For this operation, the control voltage generation circuit 2310 of FIG. 387 may have the same configuration as FIG. 41. Before description, the control voltage generation circuit 2310 may be inactivated when the second supply voltage VDDL is applied to the supply voltage terminal VDD.

Figure 41:
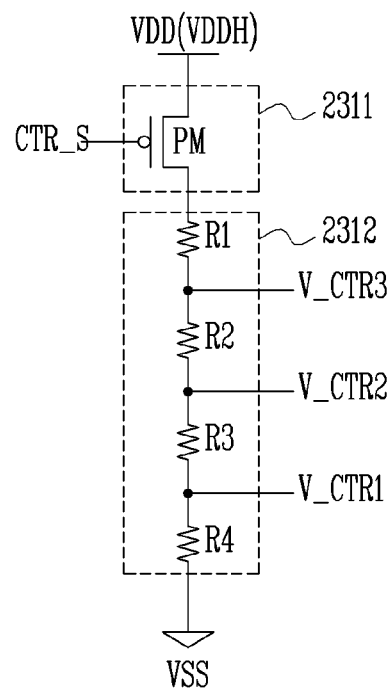
FIG. 41 is a circuit diagram illustrating a configuration of a control voltage generation circuit of FIG. 38.

FIG. 41 is a circuit diagram illustrating another configuration of the control voltage generation circuit 2310.

Referring to FIG. 41, the control voltage generation circuit 2310 may include a transfer circuit 2311 and a resistor circuit 2312.

The transfer circuit 2311 may be configured to transfer the first supply voltage VDDH received through the supply voltage terminal VDD, based on the selection control signal CTR_S. The transfer circuit 2311 may include a PMOS transistor PM which has source and drain terminals coupled between the supply voltage terminal VDD and the resistor circuit 2312 and a gate terminal configured to receive the selection control signal CTR_S. The selection control signal CTR_S may correspond to the selection control signal CTR_S of FIG. 39.

The resistor circuit 2312 may be configured to receive a voltage outputted from the transfer circuit 2311, and generate the first to third control voltages V_CTR1 to V_CTR3. The resistor circuit 2312 may include first to fourth resistors R1 to R4 which are coupled in series between the PMOS transistor PM and the voltage terminal to which the ground voltage VSS is applied.

The circuit operation of the control voltage generation circuit 2310 will be described as follows.

When the first supply voltage VDDH corresponding to a high voltage is applied to the supply voltage terminal VDD, the control circuit 2413 of FIG. 39 may generate the logic 'low' selection control signal CTR_S. Then, the PMOS transistor PM of FIG. 41 may be turned on based on the selection control signal CTR_S. Therefore, when the first supply voltage VDDH is applied to the supply voltage terminal VDD, the control voltage generation circuit 2310 may generate the first to third control voltages V_CTR1 to V_CTR3 through a division operation. Since the first to third control voltages V_CTR1 to V_CTR3 have been sufficiently described with reference to FIG. 37, the detailed descriptions thereof will be omitted herein.

When the second supply voltage VDDL corresponding to a low voltage is applied to the supply voltage terminal VDD, the selection control signal CTR_S may become logic 'high'. The PMOS transistor PM of FIG. 41 may be turned off based on the selection control signal CTR_S. Therefore, the control voltage generation circuit 2310 may be inactivated when the second supply voltage VDDL is applied to the supply voltage terminal VDD. Since the first to third control voltages V_CTR1 to V_CTR3 become logic 'low' when the control voltage generation circuit 2310 is inactivated, the electrostatic detection circuit 2320, the driving control circuit 2330 and the discharge driving circuit 2340 of FIG. 387, which are included in the first electrostatic discharge circuit 2420 of FIG. 38, may also be inactivated.

Figure 42:
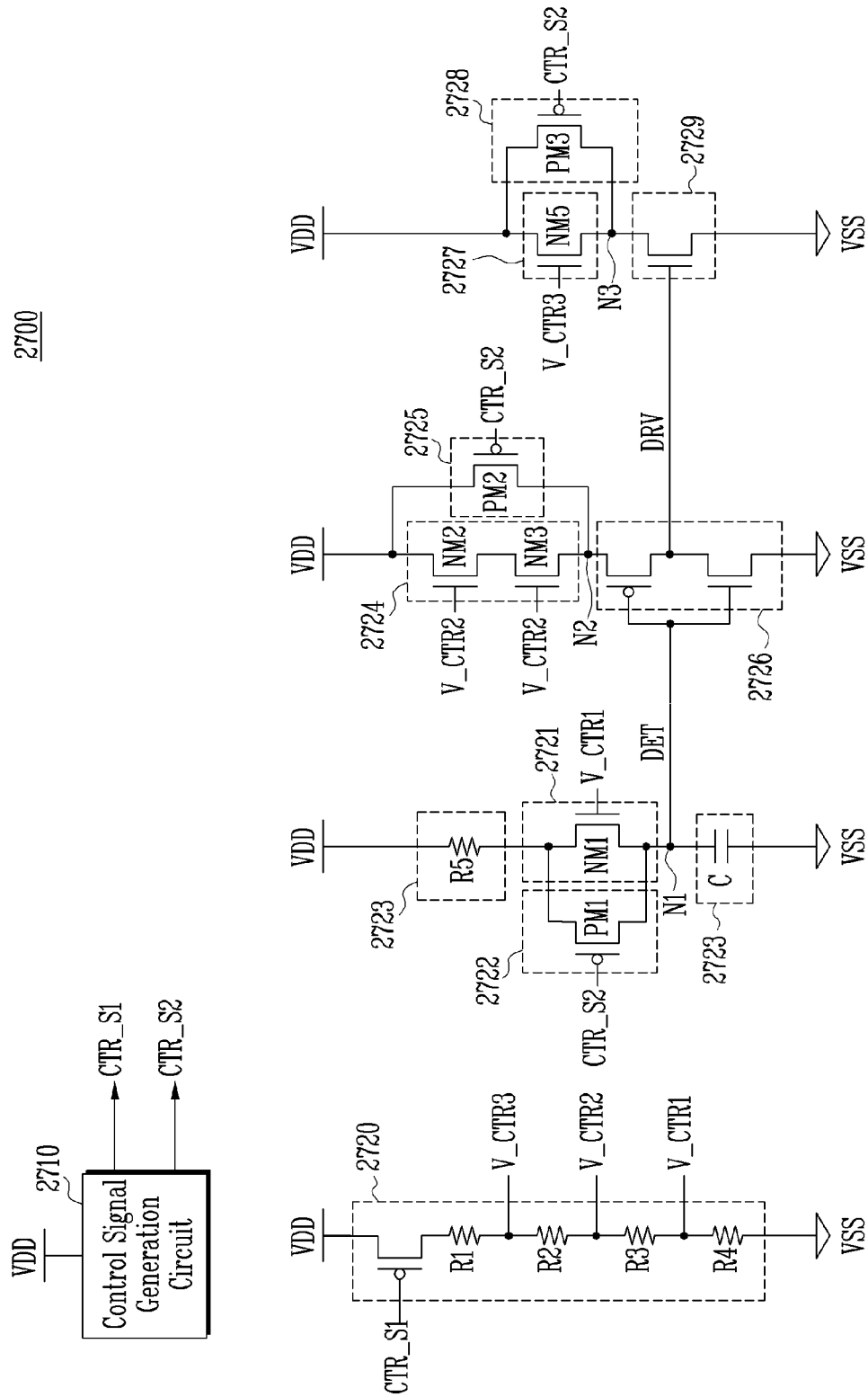
FIG. 42 is a diagram illustrating a configuration of an electrostatic discharge control system in accordance with an embodiment.

FIG. 42 is a block diagram illustrating a configuration of an electrostatic discharge control system 2700 in accordance with an embodiment.

Referring to FIG. 42, the electrostatic discharge control system 2700 may be configured to control a discharge operation on electrostatic electricity transferred through multiple supply voltages in an integrated circuit which receives the multiple supply voltages through a supply voltage terminal VDD. In the electrostatic discharge control system 2700 of FIG. 42, a first supply voltage VDDH or a second supply voltage VDDL may be applied to the supply voltage terminal VDD as in the electrostatic discharge control system 2400 of FIG. 38. The electrostatic discharge control system 2700 may include a control signal generation circuit 2710, a control voltage generation circuit 2720, a first setup circuit 2721, a first transfer circuit 2722, a common detection circuit 2723, a second setup circuit 2724, a second transfer circuit 2725, a common driving circuit 2726, a third setup circuit 2727, a third transfer circuit 2728 and a common discharge circuit 2729.

The control signal generation circuit 2710 may be configured to generate selection control signals CTR_S1 and CTR_S2 based on any one supply voltage of the first and second supply voltages VDDH and VDDL, which is applied to the supply voltage terminal VDD. The selection control signals CTR_S1 and CTR_S2 may include a first selection control signal CTR_S1 and a second selection control signal CTR_S2. Although described below again, the first and second selection control signals CTR_S1 and CTR_S2 may have an inverse relationship. The first and second selection control signals CTR_S1 and CTR_S2 may be transferred through electric lines independent of each other. The first and second selection control signals CTR_S1 and CTR_S2 may be transferred through the same electric line, and the first selection control signal CTR_S1 may be an inverted signal of the second selection control signal CTR_S2.

Figure 43:
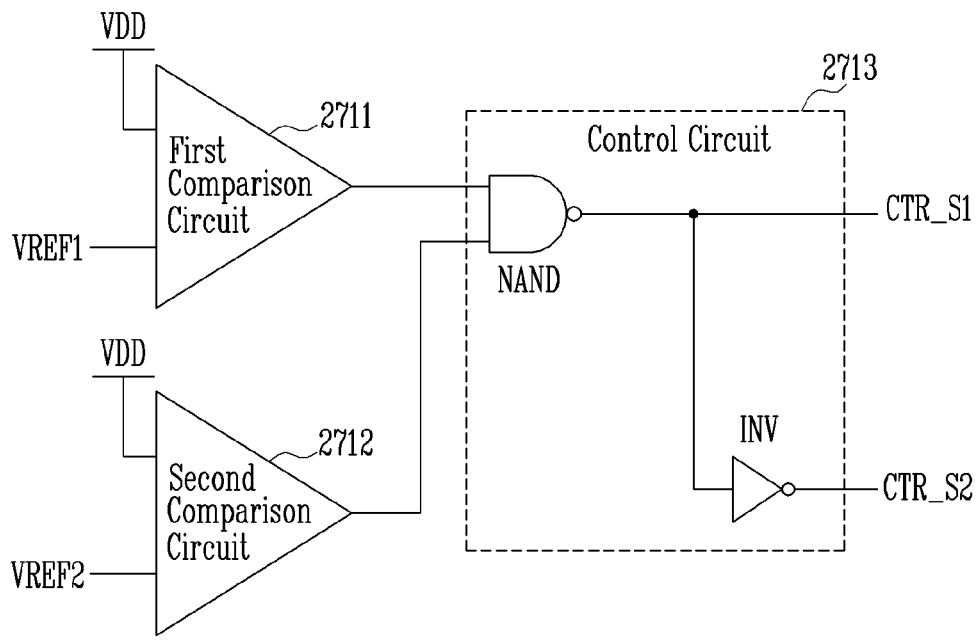
FIG. 43 is a diagram illustrating a configuration of a control signal generation circuit of FIG. 42.

FIG. 43 is a diagram illustrating a configuration of the control signal generation circuit 2710 of FIG. 42.

Referring to FIG. 43, the control signal generation circuit 2710 may include a first comparison circuit 2711, a second comparison circuit 2712 and a control circuit 2713. The control signal generation circuit 2710 of FIG. 43 may correspond to the selection control circuit 2410 of FIG. 39 except the first and second PMOS transistors PM1 and PM2.

When the first supply voltage VDDH is applied to the supply voltage terminal VDD, the control signal generation circuit 2710 may generate the logic 'low' first selection control signal CTR_S1 and the logic 'high' second selection control signal CTR_S2. When the second supply voltage VDDL is applied to the supply voltage terminal VDD, the control signal generation circuit 2710 may generate the logic 'high' first selection control signal CTR_S1 and the logic 'low' second selection control signal CTR_S2.

Referring to FIG. 42, the control voltage generation circuit 2720 may be activated based on the first selection control signal CTR_S1, and configured to generate first to third control voltages V_CTR1 to V_CTR3 through a division operation on the supply voltage transferred through the supply voltage terminal VDD. The control voltage generation circuit 2720 may correspond to the control voltage generation circuit 2310 of FIG. 41. However, the control voltage generation circuit 2720 of FIG. 42 may receive the first selection control signal CTR_S1 instead of the selection control signal CTR_S, unlike the control voltage generation circuit 2310 of FIG. 41.

As described above, the first selection control signal CTR_S1 may become logic 'low' when the first supply voltage VDDH is applied to the supply voltage terminal VDD. Therefore, the control voltage generation circuit 2720 may be activated when the first supply voltage VDDH is applied. Thus, the control voltage generation circuit 2720 may generate the first to third control voltages V_CTR1 to V_CTR3 through a division operation on the first supply voltage VDDH. Furthermore, the first selection control signal CTR_S1 may become logic 'high' when the second supply voltage VDDL is applied to the supply voltage terminal VDD. Therefore, the control voltage generation circuit 2720 may be inactivated.

The first setup circuit 2721, the common detection circuit 2723, the second setup circuit 2724, the common driving circuit 2726, the third setup circuit 2727 and the common discharge circuit 2729 may correspond to the first setup circuit 2321, the common detection circuit 2322, the second setup circuit 2331, the common driving circuit 2332, the third setup circuit 2341 and the common discharge circuit 2342 of FIG. 387, respectively.

However, the common detection circuit 2723, the common driving circuit 2726 and the common discharge circuit 2729 may be used in common when the first and second supply voltages VDDH and VDDL are applied to the supply voltage terminal VDD. That is, the common detection circuit 2723, the common driving circuit 2726 and the common discharge circuit 2729 may be used for a discharge operation on the first supply voltage VDDH and a discharge operation on the second supply voltage VDDL. Therefore, the electrostatic discharge control system 2700 in accordance with the present embodiment may minimize the circuit area required for performing the discharge operation on the multiple supply voltages.

The first transfer circuit 2722 may be coupled in parallel to the first setup circuit 2721, and configured to transfer a supply voltage, applied through the supply voltage terminal VDD, as a first setup voltage based on the second selection control signal CTR_S2. The first transfer circuit 2722 may include a first PMOS transistor PM1. The first PMOS transistor PM1 may be coupled between a fifth resistor R5 and a first node N1, and configured to receive the second selection control signal CTR_S2 through a gate terminal thereof. As described above, the second selection control signal CTR_S2 may have a logic 'low' level, when the second supply voltage VDDL is applied to the supply voltage terminal VDD. That is, the first PMOS transistor PM1 may be turned on when the second supply voltage VDDL is applied to the supply voltage terminal VDD. At this time, a first NMOS transistor NM1 may be turned off based on the first control voltage V_CTR1. Thus, the second supply voltage VDDL may be transferred to the first node N1 through the fifth resistor R5 and the first PMOS transistor PM1.

The second transfer circuit 2725 may be coupled in parallel to the second setup circuit 2724, and configured to transfer a supply voltage, applied through the supply voltage terminal VDD, as a second setup voltage based on the second selection control signal CTR_S2. The second transfer circuit 2725 may include a second PMOS transistor PM2.

The second PMOS transistor PM2 may be coupled between the supply voltage terminal VDD and a second node N2, and configured to receive the second selection control signal CTR_S2 through a gate terminal thereof. That is, the second PMOS transistor PM2 may be turned on when the second supply voltage VDDL is applied to the supply voltage terminal VDD. At this time, second and third NMOS transistors NM2 and NM3 may be turned off based on the second control voltage V_CTR2. Thus, the second supply voltage VDDL may be transferred to the second node N2 through the second PMOS transistor PM2.

The third transfer circuit 2728 may be coupled in parallel to the third setup circuit 2727, and configured to transfer the supply voltage, applied through the supply voltage terminal VDD, as a third setup voltage based on the second selection control signal CTR_S2. The third transfer circuit 2728 may include a third PMOS transistor PM3. The third PMOS transistor PM3 may be coupled between the supply voltage terminal VDD and a third node N3, and configured to receive the second selection control signal CTR_S2 through a gate terminal thereof. That is, the third PMOS transistor PM3 may be turned on when the second supply voltage VDDL is applied to the supply voltage terminal VDD. At this time, a fifth NMOS transistor NM5 may be turned off based on the third control voltage V_CTR3. Thus, the second supply voltage VDDL may be transferred to the third node N3 through the third PMOS transistor PM3.

The first to third PMOS transistors PM1 to PM3 may each have a reliability guarantee condition depending on operation characteristics thereof, like the surrounding NMOS transistors. That is, low voltage transistors may be used as the first to third PMOS transistors PM1 to PM3.

In short, the NMOS transistors and the PMOS transistors in the electrostatic discharge control system 2700 in accordance with the present embodiment may be all implemented as low voltage transistors. Furthermore, although the first supply voltage VDDH or the second supply voltage VDDL is applied to the supply voltage terminal VDD, the electrostatic discharge control system 2700 may perform a discharge operation on electrostatic electricity. The electrostatic discharge control system 2700 may further include the common detection circuit 2723, the common driving circuit 2726 and the common discharge circuit 2729. Therefore, the electrostatic discharge control system 2700 may perform a discharge operation on the first and second supply voltages VDDH and VDDL with the minimum circuit area.

Figure 44:
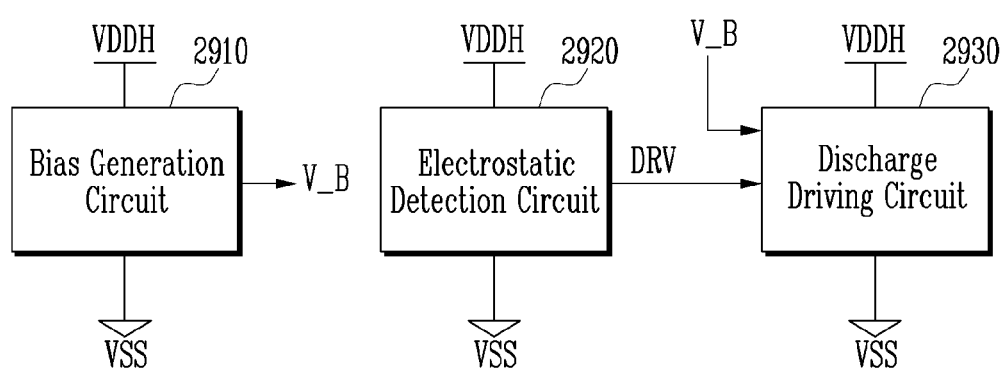
FIG. 44 is a block diagram illustrating a configuration of an electrostatic discharge circuit in accordance with an embodiment.

FIG. 44 is a block diagram illustrating a configuration of an electrostatic discharge circuit 2900 in accordance with an embodiment.

Referring to FIG. 44, the electrostatic discharge circuit 2900 may be configured to sense and discharge electrostatic electricity transferred through a supply voltage VDDH. More specifically, the electrostatic discharge circuit 2900 may include a bias generation circuit 2910, an electrostatic sensing circuit 2920 and a discharge driving circuit 2930.

The bias generation circuit 2910 may be configured to generate a bias voltage V_B. The bias generation circuit 2910 may be coupled between a voltage terminal to which the supply voltage VDDH is applied and a voltage terminal to which a ground voltage VSS is applied. The bias generation circuit 2910 may correspond to the control voltage generation circuit 2310 of FIG. 386. Thus, the bias voltage V_B may correspond to one of the first to third control voltages V_CTR1 to V_CTR3 of FIG. 386.

The electrostatic sensing circuit 2920 may be configured to sense electrostatic electricity transferred through the supply voltage VDDH, and generate a driving control signal DRV. The electrostatic sensing circuit 2920 may include the electrostatic detection circuit 2320 and the driving control circuit 2330 of FIG. 36.

The discharge driving circuit 2930 may be configured to set a setup voltage based on the bias voltage V_B, and perform a discharge operation on electrostatic electricity transferred through the setup voltage based on the driving control signal DRV. The discharge driving circuit 2930 may correspond to the discharge driving circuit 2340 of FIG. 386. However, the discharge driving circuit 2930 of FIG. 44 may receive the bias voltage V_B instead of the third control voltage V_CTR3 of FIG. 386, unlike the discharge driving circuit 2340 of FIG. 36.

The electrostatic discharge circuit 2900 in accordance with the present embodiment may set the setup voltage of the discharge driving circuit 2930 to the bias voltage V_B. Furthermore, the electrostatic discharge circuit 2900 may perform a discharge operation on electrostatic electricity transferred through the setup voltage.

In accordance with the present embodiments, the electrostatic discharge circuit and the electrostatic discharge control system can protect internal circuits from electrostatic electricity transferred through the supply voltage, thereby guaranteeing a stable circuit operation.

Furthermore, low voltage transistors may be used, which makes it possible to minimize the circuit areas of the electrostatic discharge circuit and the electrostatic discharge control system.

Figure 45:
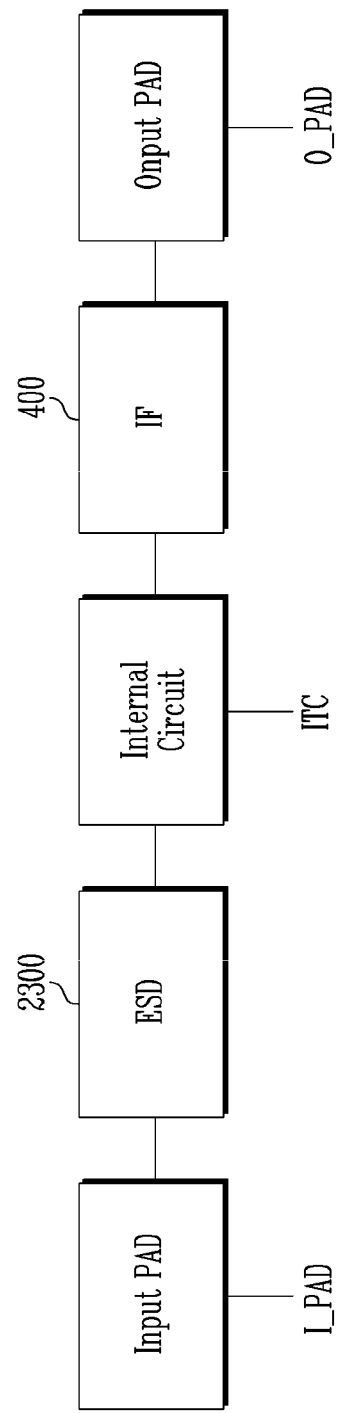
FIG. 45 is a circuit diagram illustrating a configuration of an electronic device in accordance with an embodiment.

FIG. 45 is a circuit diagram illustrating a configuration of an electronic device in accordance with an embodiment.

Referring to FIG. 45, the electronic device 10 may include an input pad I_PAD, an ESD circuit 2300, an internal circuit ITC, an interface circuit (IF) 400 and an output pad O_PAD.

The input pad I_PAD configured to receive a power voltage. For example, the power voltage may include an electrostatic component.

The ESD circuit 2300 may receive the power voltage, which may include the electrostatic component. When the power voltage including the electrostatic component is applied to the input pad I_PAD, the ESD circuit 2300 described in FIG. 35 to FIG. 44 is driven. Thus, a high voltage electrostatic electricity can be effectively discharged by using transistors with a lower operation voltage.

The power voltage from which the electrostatic electricity has been removed by the ESD circuit 2300 is input to the internal circuit ITC, thereby driving the internal circuit ITC.

The internal circuit ITC may output a predetermined signal. The interface circuit 400 corresponding to any of various output driving circuits disclosed in FIGS. 6 to 35 may be configured to receive and process the output signal of the internal circuit ITC.

Using the transistors driven at the low voltage, for example, 0.8V to 1V, the electrostatic electricity can be removed and the output signal of the internal circuit ITC can be processed thereby improving reliabilities of the transistors constituting the ESD circuit 2300 and the output driving circuit 400 and performing a high-speed operation.

Figure 46:
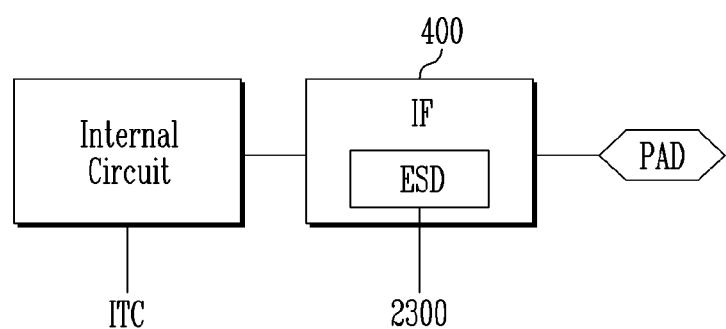
FIG. 46 is a circuit diagram illustrating a configuration of an electronic device in accordance with an embodiment.

FIG. 46 is a circuit diagram illustrating a configuration of an electronic device in accordance with an embodiment.

Referring to FIG. 46, the electronic device may include an internal circuit ITC and an interface circuit 400. The electronic device may use, as power, a first voltage and a second voltage lower than the first voltage.

The internal circuit ITC is configured to be driven by the second voltage, and to output an output signal having a level corresponding to the second voltage. For example, the first voltage may correspond to the first power voltage V1 of FIG.

6 to FIG. 35 and the second voltage may correspond to the second power voltage V2 of FIG. 6 to FIG. 35.

The interface circuit 400 is configured to receive the output signal, the first voltage, and the second voltage, to shift the output signal to a level corresponding to the first voltage, and to provide the shifted output signal to a pad PAD. For example, the interface circuit 400 may include at least one of the various output driving circuits of FIG. 6 to FIG. 35.

The interface circuit 400 includes a plurality of transistors, and all transistors of the interface circuit 400 are driven at the second voltage and broken at the first voltage.

In an embodiment, the interface circuit 400 may include a pull-up driver and a pull-down driver. The pull-up driver may include a first PMOS transistor, a second PMOS transistor, and a first impedance controller. The first PMOS transistor is connected between a power terminal to which the first voltage is applied and a first connection node, and controlled by a first control bias. The second PMOS transistor is connected between the first connection node and the pad PAD and normally turned-on. The first impedance controller is connected to the first connection node to control an impedance of the first connection node based on the first control bias. The pull-down driver may include a first NMOS transistor and a second NMOS transistor. The first NMOS transistor is connected between the pad PAD and a second connection node, and controlled by the second voltage. The second NMOS transistor is connected between the second connection node and a ground voltage terminal. The first PMOS transistor and the second PMOS transistor are driven by the second voltage, and a difference between the first control bias and the first voltage is substantially equal to or less than a maximum operating voltage of the first and second PMOS transistors.

The interface circuit 400 may further include an ESD (electrostatic discharge) block 2300 connected the pad PAD. The ESD block 2300 may include at least one of a first ESD block and a second ESD block. The first ESD block is electrically coupled between the pad PAD and the second PMOS transistor to protect electrostatic electricity, and control an impedance of the pull-up driver. The second ESD block is electrically coupled between the pad PAD and the first NMOS transistor to protect the electrostatic electricity and control an impedance of the pull-down driver.

At least one of the first ESD block and the second ESD block may include a control voltage generation circuit, an electrostatic detection circuit, a driving control circuit, and discharge driving circuit.

The control voltage generation circuit is configured to generate a first control voltage, a second control voltage, and a third control voltage by dividing a supply voltage.

The electrostatic detection circuit is configured to set a first setup voltage based on the first control voltage, and generate an electrostatic detection signal by detecting electrostatic electricity contained in the first setup voltage.

The driving control circuit is configured to set a second setup voltage based on the second control voltage, and generate a driving control signal based on the electrostatic detection signal.

The discharge driving circuit is configured to set a third setup voltage based on the third control voltage, and perform a discharge operation on electrostatic electricity contained in the third setup voltage based on the driving control signal. For example, in the ESD block 2300, the first voltage may correspond to the first supply voltage VDDH or the supply voltage VDD of FIG. 36 to FIG. 44, and the second voltage may correspond to the second supply voltage VDDL of FIG. 36 to FIG. 44.

The embodiments of the present disclosure disclosed in the present specification and drawings are merely to provide specific examples to easily describe the technical content of the present disclosure and to help understanding of the present disclosure, and are not intended to limit the scope of embodiments of the present disclosure. It is apparent to those skilled in the art to which the present disclosure pertains that other modified examples based on the technical spirit of the present disclosure may be implemented in addition to the embodiments disclosed herein.

What is claimed is:

1. An electronic device using, as power, a first voltage and a second voltage lower than the first voltage, the electronic device comprising:
    an internal circuit configured to be driven by the second voltage, and output an output signal having a level corresponding to the second voltage; and
    an interface circuit configured to receive the output signal, the first voltage, and the second voltage, shift the output signal to a level corresponding to the first voltage, and provide the shifted output signal to a pad,
    wherein the interface circuit includes an ESD (electrostatic discharge) block connected to the pad, and
    wherein the interface circuit further includes a plurality of transistors and the plurality of transistors of the interface circuit are driven at the second voltage,
    wherein the ESD block includes an electrostatic detection circuit configured to set a first setup voltage based on a first control voltage and generate an electrostatic detection signal by detecting static electricity contained in the first setup voltage.

2. The electronic device according to claim 1, wherein the interface circuit includes:
    a pull-up driver including a first PMOS transistor, a second PMOS transistor, and a first impedance calibration circuit, the first PMOS transistor connected between a power terminal to which the first voltage is provided and a first connection node and controlled by a first control bias, the second PMOS transistor connected between the first connection node and the pad and being in a turned-on state, the first impedance calibration circuit connected to the first connection node to control an impedance of the first connection node based on the first control bias; and
    a pull-down driver including a first NMOS transistor and a second NMOS transistor, the first NMOS transistor connected between the pad and a second connection node and controlled by the second voltage, the second NMOS transistor connected between the second connection node and a ground voltage terminal,
    wherein the first PMOS transistor and the second PMOS transistor are driven by the second voltage, and a difference between the first control bias and the first voltage is substantially equal to or less than a maximum operating voltage of the first and the second PMOS transistors.

3. The electronic device according to claim 2,
    wherein the ESD block includes at least one of a first ESD block or a second EDS block, the first EDS block electrically coupled between the pad and the second PMOS transistor to protect electrostatic electricity, the second ESD block electrically coupled between the pad and the first NMOS transistor to protect the electrostatic electricity.

4. The electronic device, according to claim 1, wherein the ESD block further includes:
a control voltage generation circuit configured to generate the first control voltage, a second control voltage, and a third control voltage by dividing a supply voltage;
a driving control circuit configured to set a second setup voltage based on the second control voltage, and generate a driving control signal based on the electrostatic detection signal; and
a discharge driving circuit configured to set a third setup voltage based on the third control voltage, and perform a discharge operation on electrostatic electricity contained in the third setup voltage based on the driving control signal.

5. An electronic device using a first voltage and a second voltage higher than the first voltage as a power, the electronic device comprising:
an internal circuit configured to be driven by the first voltage and output an output signal having a first voltage level; and
an interface circuit including a level shifter configured to shift the first voltage level of the output signal to a second voltage level, a driving block configured to buffer the shifted output signal, and an ESD (electrostatic discharge) block configured to protect the internal circuit from ESD,
wherein a plurality of transistors in the driving block are driven when the first voltage is applied as an operation voltage, and reliabilities of the plurality of transistors are damaged when the second voltage is applied as the operation voltage.

6. The electronic device according to claim 5, wherein the ESD block includes:
a control voltage generation circuit configured to generate a first control voltage, a second control voltage, and a third control voltage by dividing a supply voltage;
an electrostatic detection circuit configured to set a first setup voltage based on the first control voltage, and generate an electrostatic detection signal by detecting static electricity contained in the first setup voltage;
a driving control circuit configured to set a second setup voltage based on the second control voltage, and generate a driving control signal based on the electrostatic detection signal; and
a discharge driving circuit configured to set a third setup voltage based on the third control voltage, and perform a discharge operation on electrostatic electricity contained in the third setup voltage based on the driving control signal.

7. The electronic device according to claim 5, wherein the driving block includes:
a pull-up driver connected between a power terminal and the ESD block, and
a pull-down driver connected between the ESD block and a ground voltage terminal.

8. The electronic device according to claim 7, wherein the pull-up driver includes:
a first PMOS transistor receiving the second voltage through the power terminal and a first control bias as a gate voltage;
a second PMOS transistor connected between the first PMOS transistor and the ESD block, the second PMOS transistor being normally turned on; and
a first impedance calibration circuit connected to a first connection node, which is a connection node between the first PMOS transistor and the second PMOS transistor, and configured to control an impedance of the first connection node based on the first control bias,
wherein the first impedance calibration circuit includes at least one PMOS transistor.

9. The electronic device according to claim 8, wherein a difference between the first control bias and the second voltage is equal to or less than a maximum operating voltage of the first and second PMOS transistors.

10. The electronic device according to claim 8, wherein the pull-down driver includes:
a first NMOS transistor connected to the ESD block, the first NMOS transistor being normally turned on;
a second NMOS transistor connected between a second connection node and the ground voltage terminal, the second connection node being a connection node between the first NMOS transistor and the second NMOS transistor; and
a second impedance calibration circuit connected to the second connection node, and configured to control an impedance of the second connection node based on a second control bias,
wherein the second impedance calibration circuit includes at least one NMOS transistor.

11. The electronic device according to claim 7, wherein the ESD block further includes:
a first ESD block electrically connected between a pad and the pull-up driver, and configured to control an impedance of the pull-up driver; and
a second ESD block electrically connected between the pad and the pull down driver and configured to control an impedance of the pull-down driver.

* * * * *